United States Patent
Wieler et al.

(10) Patent No.: US 11,051,441 B1
(45) Date of Patent: Jun. 29, 2021

(54) MODULAR SYSTEM FOR AUTOMATED PORTABLE ELECTRONIC DEVICE DISASSEMBLY

(71) Applicant: Apple Inc., Cupertino, CA (US)

(72) Inventors: Patrick S. Wieler, Justin, TX (US); Charissa Rujanavech, Santa Cruz, CA (US); Sean P. Shannon, San Francisco, CA (US); James Fikert, Bartlett, IL (US); Roy Mahalas, Bartlett, IL (US); Dan Powell, Bartlett, IL (US); Jason Schwarz, Bartlett, IL (US)

(73) Assignee: APPLE INC., Cupertino, CA (US)

( * ) Notice: Subject to any disclaimer, the term of this patent is extended or adjusted under 35 U.S.C. 154(b) by 235 days.

(21) Appl. No.: 16/383,330

(22) Filed: Apr. 12, 2019

Related U.S. Application Data

(60) Provisional application No. 62/657,656, filed on Apr. 13, 2018.

(51) Int. Cl.
*H05K 13/08* (2006.01)
*H05K 13/04* (2006.01)

(52) U.S. Cl.
CPC ....... *H05K 13/0486* (2013.01); *H05K 13/081* (2018.08); *B23P 2700/12* (2013.01); *H05K 2203/176* (2013.01); *Y10T 29/49815* (2015.01); *Y10T 29/49819* (2015.01); *Y10T 29/53274* (2015.01)

(58) Field of Classification Search
CPC ............. H05K 13/0486; H05K 13/081; H05K 13/082; H05K 2203/1121; H05K 2203/165; H05K 2203/176; H05K 2203/178; Y10T 29/49815; Y10T 29/49817; Y10T 29/49819; Y10T 29/49821; Y10T 29/49822; Y10T 29/49824;
(Continued)

(56) References Cited

U.S. PATENT DOCUMENTS 4,901,431 A  2/1990 Gast
5,448,817 A  9/1995 Waldsmith
(Continued)

OTHER PUBLICATIONS

Xiaoquan, Lu, Xiaoqua, Lu, CN106825005, published Jun. 13, 2017 (Year: 2017), Jun. 13, 2017.

*Primary Examiner* — Peter Dungba Vo
*Assistant Examiner* — Joshua D Anderson
(74) *Attorney, Agent, or Firm* — Dorsey & Whitney LLP

(57) ABSTRACT

According to some embodiments, a method for processing an electronic component associated with a portable electronic device by a conveyor system subsequent to removing the electronic component from a housing of the portable electronic device, where the conveyor system includes a container that is capable of carrying the electronic component, is described. The method can include depositing, at a receiving station of the conveyor system, the electronic component within a cavity of the container. The method can further include while moving the container that carries the electronic component from the receiving station in a direction towards a removal station of the conveyor system: monitoring a temperature of the electronic component, and in response to determining that the temperature of the electronic component exceeds a temperature threshold range associated with a thermal event: cooling the electronic component by dissipating thermal energy associated with the thermal event.

18 Claims, 57 Drawing Sheets

(58) Field of Classification Search
CPC ........ Y10T 29/53274; Y10T 29/53278; B65G 2203/043
See application file for complete search history.

(56) References Cited

U.S. PATENT DOCUMENTS

| | | | |
|---|---|---|---|
| 5,560,100 A | 10/1996 | Englert | |
| 5,758,817 A * | 6/1998 | Chapman | B23K 1/018 |
| | | | 228/19 |
| 6,226,617 B1 | 5/2001 | Suzuki et al. | |
| 6,336,601 B1 * | 1/2002 | Ueno | C22B 7/005 |
| | | | 241/23 |
| 6,553,652 B2 | 4/2003 | Sakakibara et al. | |
| 8,001,674 B2 | 8/2011 | Chen et al. | |
| 8,199,477 B2 | 6/2012 | Mathew et al. | |
| 8,210,487 B2 | 7/2012 | Fan et al. | |
| 8,893,373 B2 | 11/2014 | Rothkopf et al. | |
| 9,597,711 B2 * | 3/2017 | Das | B07B 1/46 |
| 2009/0321511 A1 | 12/2009 | Browne | |
| 2013/0286567 A1 | 10/2013 | Sorenson et al. | |
| 2013/0314884 A1 | 11/2013 | Chen et al. | |
| 2014/0000105 A1 | 1/2014 | Bielick et al. | |
| 2015/0264847 A1 | 9/2015 | Zhang et al. | |
| 2016/0150656 A1 | 5/2016 | Mäki et al. | |
| 2018/0338021 A1 | 11/2018 | Hebert et al. | |

* cited by examiner

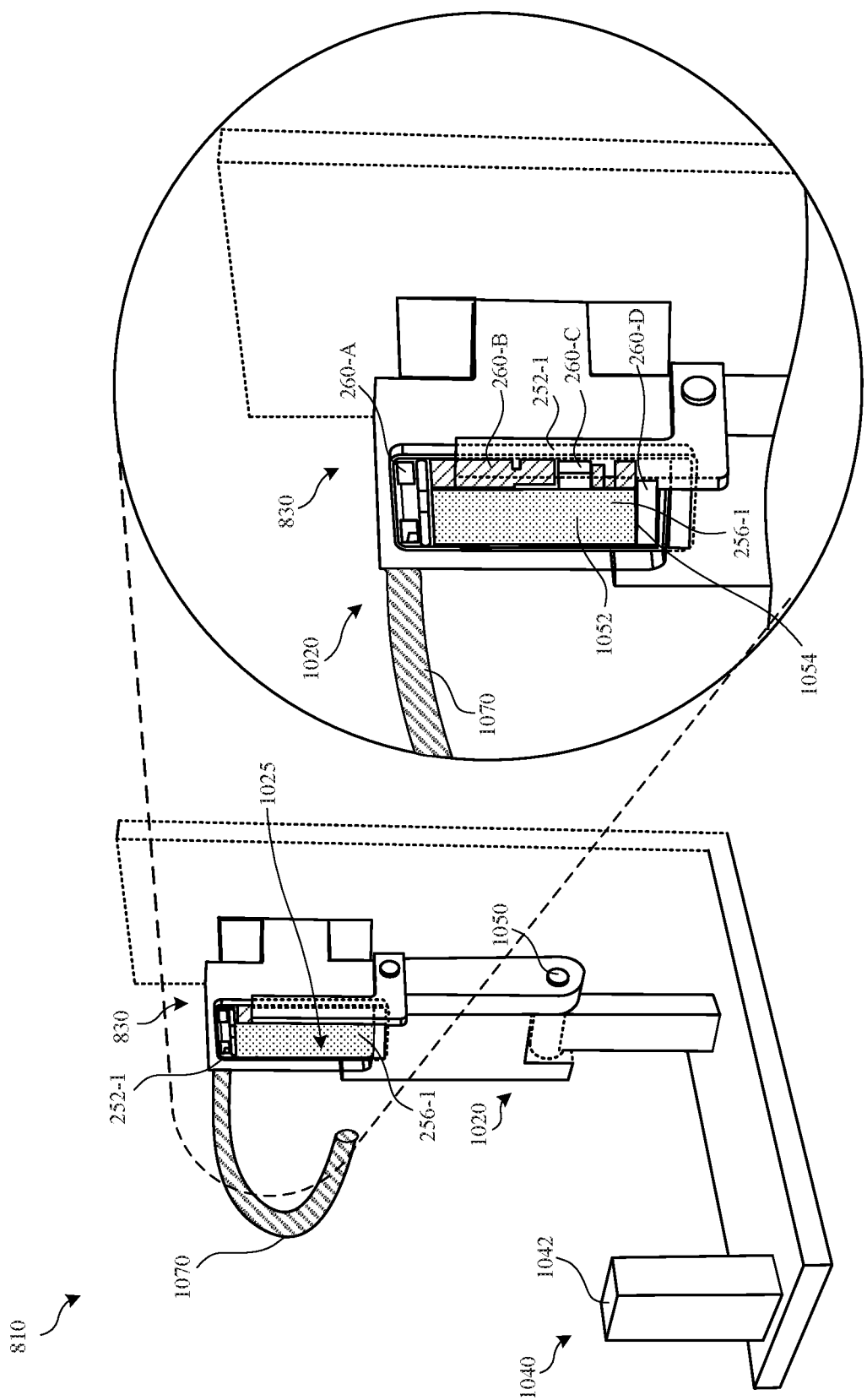

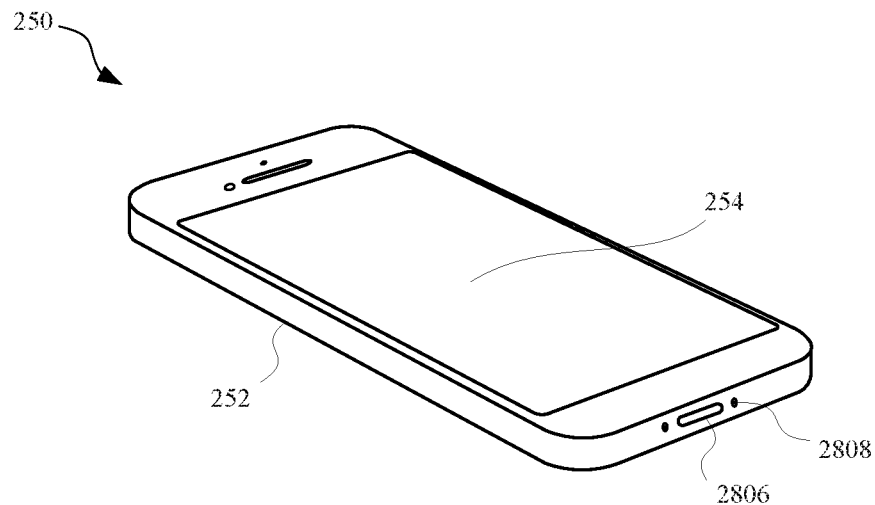
FIG. 28A
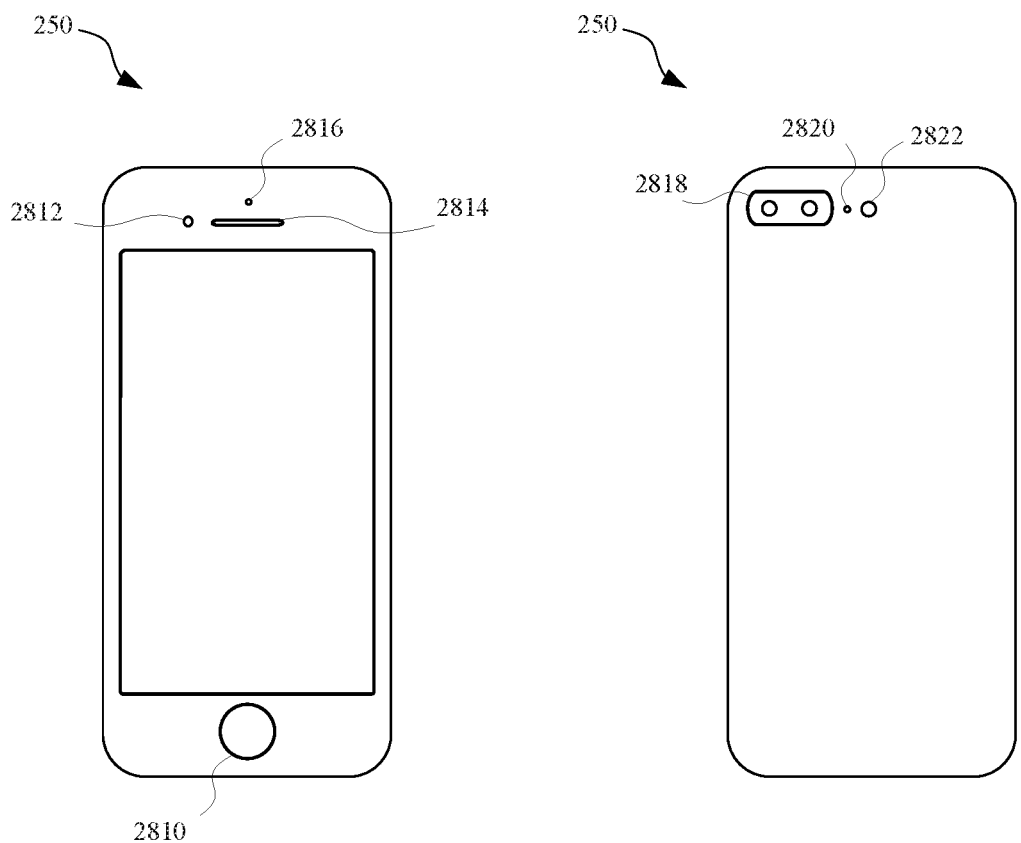
FIG. 28B          FIG. 28C

MODULAR SYSTEM FOR AUTOMATED PORTABLE ELECTRONIC DEVICE DISASSEMBLY

CROSS-REFERENCE TO RELATED APPLICATIONS

The present application claims the benefit of U.S. Provisional Application No. 62/657,656, entitled "MODULAR SYSTEM FOR AUTOMATED PORTABLE ELECTRONIC DEVICE DISASSEMBLY," filed Apr. 13, 2018, which is incorporated by reference herein in its entirety for all purposes.

This patent application is also related and incorporates by reference in their entirety each of the following co-pending patent applications:

(i) U.S. patent application Ser. No. 16/383,318 entitled "MODULAR SYSTEM FOR AUTOMATED PORTABLE ELECTRONIC DEVICE DISASSEMBLY" by RUJANAVECH et al. filed Apr. 12, 2019;

(ii) U.S. patent application Ser. No. 16/383,323 entitled "MODULAR SYSTEM FOR AUTOMATED PORTABLE ELECTRONIC DEVICE DISASSEMBLY" by RUJANAVECH et al. filed Apr. 12, 2019;

(iii) U.S. patent application Ser. No. 16/383,329 entitled "MODULAR SYSTEM FOR AUTOMATED PORTABLE ELECTRONIC DEVICE DISASSEMBLY" by RUJANAVECH et al. filed Apr. 12, 2019; and (iv) U.S. patent application Ser. No. 16/383,334 entitled "MODULAR SYSTEM FOR AUTOMATED PORTABLE ELECTRONIC DEVICE DISASSEMBLY" by WIELER et al. filed Apr. 12, 2019.

FIELD

The described embodiments relate generally to automated disassembly of portable electronic devices. More particularly, the present embodiments relate to a modular system for automating a disassembly procedure for different portable electronic devices.

BACKGROUND

Consumer electronic devices are sold to various customers all over the globe. These devices are designed to do a variety of tasks that change the way people live and interact. Over one billion new smart phones are sold worldwide every year. Manufacturers also sell other devices such as tablet computers, laptop computers, televisions, digital cameras, wearable devices, drones, home appliances, Internet of Things (IoT) devices, and many other types of consumer electronic devices every year.

As technology evolves, new features are integrated into these devices. Materials utilized to manufacturer particular components or a form factor of the device may change as new models are designed and sold. New components may be added to the devices or old components may be replaced with new components. Consumers are constantly upgrading the devices they have bought with newer generations of the same device or similar devices, which may lead some consumers to no longer want their old consumer electronic devices. However, consumer electronic devices may include hazardous materials such as heavy metals in lithium ion batteries or arsenic, copper, lead, and/or other elements in printed circuit boards that may be toxic. There is a desire to prevent landfills from being filled with these harmful materials. In addition, some materials in consumer electronic devices may be very valuable if properly recycled. Consequently, there is a desire to collect older consumer electronic devices in order to salvage the components for reuse or recycle the materials included in these devices. However, the numbers of devices that may need to be processed on a yearly basis is too large and potentially hazardous to efficiently handle with manual disassembly techniques.

SUMMARY

This paper describes various embodiments that relate to modular systems for automated disassembly of portable electronic devices. The modular systems comprise a number of modules that perform different portions of the disassembly process. Each module includes one or more stations designed and configured to perform a specific task in the disassembly process.

According to some embodiments, a method for processing an electronic component associated with a portable electronic device by a conveyor system subsequent to removing the electronic component from a housing of the portable electronic device, where the conveyor system includes a container that is capable of carrying the electronic component, is described. The method can include depositing, at a receiving station of the conveyor system, the electronic component within a cavity of the container. The method can further include while moving the container that carries the electronic component from the receiving station in a direction towards a removal station of the conveyor system: monitoring a temperature of the electronic component, and in response to determining that the temperature of the electronic component exceeds a temperature threshold range associated with a thermal event: cooling the electronic component by dissipating thermal energy associated with the thermal event.

According to some embodiments, a system for processing an electronic component associated with a portable electronic device is described. The system includes a conveyor system that comprises a movable train having a container, where the movable train is capable of transporting the container, the conveyor system further comprising: a sensor capable of (i) determining when the electronic component is carried within a cavity of the container at a receiving station of the conveyor system, and (ii) in response to determining that the electronic component is carried within the cavity, providing a detection signal. The conveyor system further comprises a controller in communication with the sensor, where, in response to receiving the detection signal from the sensor, the controller is capable of generating an activation signal that causes the movable train to move the container carrying the electronic component, and a removal station that is capable of removing the electronic component from the container of the system when a temperature of the electronic component is less than a temperature threshold value.

According to some embodiments, a non-transitory computer readable medium is described. The non-transitory computer readable medium storing instructions that, when executed by a controller of a module for removing an electronic component associated with a portable electronic device by a conveyor system subsequent to removing the electronic component from a housing of the portable electronic device, cause the module to carry out steps that include transferring, at a receiving station of the conveyor system, the electronic component within a cavity of a container. The steps can further include while moving the container that carries the electronic component from the receiving station towards a removal station of the conveyor system: monitoring, by a sensor of the conveyor system, the temperature of the electronic component. The steps can further include in response to determining that a temperature of the electronic component exceeds a temperature threshold range associated with a thermal event: dissipating thermal energy associated with the thermal event, and removing, at the removal station, the electronic component from the container when the temperature is less than the temperature threshold range.

Other aspects and advantages of the invention will become apparent from the following detailed description taken in conjunction with the accompanying drawings which illustrate, by way of example, the principles of the described embodiments.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

FIGS. 10A-10F illustrate various conceptual diagrams of an electronic component removal station capable of removing at least one electronic component from the housing for the portable electronic device, in accordance with some embodiments.

FIGS. 28A-28C illustrate a portable electronic device, in accordance with some embodiments.

DETAILED DESCRIPTION

Figure 1A:
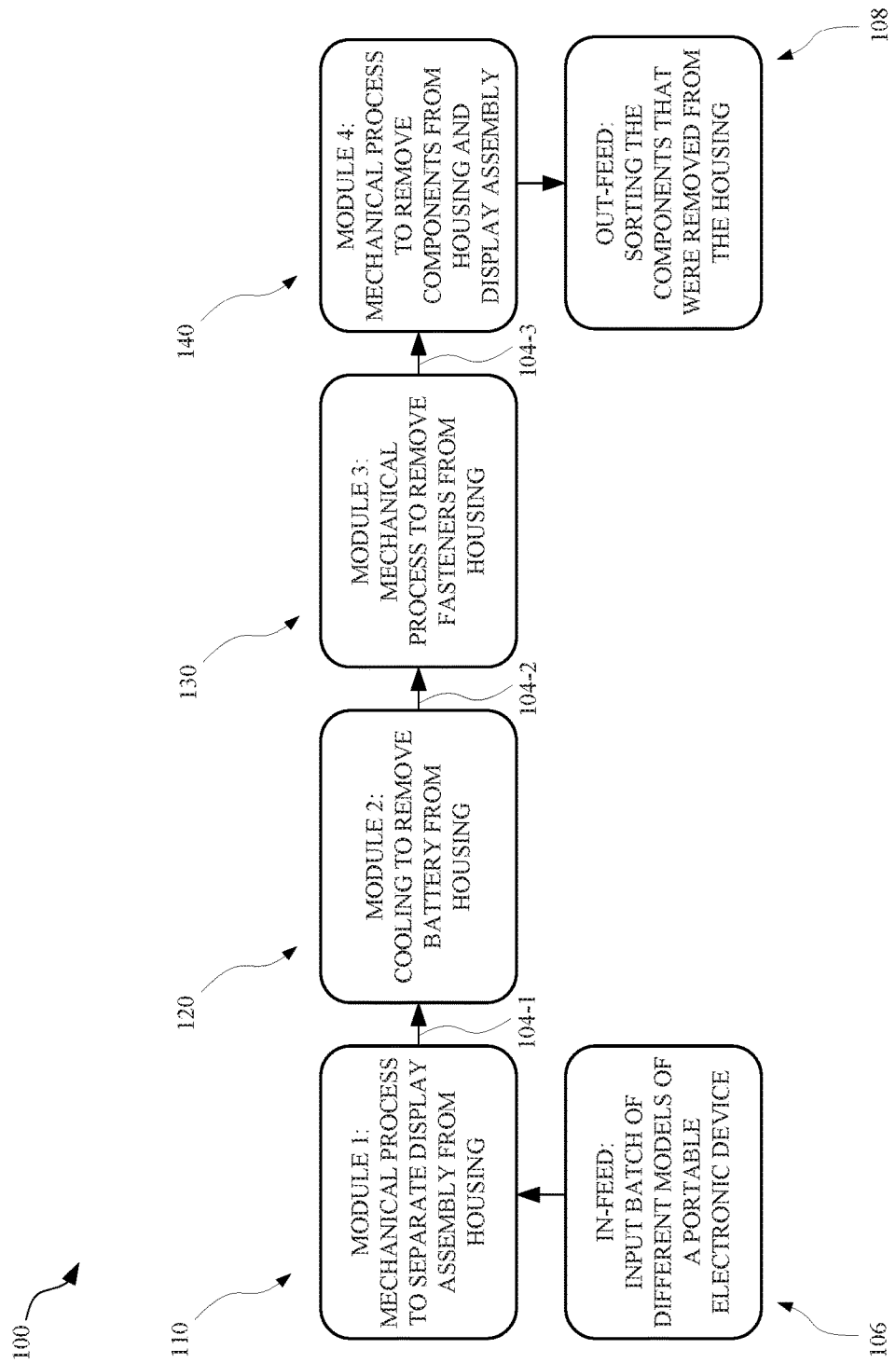
FIG. 1A illustrates a system diagram of a modular system for disassembling portable electronic devices, in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The embodiments described herein set forth systems and techniques related to disassembling portable electronic devices. In particular, the embodiments described herein relate to a large-scale disassembly of these portable electronic devices in a controlled environment. Specifically, the disassembly of these portable electronic devices involves the separation of different parts and/or components, reclaiming metals from housings and operational components of these portable electronic devices for use in future products, and safely and securely collecting of heavy metals from electronic components of these portable electronic devices.

Although recent technological advances have provided individual users with tools to disassemble portable electronic devices via a manual disassembly process, these manual disassembly processes are generally inefficient, inexact, and fraught with experimentation. Consequently, an individual user is unable to disassemble portable electronic devices at a large-scale. Further complicating the manual disassembly process is the sheer complexity in separating and disassembling the thousands of components and parts that comprise the portable electronic devices, from circuit boards, to housings, to display assemblies, structural supports, batteries, and the like. Furthermore, individual users are unable to and/or unqualified to safely handle electronic components that include heavy metals, such as lead, nickel, cadmium, and the like. For instance, federal and state environmental regulatory agencies have established standard procedures for handling of these heavy metals, which requires specialized equipment and processes that are not available to individual users.

To cure the aforementioned deficiencies, the systems and techniques described herein can be described as computer-controlled automated processes for the precise and controlled disassembly of portable electronic devices. In particular, the housings, support structures, operational components, and the like of these portable electronic devices include recyclable materials. For example, housings of these portable electronic devices can be comprised of recyclable metals, such as aluminum, aluminum alloy, steel, stainless steel, copper, and the like. When a portable electronic device has reached the limit of its useful lifespan (e.g., due to physical damage, outdated hardware, etc.) recycling and reclamation procedures can be implemented to separate these recyclable metals so as to ensure that these recyclable metals can be reused in future products, such as other portable electronic devices, packaging materials, automotive products, and the like. Recycling and reusing these metals can impart a profound and direct positive impact on the environment. Indeed, metal refining and fabrication is associated with harmful greenhouse gas emissions and a large consumption of natural resources. In order to ensure that these metals can be recycled and reused in future products, the separation process should be precise, as executed by the embodiments described herein. In particular, if these metals include other non-recyclable parts, such as heavy metals, it can render these metals unfit to be recycled. Therefore, using the computer-controlled automated processes described herein can execute controlled and precise disassembly and separation of these metals, thereby significantly increasing a yield of metals that are fit to be recycled.

Furthermore, the computer-controlled automated systems and processes described herein impart specific advantages over manual processes and other conventional processes, such as being adaptable to different portable electronic devices. Consider, for example, a scenario where the disassembly system described herein receives different portable electronic devices. These different portable electronic devices can be distinguished from each other according to at least one of dimension, shape, appearance, construction techniques, operational components, and the like. Unfortunately, some of these distinctions are not readily distinguishable to the visible human eye. In other words, a human operator may not be able to readily distinguish these differences, which can result in the human operator utilizing the wrong set of tools or incorrect disassembly techniques. This is especially unfortunate because these manual disassembly processes are already generally inefficient at separating components of these portable electronic devices. In contrast, the computer-controlled automated systems and processes described herein are configured to detect differences between these different portable electronic devices, and correspondingly adjust the disassembly techniques to ensure efficient and precise disassembly of these different portable electronic devices.

Furthermore, the computer-controlled automated systems and processes described herein can control different modules that are integrated to coordinate with each other across a disassembly line process. Each of these modules is capable of executing an exclusive operation, such as removal of a display assembly from a housing or the removal of a battery from a cavity defined by the housing. Beneficially, the systems and techniques described herein are capable of disassembling a large-scale of portable electronic devices, such as thousands of portable electronic devices per day.

In some embodiments, each module includes a base structure that provides support for a number of different disassembly stations. The base structure can include steel tubing that has been welded together to form a frame. Brackets can be welded to the frame to couple the disassembly stations or other components to the frame, via welding, mechanical fasteners, adhesive, or other connection means. Alternatively, holes, threaded or unthreaded, can be drilled in the frame and the disassembly stations or other components can be connected directly to the frame via bolts or screws. In some embodiments, the base structure includes one or more plates secured to the frame and positioned at a height that is between a floor of the base structure and a ceiling of the base structure. Disassembly stations can be bolted or screwed to the one or more plates. In some embodiments, components of the portable electronic device can be deposited into receptacles located below the one or more plates during the disassembly process. These receptacles can be removed, periodically, by the operators in order to clear the components from the disassembly line. The components can then be collected and recycled by any technically feasible means.

In other embodiments, the base structure can include aluminum extrusion that is bolted together to form the frame. Of course, it will be appreciated that the base structure can be made from other materials other than steel or aluminum, including composite materials such as any combination of metal, wood, plastic, rubber, ceramic, or the like. Furthermore, the base structure can be bolted or secured to the floor of the facility. Alternately, the base structure can include leveling feet to adjust a vertical height of the base structure from the floor to align the module with adjacent modules in the disassembly line.

Each of the disassembly stations or other components attached or otherwise coupled to the base structure can include actuators and sensors. Actuators can include, e.g., hydraulic actuators, pneumatic actuators, electric motors, and the like. For example, the modules can include a multi-axis robot for moving a portable electronic device between disassembly stations. Each axis of the robot is associated with a separate motor for actuating an arm or linkage of the multi-axis robot. Each axis can also be associated with an encoder or other means (e.g., gyroscopes, accelerometers, home switches, etc.) for providing position feedback. Sensors can include, e.g., limit switches, encoders, motion detectors, cameras, pressure transducers, temperature sensors, and the like.

The actuators can be controlled by control fluid (e.g., pressurized hydraulic fluid or air) or electrical signals (e.g., AC or DC power supplies and control signals). The sensors can require a power supply and provide output signals. Consequently, each of the modules can include a source and distribution means for electrical power and/or control fluid. For example, each module can include a connector for a regulated air supply to operate pneumatic cylinders. The regulated air supply can be connected to a manifold assembly that includes a number of electrically actuated valves for regulating the pressurized air to the various pneumatic cylinders. The output of each valve can be routed, via flexible tubing, to a corresponding actuator to convert air pressure into motion. Alternatively, the module can include a power supply (e.g., single-phase, 120 VAC, 60 Hz power) connected to the various electrical components. The power supply can be converted to control signals supplied to actuators and/or sensors. For example, the power supply can be connected to a variable frequency drive (VFD) that is configured to provide a variable frequency signal to an electric AC motor to control a speed of the AC motor. The control signal output by the VFD can be routed to the AC motor via a wire harness or a shielded cable that includes a plurality of conductors. It will be appreciated that the specific electrical requirements and/or pneumatic/hydraulic requirements will be determined based on the design of the module as well as the number and type of components included in each module.

According to some embodiments, a method for processing an electronic component associated with a portable electronic device by a conveyor system subsequent to removing the electronic component from a housing of the portable electronic device, where the conveyor system includes a container that is capable of carrying the electronic component, is described. The method can include depositing, at a receiving station of the conveyor system, the electronic component within a cavity of the container. The method can further include while moving the container that carries the electronic component from the receiving station in a direction towards a removal station of the conveyor system: monitoring a temperature of the electronic component, and in response to determining that the temperature of the electronic component exceeds a temperature threshold range associated with a thermal event: cooling the electronic component by dissipating thermal energy associated with the thermal event.

According to some embodiments, a system for processing an electronic component associated with a portable electronic device is described. The system includes a conveyor system that comprises a movable train having a container, where the movable train is capable of transporting the container, the conveyor system further comprising: a sensor capable of (i) determining when the electronic component is carried within a cavity of the container at a receiving station of the conveyor system, and (ii) in response to determining that the electronic component is carried within the cavity, providing a detection signal. The conveyor system further comprises a controller in communication with the sensor, where, in response to receiving the detection signal from the sensor, the controller is capable of generating an activation signal that causes the movable train to move the container carrying the electronic component, and a removal station that is capable of removing the electronic component from the container of the system when a temperature of the electronic component is less than a temperature threshold value.

According to some embodiments, a non-transitory computer readable medium is described. The non-transitory computer readable medium storing instructions that, when executed by a controller of a module for removing an electronic component associated with a portable electronic device by a conveyor system subsequent to removing the electronic component from a housing of the portable electronic device, cause the module to carry out steps that include transferring, at a receiving station of the conveyor system, the electronic component within a cavity of a container. The steps can further include while moving the container that carries the electronic component from the receiving station towards a removal station of the conveyor system: monitoring, by a sensor of the conveyor system, the temperature of the electronic component. The steps can further include in response to determining that a temperature of the electronic component exceeds a temperature threshold range associated with a thermal event: dissipating thermal energy associated with the thermal event, and removing, at the removal station, the electronic component from the container when the temperature is less than the temperature threshold range.

These and other embodiments are discussed below with reference to FIGS. 1-29; however, those skilled in the art will readily appreciate that the detailed description given herein with respect to these figures is for explanatory purposes only and should not be construed as limiting.

FIG. 1A illustrates a system diagram of a modular system 100 for disassembling portable electronic devices, in accordance with some embodiments. As shown in FIG. 1A, the modular system 100 includes a number of modules arranged in a disassembly line installed in a facility. The modular system 100 can include different modules 110, 120, 130, and 140 that are each configured to perform an exclusive function for disassembling a large-scale of portable electronic devices. The modular system 100 can include an in-feed unit 106 that is capable of providing a batch of different portable electronic devices. The in-feed unit 106 is capable of providing the batch to the first module 110. The first module 110 can include a station that is arranged to separate the display assembly from the housing and operational components of the portable electronic device. The display assembly can be further processed by the separate station or an additional station to disassemble the display assembly.

The second module 120 can receive the housing from the first module 110, and the second module 120 is arranged to separate a battery from the housing. Additionally, the second module 120 cool the housing and the battery to render an adhesive, which is used to secure the battery within the housing, brittle. The battery is then separated from the adhesive using a momentum of the battery to remove the adhesive bond. Thereafter, the second module 120 is configured to isolate the battery in a thermal even containment compartment such that the battery can be safely processed.

The third module 130 can receive the housing from the second module 120. The third module 130 is configured to remove mechanical fasteners that secure operational components to the portable electronic device. In particular, the third module 130 includes one or more pressing units to remove fasteners that secure the operational components to the housing.

The fourth module 140 can receive the housing from the third module 130. The fourth module 140 is configured to separate operational components from the housing. The fourth module 140 is operable to: press an insert of a logo and/or a rear-facing camera assembly out of the housing, displace operational components loose inside the housing using an auger or cutting tool attached to a spindle, and/or remove a portion of the housing that includes one or more antennas using a mechanical shear. The loose operational components and, in some cases, the housing are deposited onto a conveyor and transferred to a sorting table where an operator can sort the loose operational components into various receptacles for further processing.

Figure 1B:
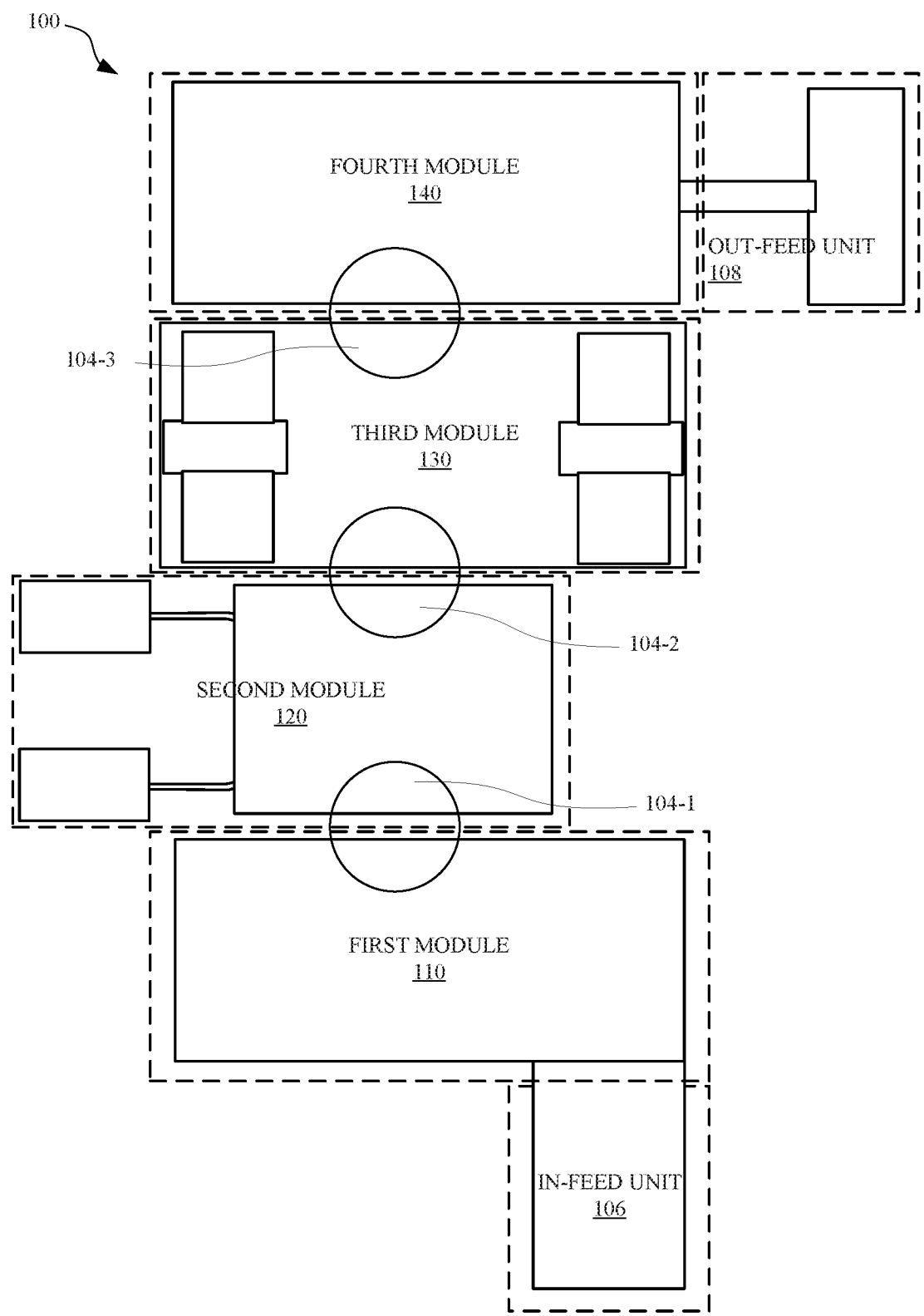
FIG. 1B illustrates a top view of a modular system for disassembling portable electronic devices, in accordance with some embodiments.

FIG. 1B illustrates a top view of a modular system 100 for disassembling portable electronic devices, in accordance with some embodiments. As shown in FIG. 1B, the modular system 100 includes a number of modules arranged in a disassembly line installed in a facility. One or more operators can run the disassembly line during operation, performing various tasks such as: supplying the modular system 100 with portable electronic devices to disassemble; monitoring the disassembly process; correcting issues during the disassembly process; manually loading or unloading portable electronic devices from the various modules; providing input to the modules using a user interface; monitoring output provided on various displays; and operating any safety mechanisms like emergency stops or operator lockout systems.

In some embodiments, each module includes a base structure that provides support for a number of different disassembly stations. The base structure can include steel tubing that has been welded together to form a frame. Brackets can be welded to the frame to couple the disassembly stations or other components to the frame, via welding, mechanical fasteners, adhesive, or other connection means. Alternatively, holes, threaded or unthreaded, can be drilled in the frame and the disassembly stations or other components can be connected directly to the frame via bolts or screws. In some embodiments, the base structure includes one or more plates secured to the frame and positioned at a height that is between a floor of the base structure and a ceiling of the base structure. Disassembly stations can be bolted or screwed to the one or more plates. In some embodiments, components of the portable electronic device can be deposited into receptacles located below the one or more plates during the disassembly process. These receptacles can be removed, periodically, by the operators in order to clear the components from the disassembly line. The components can then be collected and recycled by any technically feasible means.

In other embodiments, the base structure can include aluminum extrusion that is bolted together to form the frame. Of course, it will be appreciated that the base structure can be made from other materials other than steel or aluminum, including composite materials such as any combination of metal, wood, plastic, rubber, ceramic, or the like. Furthermore, the base structure can be bolted or secured to the floor of the facility. Alternately, the base structure can include leveling feet to adjust a vertical height of the base structure from the floor to align the module with adjacent modules in the disassembly line.

Each of the disassembly stations or other components attached or otherwise coupled to the base structure can include actuators and sensors. Actuators can include, e.g., hydraulic actuators, pneumatic actuators, electric motors, and the like. For example, the modules can include a multi-axis robot for moving a portable electronic device between disassembly stations. Each axis of the robot is associated with a separate motor for actuating an arm or linkage of the multi-axis robot. Each axis can also be associated with an encoder or other means (e.g., gyroscopes, accelerometers, home switches, etc.) for providing position feedback. Sensors can include, e.g., limit switches, encoders, motion detectors, cameras, pressure transducers, temperature sensors, and the like.

The actuators can be controlled by control fluid (e.g., pressurized hydraulic fluid or air) or electrical signals (e.g., AC or DC power supplies and control signals). The sensors can require a power supply and provide output signals. Consequently, each of the modules can include a source and distribution means for electrical power and/or control fluid. For example, each module can include a connector for a regulated air supply to operate pneumatic cylinders. The regulated air supply can be connected to a manifold assembly that includes a number of electrically actuated valves for regulating the pressurized air to the various pneumatic cylinders. The output of each valve can be routed, via flexible tubing, to a corresponding actuator to convert air pressure into motion. Alternatively, the module can include a power supply (e.g., single-phase, 120 VAC, 60 Hz power) connected to the various electrical components. The power supply can be converted to control signals supplied to actuators and/or sensors. For example, the power supply can be connected to a variable frequency drive (VFD) that is configured to provide a variable frequency signal to an electric AC motor to control a speed of the AC motor. The control signal output by the VFD can be routed to the AC motor via a wire harness or a shielded cable that includes a plurality of conductors. It will be appreciated that the specific electrical requirements and/or pneumatic/hydraulic requirements will be determined based on the design of the module as well as the number and type of components included in each module.

In some embodiments, an operator, loads a number of portable electronic devices into a hopper or other receptacle at a beginning of the disassembly line. As described in more detail below, a first module 110 can retrieve the portable electronic devices from the hopper, characterize physical attributes of the portable electronic device, orient each portable electronic device according to a standard orientation, perform a number of disassembly tasks on each portable electronic device, and then transfer the partially disassembled portable electronic device to a second module 120 using a first transfer station 104-1. The second module 120 performs additional disassembly tasks on the portable electronic device such as safely removing a battery from the portable electronic device. Then, the portable electronic device is disassembled further by a third module 130 and a fourth module 140, where the portable electronic devices are transferred between the second module 120 and the third module 130 by a second transfer station 104-2 and between the third module 130 and fourth module 140 by a third transfer station 104-3. The third module 130 and fourth module 140 perform additional disassembly tasks, such as processing the housing and removing operational components from the housing of the portable electronic device.

Components of each portable electronic device can be removed or otherwise processed during various disassembly tasks, and the removed components are directed to a bin or other receptacle to be removed from the disassembly line by an operator. In some cases, the disassembly tasks do not fully separate components, but instead process the portable electronic devices to prepare the portable electronic devices for additional disassembly tasks in one or more subsequent modules.

The modular system 100 also includes a transformer that receives power from a main power supply of the facility and converts the power to one or more power supplies. For example, the facility could provide the transformer with three-phase, 480 VAC power on a 90 amp circuit. The transformer then converts the main power supply to one or more secondary power supplies, such as: three-phase, 208 VAC power; single-phase, 208 VAC power; and/or single-phase, 120 VAC power. The secondary power supplies can then be provided from the transformer to the modules in the modular system 100. In some embodiments, each module includes an electrical panel that includes power distribution components (e.g., circuit breakers, DC power supplies, fuses, etc.), relays or other power switching components, programmable logic controllers (PLCs) or other control systems (e.g., computing devices, logic boards with embedded microcontrollers, etc.), and communications equipment (e.g., network communications cards, modems, radio frequency transceivers, etc.). The electrical panel provides a hub for wire harnesses or cables routed through the frame and distributed to the various disassembly stations and/or components included in the module. The wire harnesses or cables can be connected to the various electrical components as well as control logic within the electrical panel to operate the modules.

In some embodiments, the modular system 100 includes a single electrical panel shared between multiple modules. In such embodiments, control logic, such as a single PLC, can be configured to operate multiple modules simultaneously. Wire harnesses or cables from two or more modules can be routed to the shared electrical panel. In some embodiments, each module can include an electrical connector that corresponds to a mating electrical connector in an adjacent module. Thus, when modules are installed at the facility, the electrical connector is coupled to a mating electrical connector in order to route electrical signals from one module to a shared electrical panel in another module. In other embodiments, the electrical connectors are utilized to connect one electrical panel with a second electrical panel.

It will be appreciated that the number of modules in the modular system 100 can be increased or decreased to accommodate different disassembly tasks for different types of consumer electronic devices. Furthermore, each module can include fewer or additional stations to accommodate a lesser or greater number of disassembly tasks. Some modules are designed to complete multiple disassembly tasks at a plurality of stations while other modules are designed to complete a single disassembly task at a single station. Furthermore, each station within a module can include one or more tools designed to perform different aspects of a particular disassembly task. For example, a particular station can include one or more tools to hold or secure a portable electronic device and one or more additional tools to perform the disassembly task. Examples of the various tools that can be implemented within a station can include, but are not limited to, clamps, linear actuators, multi-axis robots, spindles with drill bits or other cutting tools (e.g., end mills, ball mills, etc.) secured therein, spindles with various driver bits (e.g., Philips head bits, etc.) secured therein, vibrating tables, conveyors, hydraulic tools, water jets, lasers, mechanical shears, and the like.

In some embodiments, the modular system 100 is designed to disassemble a portable electronic device, such as a smart phone or cellular handheld device. The modular system 100 can accept a plurality of different portable electronic devices in the hopper included at the beginning of the disassembly line. The first module 110 transfers each portable electronic device in the hopper onto a conveyor where a vision system is utilized to characterize physical attributes of the portable electronic device. The vision system can also be used to determine an orientation of the portable electronic device on the conveyor. A first robot picks up the portable electronic device from the conveyor and transfers the portable electronic device into a nest in a particular orientation to begin the disassembly process. A second robot picks up the portable electronic device from the nest, characterizes additional physical attributes of the portable electronic device, and delivers the portable electronic device to a number of stations to remove a display assembly from the portable electronic device.

The housing and operational components of the portable electronic device, without the display assembly, are then transferred to the second module 120 via the first transfer station 104-1, where a battery of the portable electronic device is removed in a safe manner. The battery can be isolated in a thermal event containment container after separation from the housing in case of a thermal event. The housing and operational components of the portable electronic device, without the battery, are then transferred to the third module 130 via the second transfer station 104-2, where a pressing unit can remove mechanical fasteners retaining at least some operational components to the housing of the portable electronic device. The housing and operational components of the portable electronic device are then transferred to the fourth module 140 via the third transfer station 104-3, where a tool removes an insert of a logo from the housing of the portable electronic device. A rotating cutting tool ensures all of the operational components are separated from the housing, and a portion of the housing may be sheared off to separate one or more antennas from the housing. The components of the portable electronic device are dropped onto a conveyor, which delivers the loose components to a sorting table. An operator at the sorting table sorts the loose components into various receptacles.

It will be appreciated that the modular system 100 can handle different portable electronic devices, without intervention or explicit setup performed by the operators. The modular system 100 is configured to characterize the physical attributes of the portable electronic device. These attributes track the portable electronic device through the disassembly process. The data can identify parameters that indicate configuration data for each station to perform a particular disassembly task on that portable electronic device. For example, certain actuators can be adjusted to accommodate different sized portable electronic devices. Alternatively, tool paths can be changed in order to accommodate different locations of components or different structural differences within each of the different portable electronic devices.

In some embodiments, the modular system 100 tracks each portable electronic device as it moves through the disassembly line. Different disassembly stations can supplement the data used to track the portable electronic device as it moves between modules. For example, the first disassembly station can include a camera that identifies the portable electronic device based on measured physical attributes such as a length and a width. In some embodiments, the image captured by the camera can be analyzed to recognize specific structures or shapes such as a configuration of a front-facing or rear-facing camera lens assembly integrated into a face of the portable electronic device. The image analysis can be in addition to or in lieu of detecting edges of the device and measuring distances between edges as part of measuring the physical attributes of the device.

In some embodiments, the modular system 100 is configured to disassemble portable electronic devices in a variety of conditions, such as a sub-standard condition. It will be appreciated that automated disassembly of portable electronic devices will typically be performed at the end of a device's useful life. The portable electronic device can be scratched, cracked, bent, missing components, and so forth. It should not be assumed that a portable electronic device disassembled by the modular system 100 conforms to the exact specifications as the portable electronic device was manufactured prior to being sold to an end user. Consequently, the different disassembly stations within the modular system 100 must conform to devices having certain defects, within limits. For example, the degree of bend within a housing of the portable electronic device can be required to be within limits in order to be disassembled by the modular system 100. In some cases, the modular system 100 inspects the condition of each portable electronic device received and may not process any portable electronic device that is not in satisfactory condition. The satisfactory condition relates to a number of different measurements being within a specified tolerance. For example, a bend angle must be within 10 degrees, positive or negative, of flat, certain components should be present for the device to be handled, and the like.

Figure 2A:
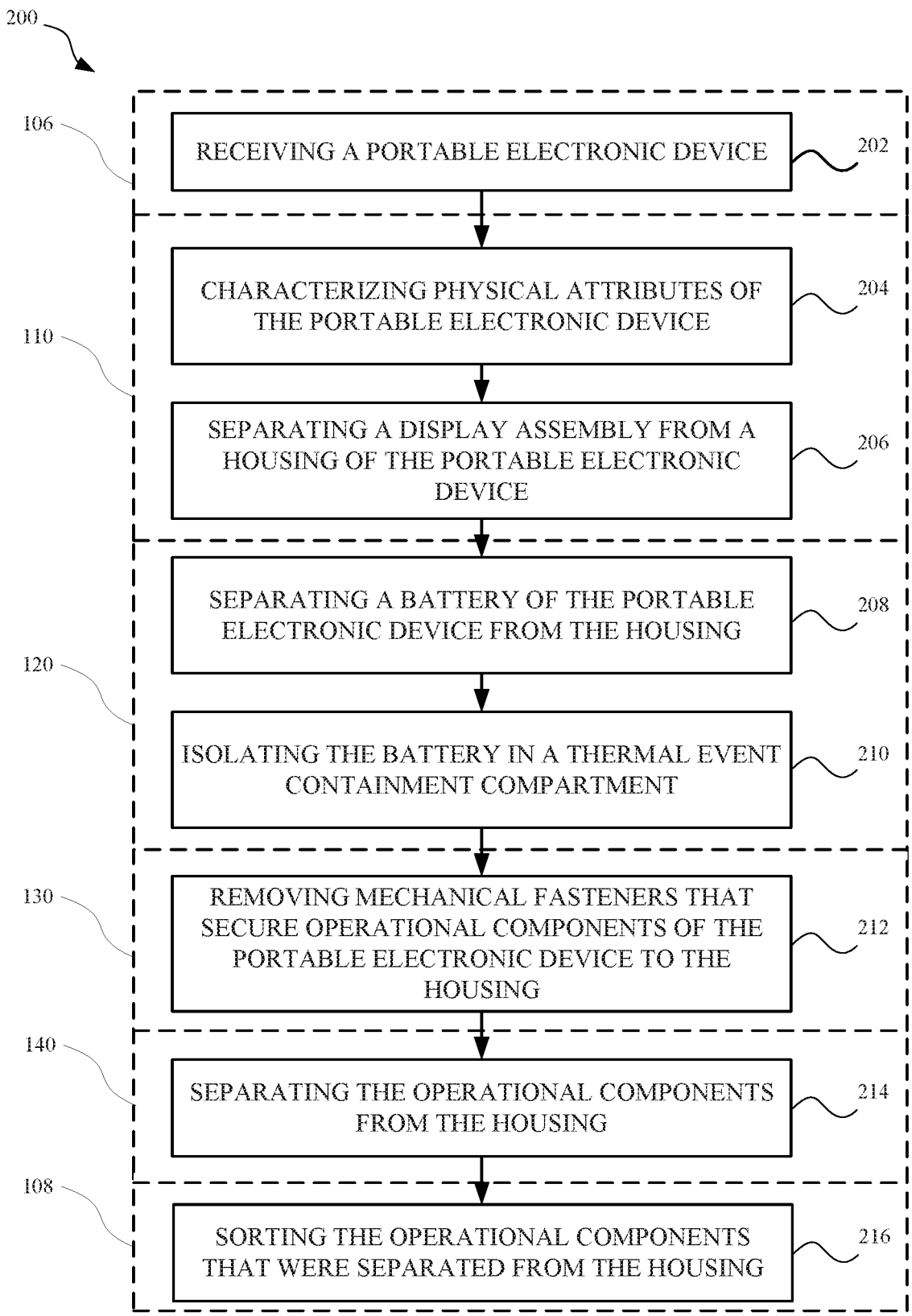
FIG. 2A illustrates a flow diagram of a method for disassembling a portable electronic device, in accordance with some embodiments.

FIG. 2A illustrates a flow diagram of a method 200 for disassembling a portable electronic device, in accordance with some embodiments. The method 200 is carried out by the modular system 100. In some embodiments, the method 200 can be implemented as logic configured to control the operation of each of the different modules of the modular system 100. The logic can include instructions, executed by a controller of a control system, for carrying out one or more disassembly tasks utilizing the modules of the modular system 100.

At step 202, the modular system 100 receives a portable electronic device. In some embodiments, an operator loads one or more portable electronic devices into a hopper of a first module 110 in the modular system 100. Each portable electronic device loaded into the hopper is removed by an automatic loading station by being transferred from the hopper to the first module 110 on a conveyor.

At step 204, the modular system 100 characterizes physical attributes of the portable electronic device. In some embodiments, the physical attributes are characterized by analyzing a digital image of the portable electronic device. The digital image can be processed by an edge detection algorithm, and one or more dimensions of the portable electronic device as projected in a plane of the digital image are measured based on the location of the edges. In some embodiments, multiple digital images of the portable electronic device can be captured using separate and distinct cameras. Each digital image can be utilized to characterize different physical attributes. For example, a first digital image can be utilized to characterize a length and width of the portable electronic device and a second digital image can be utilized to characterize a bend angle of a housing of the portable electronic device.

At step 206, a display assembly is separated from a housing of the portable electronic device. In some embodiments, the first module 110 includes a station operable to remove the display assembly from the housing and operational components of the portable electronic device. The display assembly can be further processed by the separate station or an additional station to disassemble the display assembly.

At step 208, a battery of the portable electronic device is separated from the housing. In some embodiments, the second module 120 cools the housing and the battery to render an adhesive, which is used to secure the battery within the housing, brittle. The battery is then separated from the adhesive using a momentum of the battery to remove the adhesive bond.

At step 210, the battery is isolated in a thermal event containment compartment. It will be appreciated that the battery include chemicals used to store energy. Automated disassembly can sometimes pierce or otherwise damage the battery, which increases the chances of a runaway thermal event due to chemical reactions. In order to prevent this fire hazard, the battery is placed in an isolation chamber and monitored for a period of time to detect the occurrence of a thermal event. Once the period of time has passed, and any intervening thermal event has been suppressed, the battery can be removed from the modular system for further processing.

At step 212, mechanical fasteners securing operational components of the portable electronic device to the housing are removed/unscrewed/rendered inoperable. In some embodiments, the third module 130 includes one or more mechanical presses used to remove screws securing the operational components to the housing. The screw heads can be pressed through a surface of the operational components in order to overcome the constraint imposed by the screws.

At step 214, the operational components are separated from the housing. In some embodiments, the fourth module 140 includes a number of stations for separating operational components from the housing. The fourth module 140 is operable to: press an insert of a logo and/or a rear-facing camera assembly out of the housing, displace operational components loose inside the housing using an auger or cutting tool attached to a spindle, and/or remove a portion of the housing that includes one or more antennas using a mechanical shear. The loose operational components and, in some cases, the housing are deposited onto a conveyor and transferred to a sorting table where an operator can sort the loose operational components into various receptacles for further processing, indicated at step 216.

It will be appreciated that the method 200 may include additional steps for performing additional disassembly tasks. For example, other types of portable electronic devices may require additional steps implemented within any of the modules described above or in additional modules placed adjacent to or between any of the modules described above. Each of the modules of the modular system 100 is described in greater detail below.

Figure 2B:
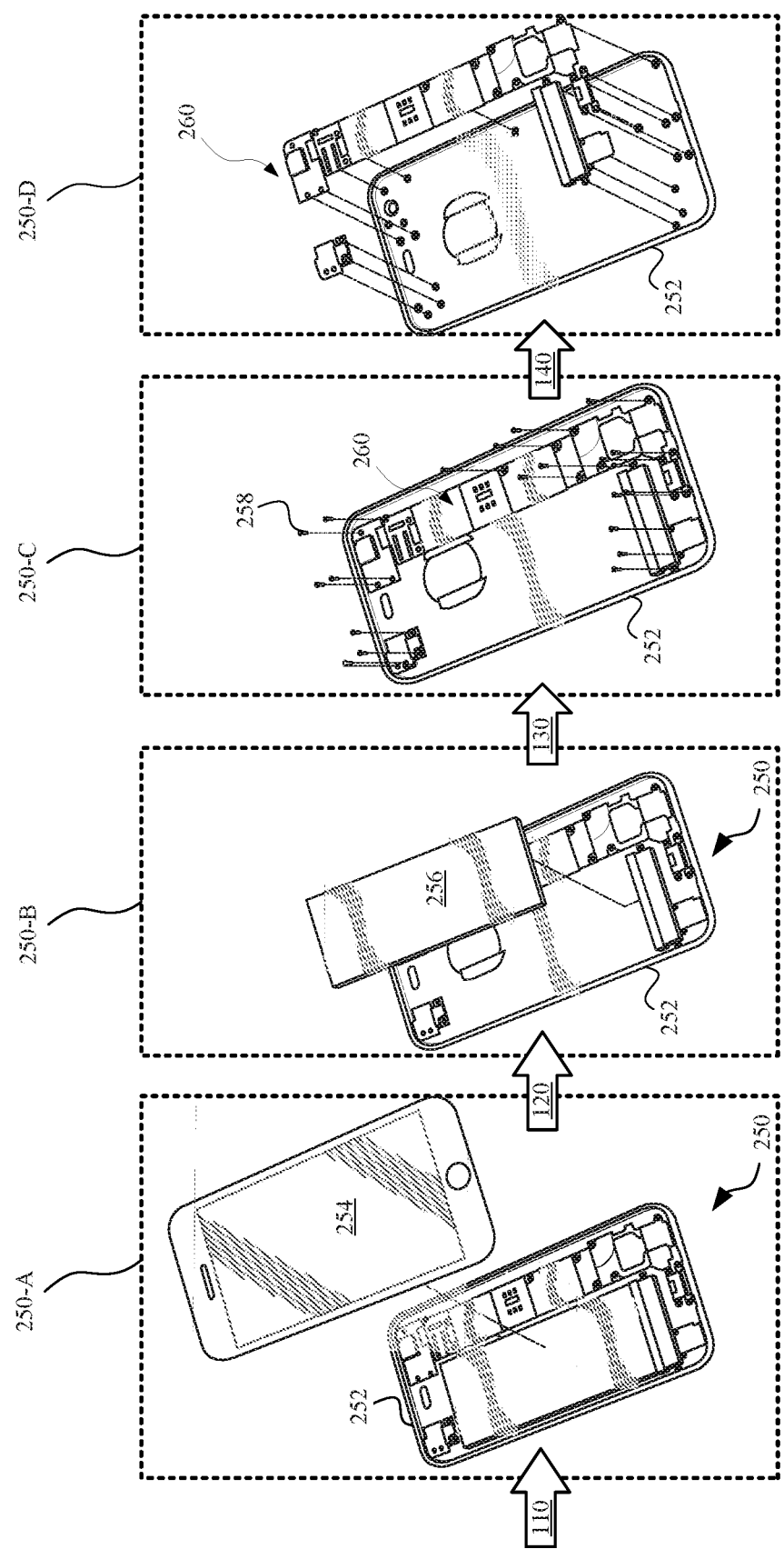
FIG. 2B illustrates an exploded view of a portable electronic device that is disassembled by the modular system, in accordance with some embodiments.

FIG. 2B illustrates an exploded view of a portable electronic device that is disassembled by the modular system, in accordance with some embodiments. FIG. 2B illustrates a first state 250-A of the portable electronic device 250, which corresponds to a display assembly 254 is separated from a housing 252 of the portable electronic device 250, subsequent to being processed by the first module 110. FIG. 2B further illustrates a second state 250-B of the portable electronic device 250, which corresponds to an electronic component (e.g., battery) 256 and fasteners 258 being removed from the housing 252, subsequent to being processed by the second module 120. FIG. 2B further illustrates a third state 250-C of the portable electronic device 250, which corresponds to fasteners 258 being removed from the housing 252, subsequent to being processed by the third module 130. FIG. 2B further illustrates a fourth state 250-D of the portable electronic device 250, which corresponds to operational components 260 being removed from the housing 252, subsequent to being processed by the fourth module 140.

First Module (Also Referred to as "a Display Assembly Removal Module")

Figure 3A:
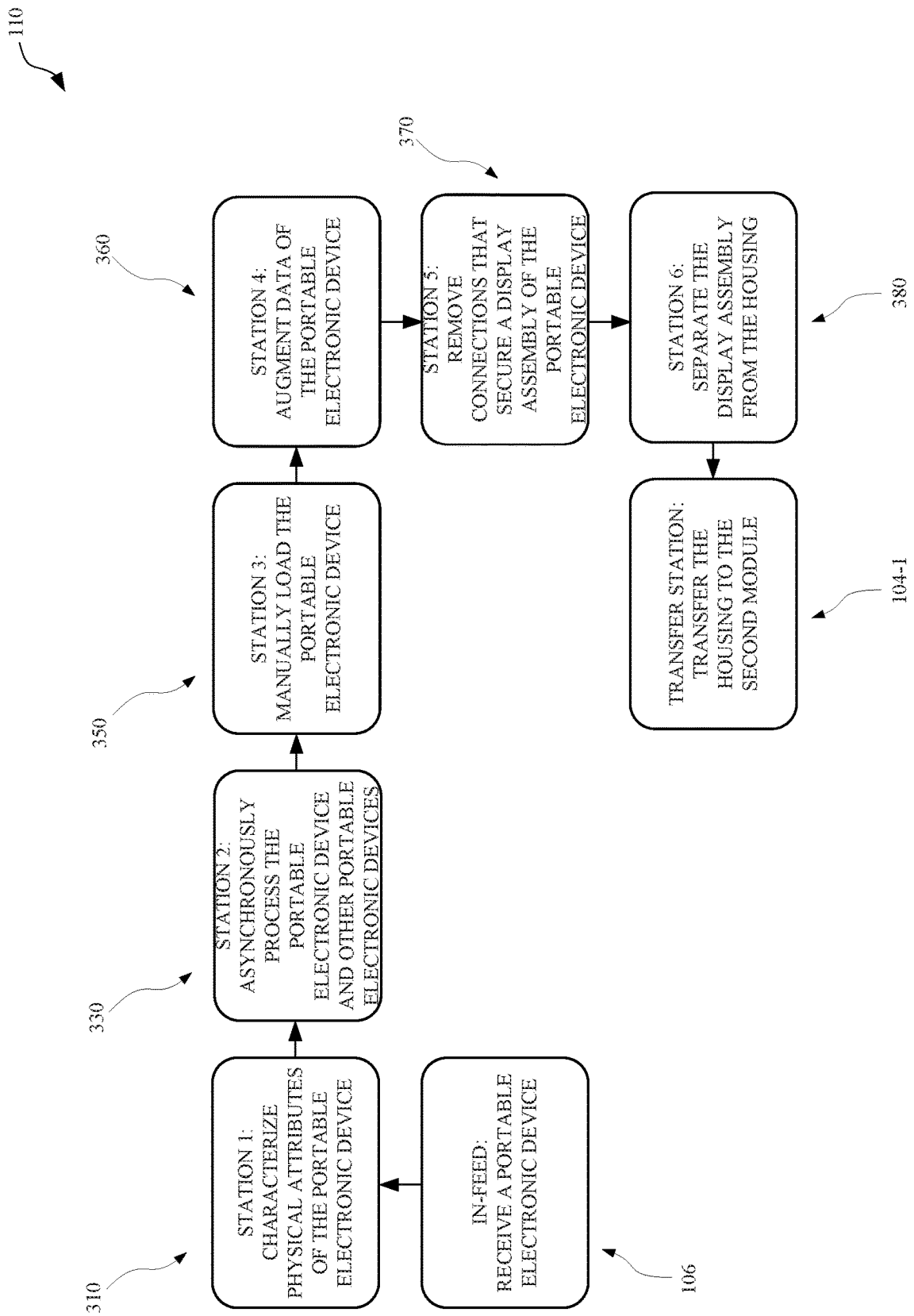
FIG. 3A illustrates a system diagram of a first module of the modular system for disassembling portable electronic devices, in accordance with some embodiments.

FIG. 3A illustrates a system diagram of a first module for disassembling portable electronic devices, in accordance with some embodiments. As shown in FIG. 3A, the first module 110 includes a number of station that are arranged to perform dedicated functions for disassembling a large-scale of portable electronic devices. The first module 110 can include an in-feed unit 106 that is capable of providing a batch of different portable electronic devices. The in-feed unit 106 is capable of providing the batch to the first module 110. The first module 110 can include an automatic loading station 310 that includes a hopper that is capable of being filled with the portable electronic devices. Physical characteristics of the portable electronic device can be determined at the automatic loading station 310.

Subsequently, a receiving station 330 of the first module 110 can include a plurality of nests that are capable of receiving the portable electronic devices from the automatic loading station 310 via a robotic arm. The receiving station 330 can asynchronously process the portable electronic device and other portable electronic devices in the batch. Throughout the first module 110, it should be noted that the operator can instruct the robotic arm to repeat a disassembly task that was previously unsuccessful. In another example, the operator can remove the portable electronic device from the disassembly line and manually perform the disassembly task before returning the portable electronic device back to the disassembly line such that the first module 110 can resume the automated disassembly of the portable electronic device.

Thereafter, a manual loading station 350 of the first module 110 is capable of manually loading the portable electronic device. Subsequently, a vision station 360 of the first module 110 is capable of augmenting data of the portable electronic device. According to some embodiments, the vision station 360 can include a camera having a lens assembly and an image sensor. In some examples, the vision station 360 can determine a side profile of the portable electronic device, such as by determining a bend angle of a housing of the portable electronic device. In another example, the vision station 360 can capture an image of the portable electronic device in order to identify an orientation of the portable electronic device relative to a component of the first module 110 (e.g., a front face of the portable electronic device is face-up). In another example, the vision station 360 can utilize the image to determine a condition of the portable electronic device, such as presence of cracks and/or scratches. According to some embodiments, the image of the portable electronic device can be utilized to generate an identifier (DEVICEid) parameter that is generated to track the portable electronic device throughout the modular system 100 as the portable electronic device moves through the disassembly process. Moreover, throughout the disassembly process by the modules, the modular system 100 can supplement information related to the portable electronic device.

Subsequently, a first disassembly station 370 of the first module 110 is capable of removing connections that secure a display assembly to a housing of the portable electronic device. In some examples, the first disassembly station 370 is operable to remove fasteners and/or electrical connections between a housing and a display assembly of the portable electronic device. The display assembly can include at least a glass substrate having at least one side that forms a front face of the portable electronic device and a display for displaying pixel data. In some embodiments, the display assembly also includes a home button and a receiver assembly including the front-facing camera, the speaker, and the microphone. The first disassembly station 370 can secure the portable electronic device in a clamp (e.g., via a robotic arm), and force a tool into the housing to remove the fasteners securing the display assembly to the housing and/or electrical connections between electrical components within the housing and electrical components included in the display assembly. In some examples, the clamp can be used to secure the portable electronic device to prevent unintended movement of the portable electronic device while the display assembly is removed from the housing.

Thereafter, the portable electronic device is processed at a second disassembly station 380 of the first module 110 that is capable of separating the display assembly from the housing. Thereafter, a first transfer station 104-1 transfers the housing from the first module 110 to a second module 120.

According to some embodiments, the first module 110 can include a control system for implementing the various techniques described herein. In particular, the control system can include one or more controllers that are configured to execute instructions stored at one or more storage devices. The one or more storage devices can include volatile memory such as dynamic random access memory (DRAM) and/or non-volatile memory such as a hard disk drive (HDD) or solid state drive (SSD). The one or more controllers are configured to provide signals and to receive signals to the various stations of the first module 110 as described herein.

According to some embodiments, the robotic arm utilized by the first module 110 can include one or more actuators, such as an electric motor, hydraulic motor, or the like, as well as one or more sensors, such as a quadrature encoder, torque sensor, accelerometer or gyroscope, or the like. The robotic arm can include multiple linkages, where each actuator associated with a linkage represents a different axis of the robotic arm. Each actuator for multiple linkages can be operated in tandem to generate coordinated motion of the linkages.

In some embodiments, the first module 110 includes multiple multi-axis robots to coordinate motion between different stations of the first module 110. It will be appreciated that, in some embodiments, the multi-axis robotic arm is substituted with a different type of robotic system, such as an overhead gantry system that moves a robotic arm in an X-Y coordinate plane. The robotic arm can include a tool that moves in a Z coordinate direction and rotates around one or more axes to move to different locations at different orientations. In some embodiments, the robotic arm is a six-axis robot that includes six actuators for moving and orienting a tool in a 3D coordinate system. The six-axis robot can also include separate control signals for the tool, such as a control signal for a grip or clamp at the end of the robotic arm.

Figure 3B:
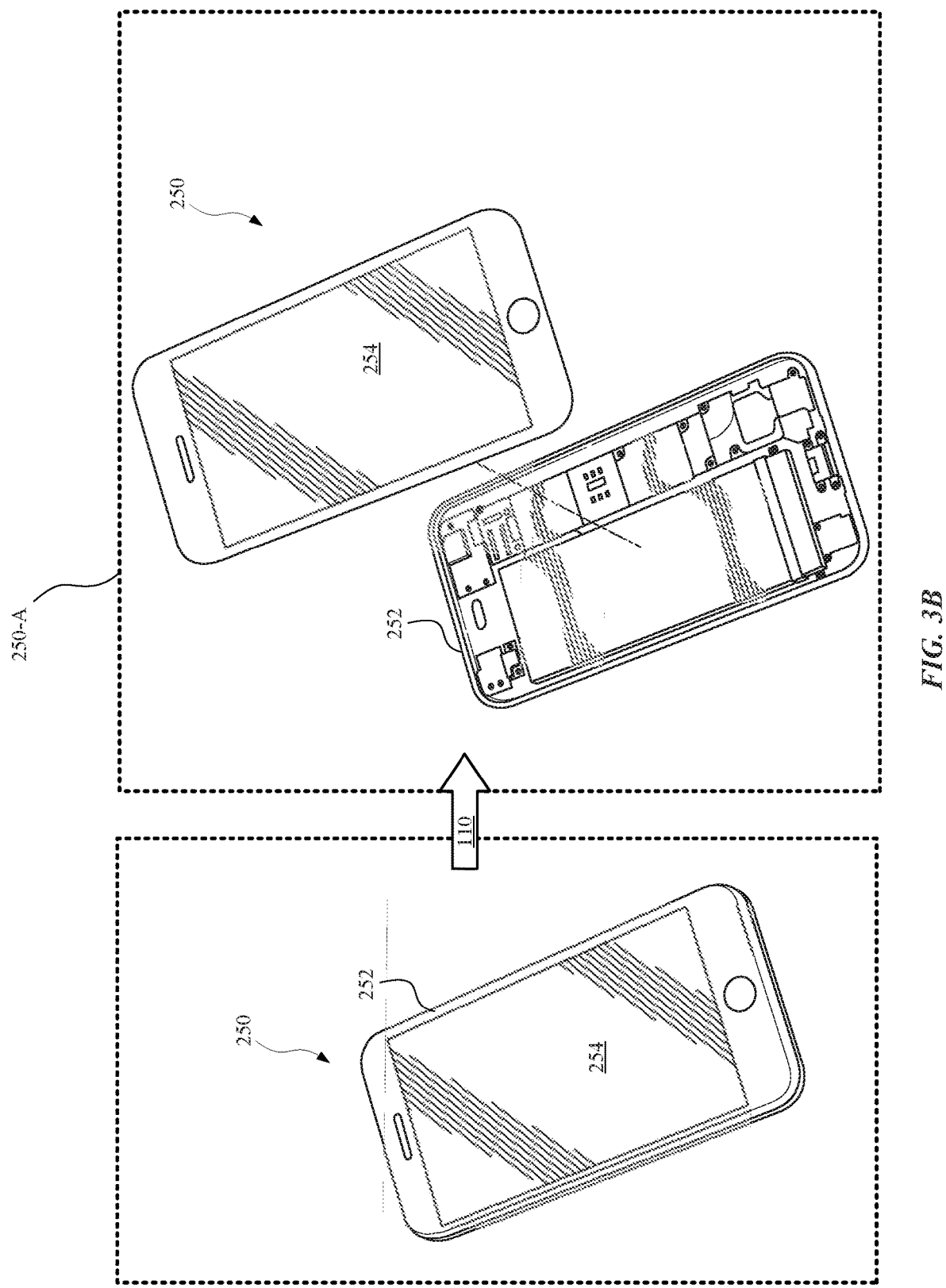
FIG. 3B illustrates an exploded view of a portable electronic device that is disassembled by the first module, in accordance with some embodiments.

FIG. 3B illustrates an exploded view of an exemplary portable electronic device 250 subsequent to being disassembled by the first module 110, in accordance with some embodiments. FIG. 3B illustrates the portable electronic device 250 prior to being processed by the first module 110. In particular, a display assembly 254 is secured to a housing 252 of the portable electronic device 250. FIG. 3B further illustrates a first state 250-A of the portable electronic device 250, which corresponds to the display assembly 254 is removed from the housing 252 of the portable electronic device 250, subsequent to being processed by the first module 110.

Figure 4:
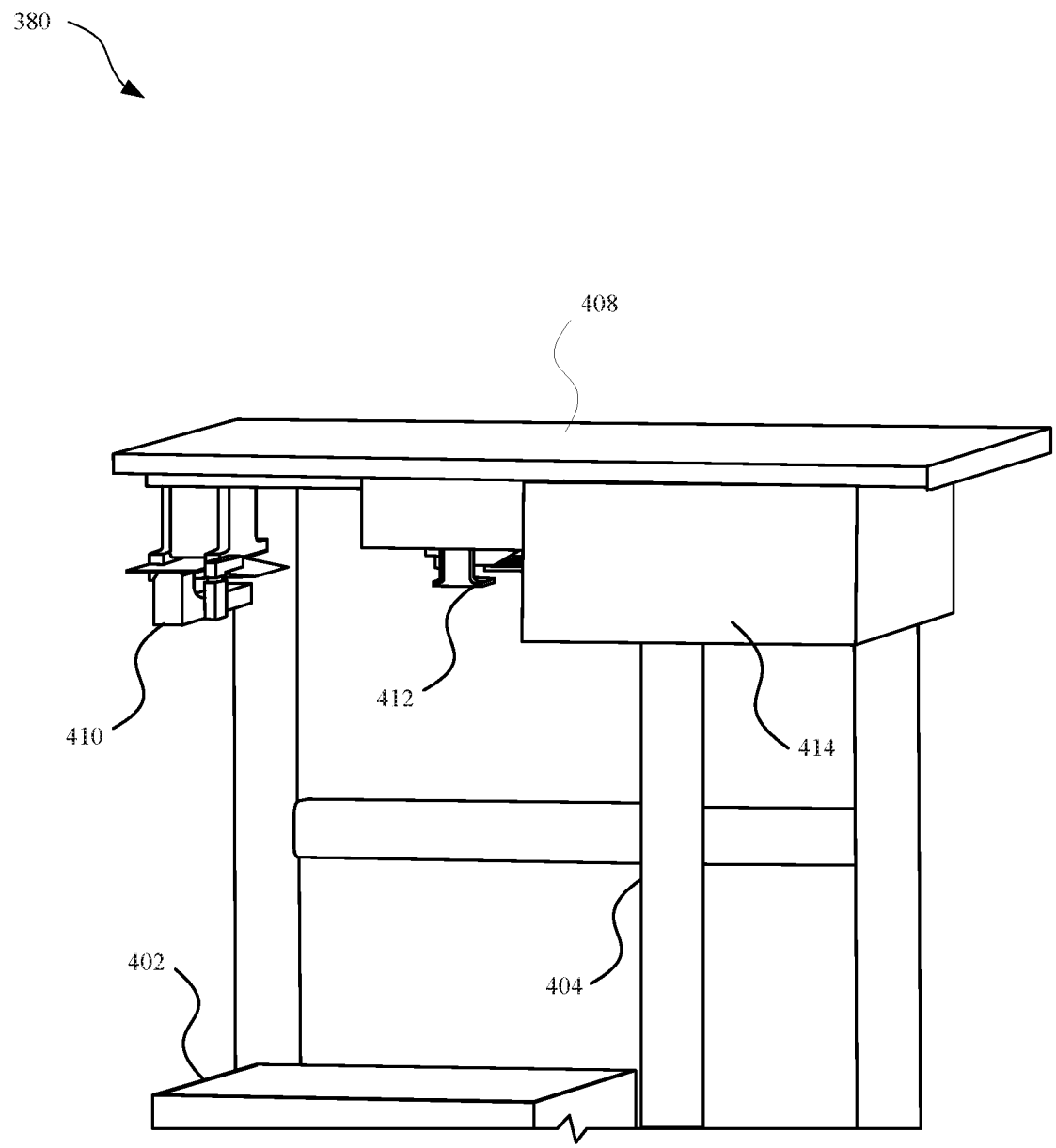
FIG. 4 illustrates a second disassembly station of the first module, in accordance with some embodiments.

FIG. 4 illustrates the second disassembly station 380 of the first module 110, in accordance with some embodiments. The second disassembly station 380 is operable to separate a display assembly 254 from a housing 252 of the portable electronic device 250. In some embodiments, the second disassembly station 380 performs a disassembly task that further disassembles at least a portion of the display assembly and sorts two or more components included within the display assembly into separate receptacles.

In some embodiments, a robot (e.g., robotic arm, etc.) introduces the portable electronic device to the second disassembly station 380. In some examples, the portable electronic device is introduced to the second disassembly station 380 after having been partially disassembled at the first disassembly station 370. In particular, connections (e.g., adhesive, mechanical fasteners, etc.) securing the display assembly 254 to the housing 252 have been rendered in such a manner that the display assembly 254 is not fully secured to the housing 252. In some embodiments, the display assembly 254 is separated from the housing 252 proximate at least one edge of the display assembly 254 such that a gap exists between an edge of the housing 252 and the at least one edge of the display assembly 254. In some examples, the portable electronic device is introduced to the first module 110 in a partially disassembled condition. For instance, the display assembly 254 may be cracked or an attachment feature (e.g., bonding agent, adhesive, fastener, etc.) that secures the display assembly 254 to the housing 252 may be in a weakened or sub-optimal condition such that the display assembly 254 is minimally secured to the housing 252.

As shown in FIG. 4, the second disassembly station 380 includes a base structure 408. The base structure 408 includes a number of structural members secured to triangular ribs at a left edge, a right edge, and an intermediate portion of the structural members. The structural members are aluminum plates that include various holes or slots formed therein. The triangular ribs secure a top plate, via screws, to a rear plate, such that the top plate is approximately perpendicular to the rear plate. The base structure 408 forms a frame on which one or more tools are affixed to perform various steps of the disassembly task. In other embodiments, the base structure 408 can be formed from welded metal components, such as steel plate or tubes welded to form the base structure 408, or extruded components bolted together to form a frame.

A first disassembly tool 410 is affixed to the base structure 408. The first disassembly tool 410 is a wedge component that is utilized to separate the display assembly from the housing. The first disassembly tool includes a wedge component, a clamping member, and an actuator. In some embodiments, the wedge component is a rigid body with a tapered portion that forms a leading edge on one edge of the body. The leading edge is oriented to be located towards a second disassembly tool 412 affixed to the base structure 408. Alternatively, the leading edge can be oriented towards the robot 340. The leading edge is designed to fit into the gap between the display assembly and the housing created by the first disassembly station 370, as described in more detail with reference to FIGS. 5A-5E. The leading edge can be sharp (e.g., where two surfaces intersect at a line, having a small angle between the two surfaces) or blunt (e.g., where the leading edge is rounded or chamfered). The tapered portion can be limited to a first portion of the body, where a second portion of the body is flat (i.e., a non-tapered portion), the second portion of the body having a substantially uniform thickness. The second portion can include through holes or threaded holes so that the wedge component can be removed from the first disassembly tool 410 such that the leading edge can be sharpened or a new wedge component having a different cross-sectional shape can be installed therein.

The first disassembly tool 410 also includes a clamping member proximate a first surface of the wedge component. The clamping member is attached to an actuator, such as a pneumatic cylinder or a hydraulic cylinder. The actuator can force the clamping member towards the wedge component, thereby exerting a clamping force against any structure between a clamping surface of the clamping member and a corresponding clamping surface of the wedge component. In some embodiments, the clamping surface of the wedge component includes, at least in part, a surface in the tapered portion of the wedge component. In other embodiments, the clamping surface of the wedge component includes, at least in part, a surface in the non-tapered portion of the wedge component.

In some embodiments, the wedge component is fixed relative to the base structure 408 of the second disassembly station 380. In such embodiments, the actuator moves the clamping member relative to the base structure 408 to close a distance between the clamping surfaces of the clamping member and the wedge component. In other embodiments, the wedge component is affixed to a ram of the actuator. In such embodiments, the clamping member is fixed relative to the base structure 408, and the actuator moves the wedge component relative to the base structure 408 to close a distance between the clamping surfaces of the clamping member and the wedge component.

In some embodiments, the clamping member is at least a portion of a housing of an actuator. For example, a wedge component is moved towards a surface of a pneumatic cylinder to clamp a component between the surface of the actuator and the surface of the wedge component. In other embodiments, the clamping member is secured (i.e., fixed) to a housing of the actuator such that the clamping surface of the clamping member is not actually a part of the actuator.

In some embodiments, a button removal component is configured to completely remove the home button from the display assembly. The second disassembly tool 412 can then sort the home button separately from the display assembly. In other embodiments, the button removal component renders the home button inoperable while leaving the home button connected to the display assembly. In some examples, the home button includes a fingerprint sensor. The second disassembly tool 412 is capable of applying a force against the home button, thereby rendering the fingerprint sensor inoperable. Additionally, the second disassembly tool 412 is capable of rendering a memory that is in communication with the fingerprint sensor inoperable.

In some embodiments, the second disassembly station 380 also includes a third disassembly tool 414. The third disassembly tool 414 is operable to remove one or more components from the display assembly. In some embodiments, the third disassembly tool 414 includes a hydraulic press. The hydraulic press includes a hydraulic cylinder attached to a top half of a die. The bottom half of the die is fixed relative to the base structure 408 of the second disassembly station 380. The hydraulic cylinder drives the top half of the die toward the bottom half of the die. The second disassembly tool 412 inserts the display assembly into a gap between the top half and the bottom half of the die when the top half of the die is retracted towards the top plate of the base structure 408. The top half of the die is then forced down towards the bottom half of the die to compress at least a portion of the display assembly between the top half of the die and the bottom half of the die. The top half of the die and the bottom half of the die include mating edges that operate to shear through the display assembly, thereby separating the receiver assembly from the display assembly. It will be appreciated that the hydraulic press can shear through at least some other components of the display assembly in order to separate the receiver assembly from the display assembly.

It will be appreciated that in some embodiments, additional disassembly tools can be included within the second disassembly station 380 by being affixed to the base structure 408. In addition, one or more of the first disassembly tool 410, the second disassembly tool 412, and the third disassembly tool 414 can be omitted from the second disassembly station 380.

As illustrated in FIG. 4, the first module 110 includes a hopper 402 positioned below the second disassembly station 380 that funnels components into a first receptacle proximate the bottom of the first module 110. The first module 110 also includes a chute 404 that funnels the receiver assembly into a second receptacle proximate the bottom of the first module 110. The display assembly can be placed by the second disassembly tool 412 into the hopper 402 to be collected in the first receptacle.

An opening of the chute 404 is located proximate the third disassembly tool 414 such that the receiver assembly can be sorted by placing the receiver assembly into the opening in the chute 404. The receiver assembly travels down the chute 404 into the second receptacle, which collects a number of receiver assemblies before being removed by an operator.

Figure 5A:
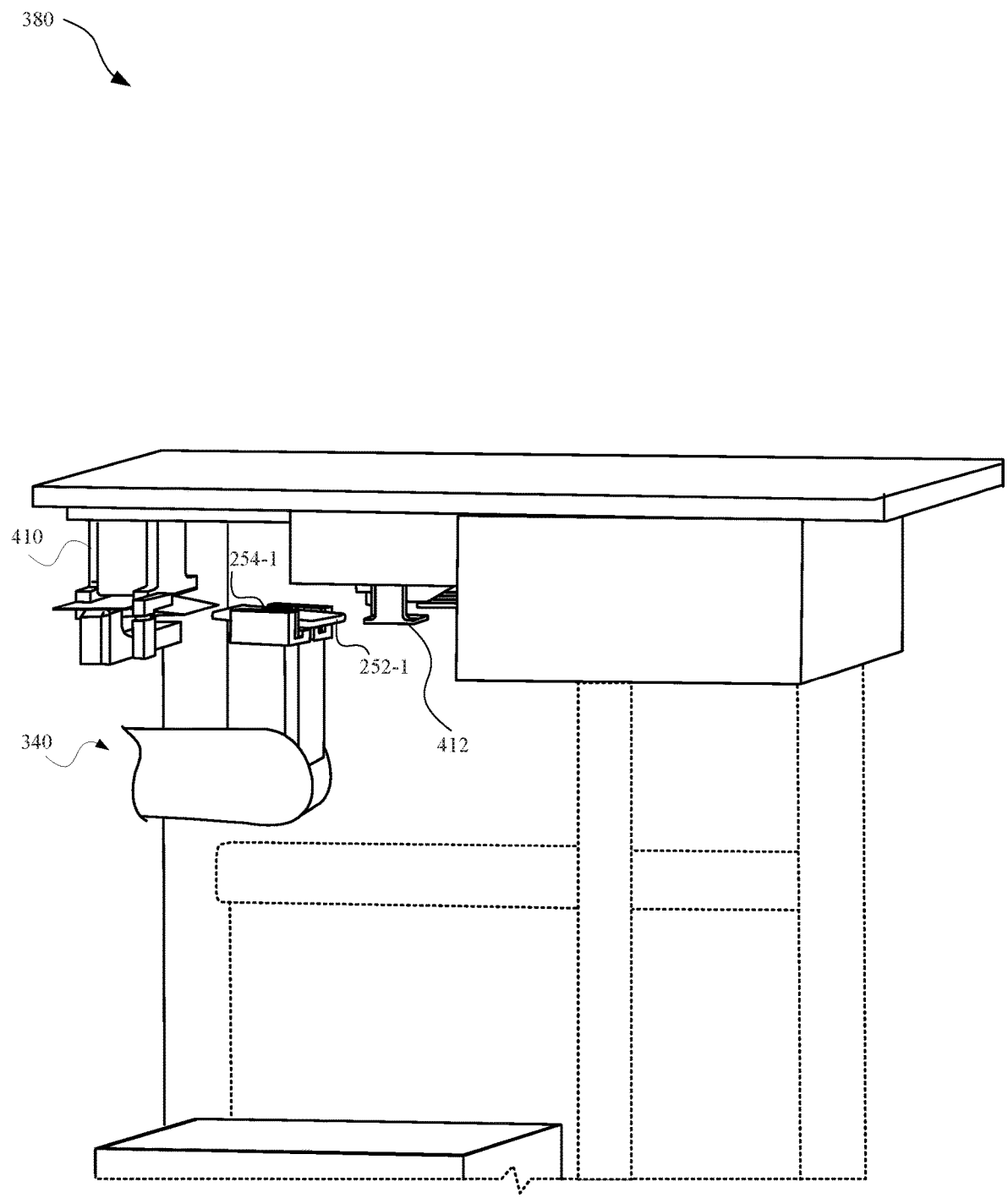
FIGS. 5A-5E illustrate the operation of a disassembly task performed by the second disassembly station, in accordance with some embodiments.

FIGS. 5A-5E illustrate the operation of a disassembly task performed by the second disassembly station 380, in accordance with some embodiments. As shown in FIG. 5A, the robot 340 brings the portable electronic device 250-1 from the first disassembly station 370 to the second disassembly station 380.

Figure 5B:
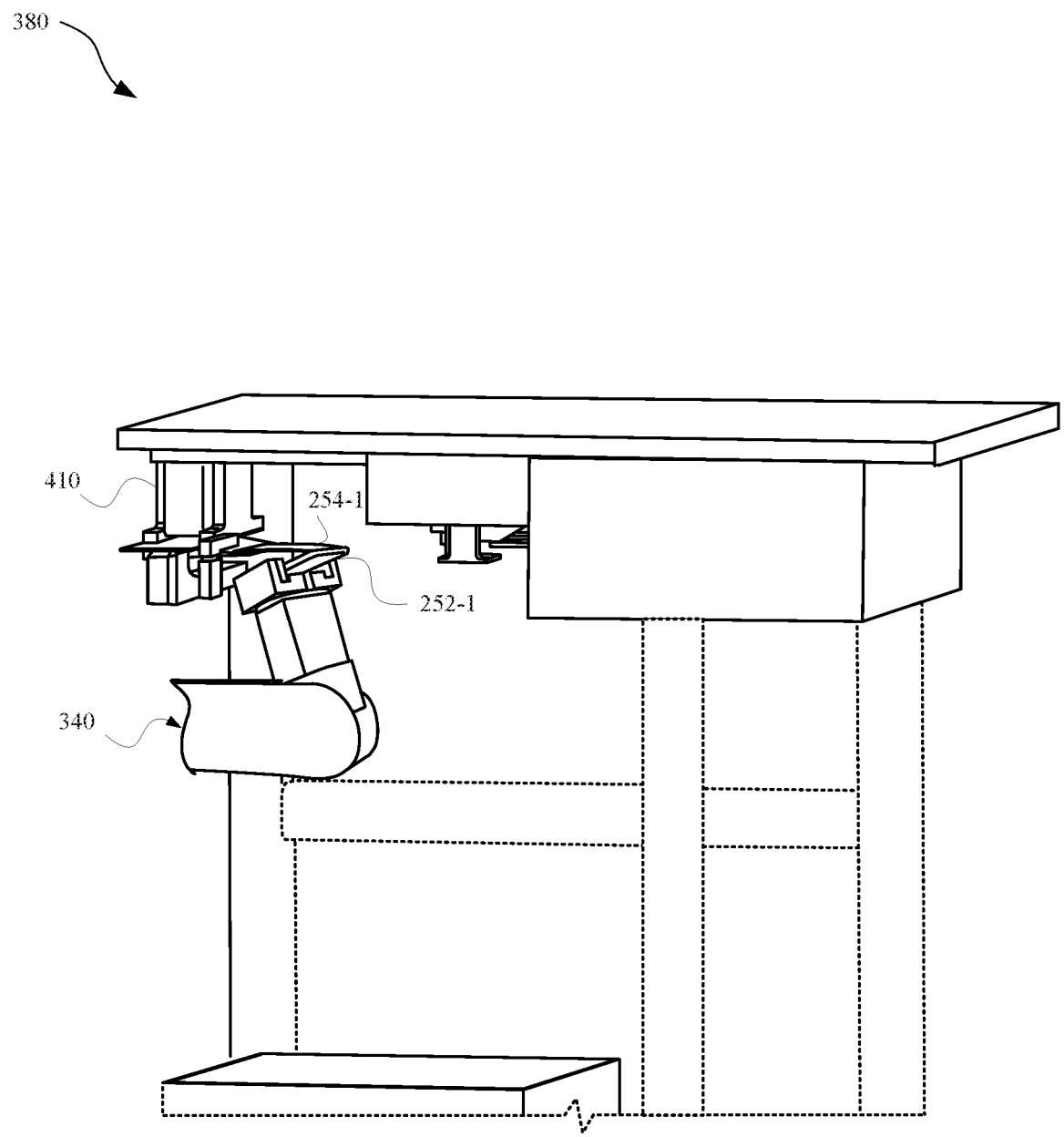

As shown in FIG. 5B, the portable electronic device 250-1 is driven onto the wedge component of the first disassembly tool 410 by the robot 340. The robot 340 inserts the leading edge of the wedge component into the gap between the display assembly 254-1 and the housing 252-1 of the portable electronic device 250-1. The display assembly 254-1 is positioned on one side of the wedge component and the housing 252-1 is positioned on the other side of the wedge component, with the leading edge positioned between the display assembly 254-1 and the housing 252-1 of the portable electronic device 250-1. The wedge component forces the display assembly 254-1 away from the housing 252-1 of the portable electronic device 250-1; however, the display assembly 254-1 is not fully separated from the housing 252-1. Once the display assembly 254-1 is driven onto the wedge component to a minimum depth, the clamping component is engaged to secure the display assembly 254-1 in the first disassembly tool 410.

Figure 5C:
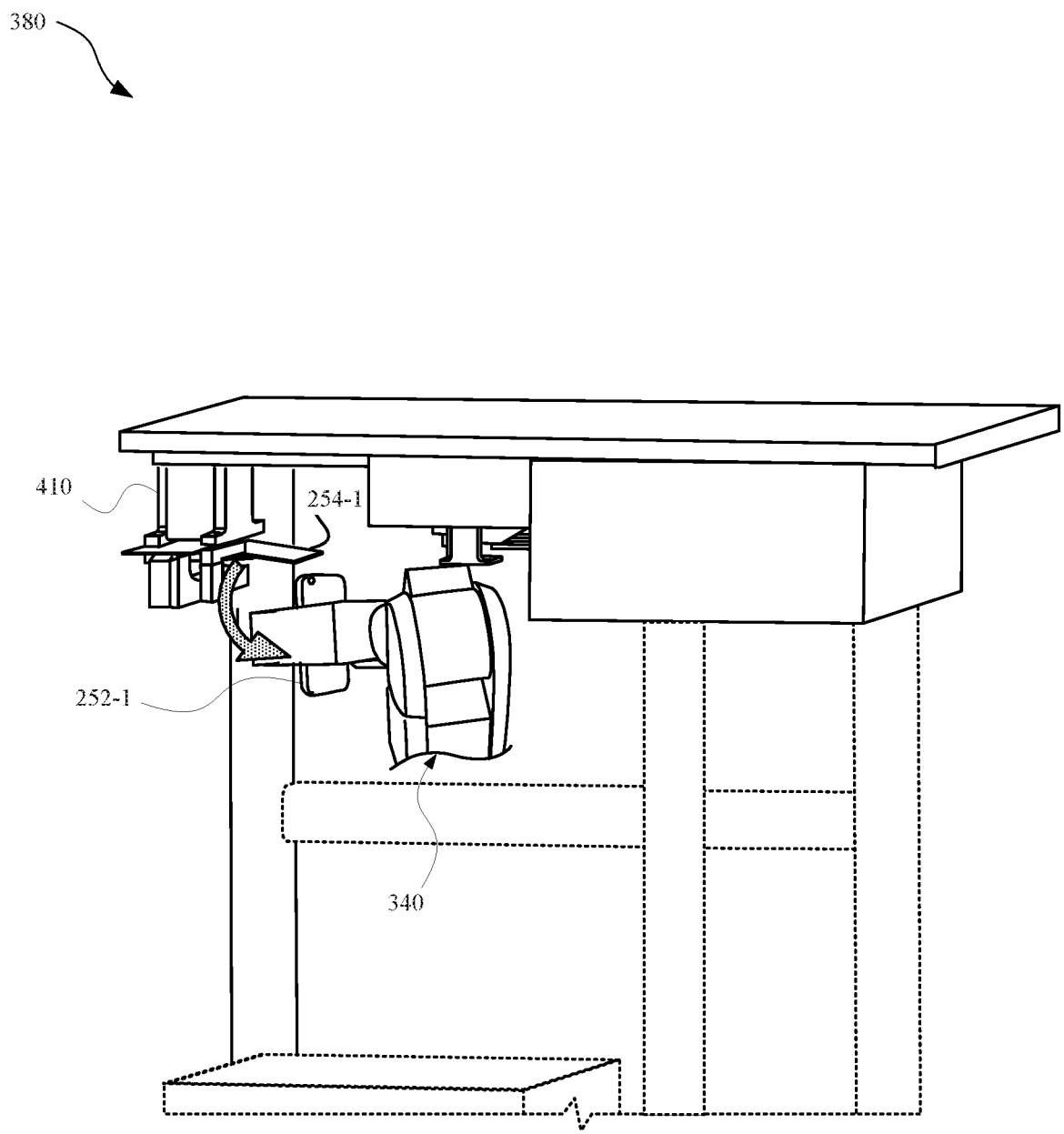

As shown in FIG. 5C, the robot 340 then operates to separate the display assembly 254-1 from the housing 252-1 of the portable electronic device 250-1. The robot 340 rotates the housing 252-1 away from the wedge component, such that the display assembly 254-1 is rotated away from the housing 252-1 to an orientation that is approximately perpendicular to a plane of the housing 252-1. The axis of rotation can be approximately parallel to the leading edge of the wedge component of the first disassembly tool 410. Once the housing 252-1 is approximately perpendicular to a plane of the display assembly 254-1, the robot 340 is actuated to remove any connections between the display assembly 254-1 and the housing 252-1, or electronic components carried within a cavity of the housing 252-1 and secured thereto. The broken connections can include flexible connectors that electrically connect the display assembly 254-1 to an electronic component such as a printed circuit board. Once the robot 340 separates the display assembly 254-1 from the housing 252-1, the robot 340 moves the housing 252-1, and any other components secured therein, to the first transfer station 104-1.

Figure 5D:
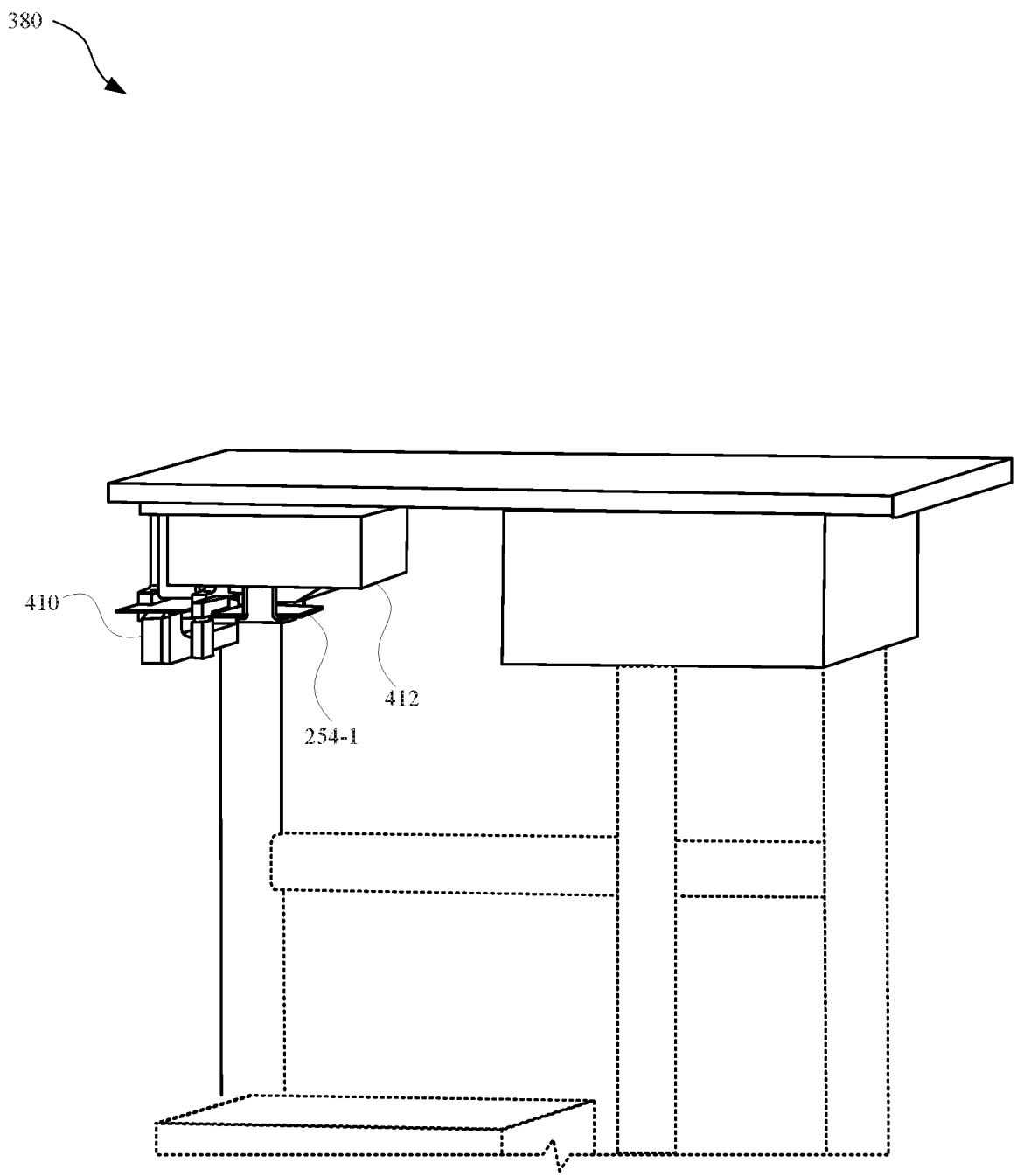

As shown in FIG. 5D, the second disassembly tool 412 moves laterally proximate and adjacent to the first disassembly tool 410. A clamping mechanism included in the second disassembly tool 412 engages the display assembly 254-1 and a button removal component of the second disassembly tool 412 renders the home button inoperable. The clamping mechanism of the first disassembly tool 410 is then released, securing the display assembly in the second disassembly tool 412.

In some embodiments, the second disassembly tool 412 can be moved relative to the base structure 408 of the second disassembly station 380. An actuator (e.g., a linear motor, pneumatic cylinder, etc.) can move the second disassembly tool 412 towards the first disassembly tool 410, which includes a display assembly 254-1 clamped therein. The display assembly 254-1 can be clamped in a manner where the home button is accessible to a button removal component of the second disassembly tool 412. The button removal component is configured to exert force against the finger-print sensor to disable access to any personally identifying information stored in a memory of the finger-print sensor.

In some embodiments, the button removal component is configured to completely remove the home button from the display assembly. The second disassembly tool 412 can then sort the home button separately from the display assembly 254-1. In other embodiments, the button removal component renders the home button inoperable while leaving the home button connected to the display assembly 254-1.

It will be appreciated that the button removal component can be any tool or device capable of rendering any electronic component included in the display assembly 254-1 inoperable. Furthermore, the second disassembly tool 412 is not limited to removing and/or rendering the home button inoperable. The second disassembly tool 412 is configured to remove and or render inoperable other electronic components included in the display assembly 254-1. For example, the second disassembly tool 412 can be configured to remove the front-facing camera, the speaker, and/or the microphone from the display assembly 254-1 in addition to or in lieu of the home button.

The second disassembly tool 412 is configured to remove the home button (or render the home button inoperable) while the display assembly 254-1 is clamped in the first disassembly tool 410. Alternately, the second disassembly tool 412 can include a clamping mechanism that interfaces with one or more exposed surfaces of the display assembly 254-1 as clamped in the first disassembly tool 410. The first disassembly tool 410 then releases the display assembly 254-1 to transfer the display assembly 254-1 to the second disassembly tool 412. In such embodiments, the button removal component can be configured to disable the home button while the display assembly 254-1 is still clamped in the first disassembly tool 410 or after the display assembly 254-1 has been transferred to the second disassembly tool 412.

Figure 5E:
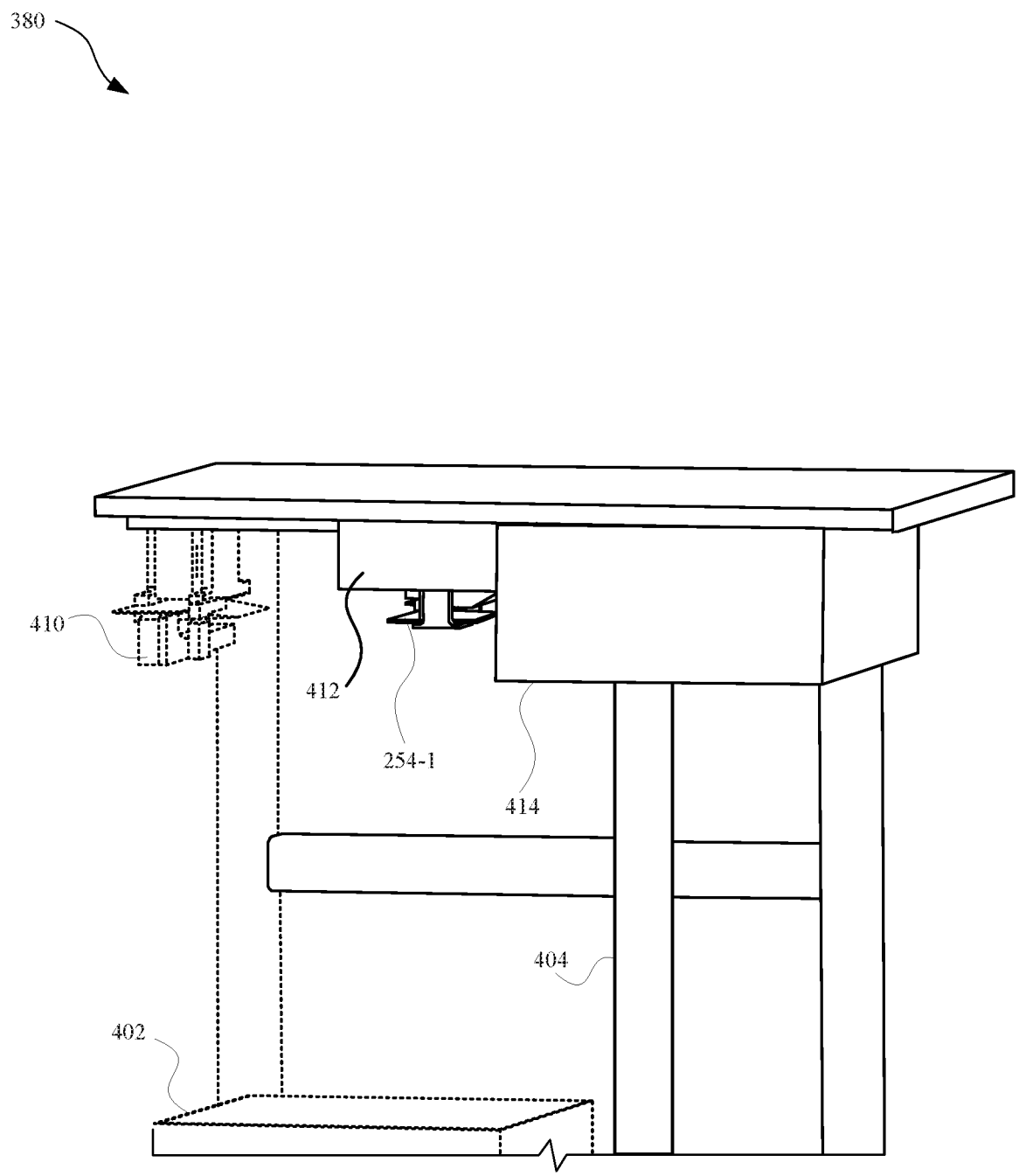

As shown in FIG. 5E, the second disassembly tool 412 then moves laterally proximate to the third disassembly tool 414. The third disassembly tool 414 separates the receiver assembly from the display assembly 254-1 and transfers the receiver assembly in the chute 404. The second disassembly tool 412 then moves the display assembly 254-1 over the hopper 402 and transfers the display assembly into the hopper 402.

In some embodiments, the third disassembly tool 414 removes a receiver assembly that includes the front-facing camera, the speaker, and the microphone from the display assembly. The receiver assembly is attached to the display assembly by a bracket and one or more screws. The third disassembly tool 414 includes a driver component that includes a bit for engaging with a screw head and removing a screw. The second disassembly tool 412 inserts the display assembly into the third disassembly tool 414, moving the display assembly relative to the third disassembly tool 414 to line up the bit with the screw head. In some embodiment, the third disassembly tool 414 includes an optical sensor for detecting the position of the screw relative to the driver component. Once the screw is removed, the display assembly can be moved to one or more additional locations to line up the bit with additional screws so those screws can be removed as well. Once all screws are removed, the bracket can be removed by a suction component or other component designed to secure the now loose bracket and remove it from the display assembly.

The third disassembly tool 414 also includes a clamping component to engage with the receiver assembly to remove the receiver assembly from the display assembly 254-1. The receiver assembly can be connected to one or more other electronic components with a flexible connector that is inserted into a mating interface in the other electronic components. The clamping component can be coupled to an actuator that enables the clamping component to move in one or more directions relative to the display assembly 254-1 in order to engage and/or otherwise remove the receiver assembly from the display assembly 254-1. The relative motion can separate the receiver assembly from other electronic components by pulling the flexible connector away from the electronic components.

Figure 6A:
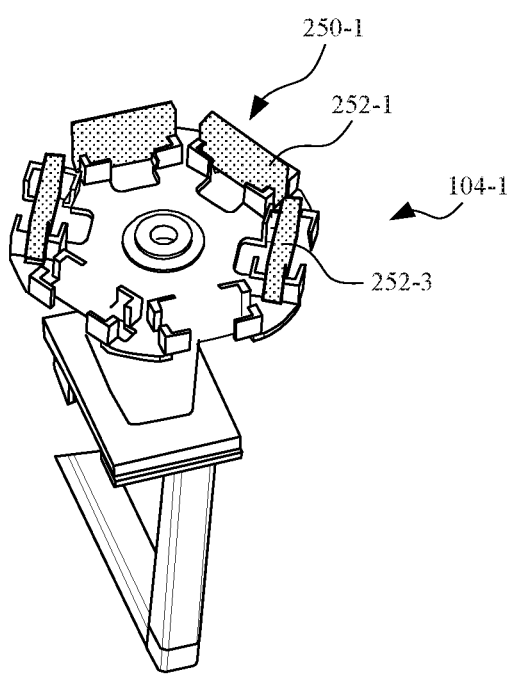
FIGS. 6A-6B illustrate a first transfer station of the first module, in accordance with some embodiments.
Figure 6B:
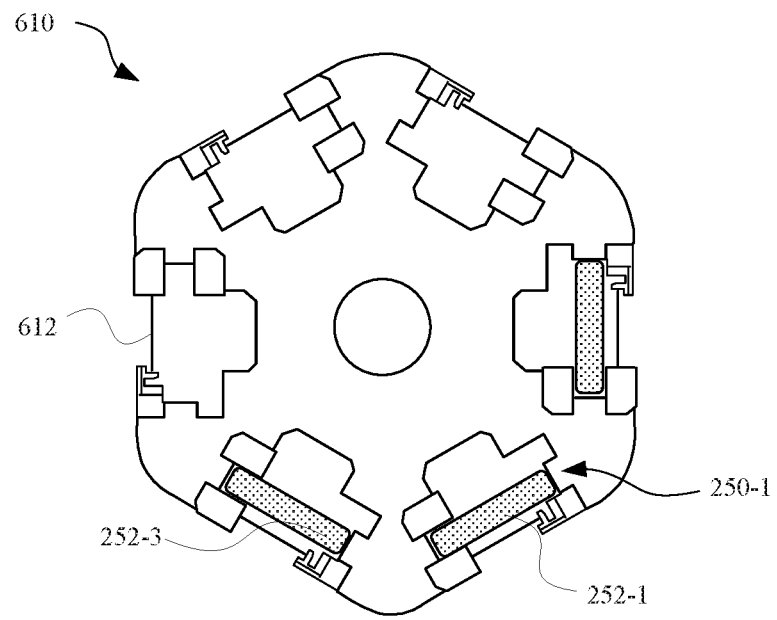

FIGS. 6A-6B illustrate the first transfer station 104-1 of the first module 110, in accordance with some embodiments. Although it should be noted that some aspects of the description of the first transfer station 104-1 can also apply to the second transfer station 104-2 and the third transfer station 104-3. The first transfer station 104-1 operates to transfer a housing 252-1 of the portable electronic device 250-1, along with other components carried therein or secured thereto, to the second module 120 of the modular system 100. The first transfer station 104-1 is proximate the robot 340 such that the robot 340 can place the housing 252-1 into one of the slots in the first transfer station 104-1. As shown in FIG. 6B, the first transfer station 104-1 includes a rotary unit 610.

The rotary unit 610 includes a number of slots 612, spaced around a plate configured to rotate around a central axis that is perpendicular to a floor of the base structure of the first module 110. A motor is configured to index the plate by one slot 612 each time a housing 252-1 is placed in an empty slot 612. As shown in FIG. 6B, the rotary unit 610 includes six slots and, therefore, the plate is indexed by 60 degrees each time a housing 252 is placed in a slot 612. In other embodiments, the rotary unit 610 can include a different number of slots (e.g., 4 slots, 3 slots, etc.). FIG. 6A illustrates that one of the slots 612 includes the housing 252-1 and another housing 252-3.

In some embodiments, an inspection unit is placed proximate the rotary unit 610. The inspection unit is configured to measure a topographical profile of the cavity within the housing 252-1. It will be appreciated that the cavity may include one or more components secured therein, and the inspection unit is configured to check to see that the components are included in the housing 252-1 before transferring the portable electronic device 250-1 to the second module 120. For example, the inspection unit is arranged to confirm that a battery is still included inside the cavity of the housing 252-1.

In some embodiments, the inspection unit uses laser range-finding techniques to measure the profile of the components included within the cavity enclosed within the housing 252. A laser beam is directed toward the housing 252, and a receiving unit included in the inspection unit measures the time it takes for the laser beam to be reflected back to the receiving unit. The time can be converted to a distance. By scanning the laser beam across a path that intersects the housing 252, topological data for the cavity enclosed within the housing 252 is created.

Figure 7:
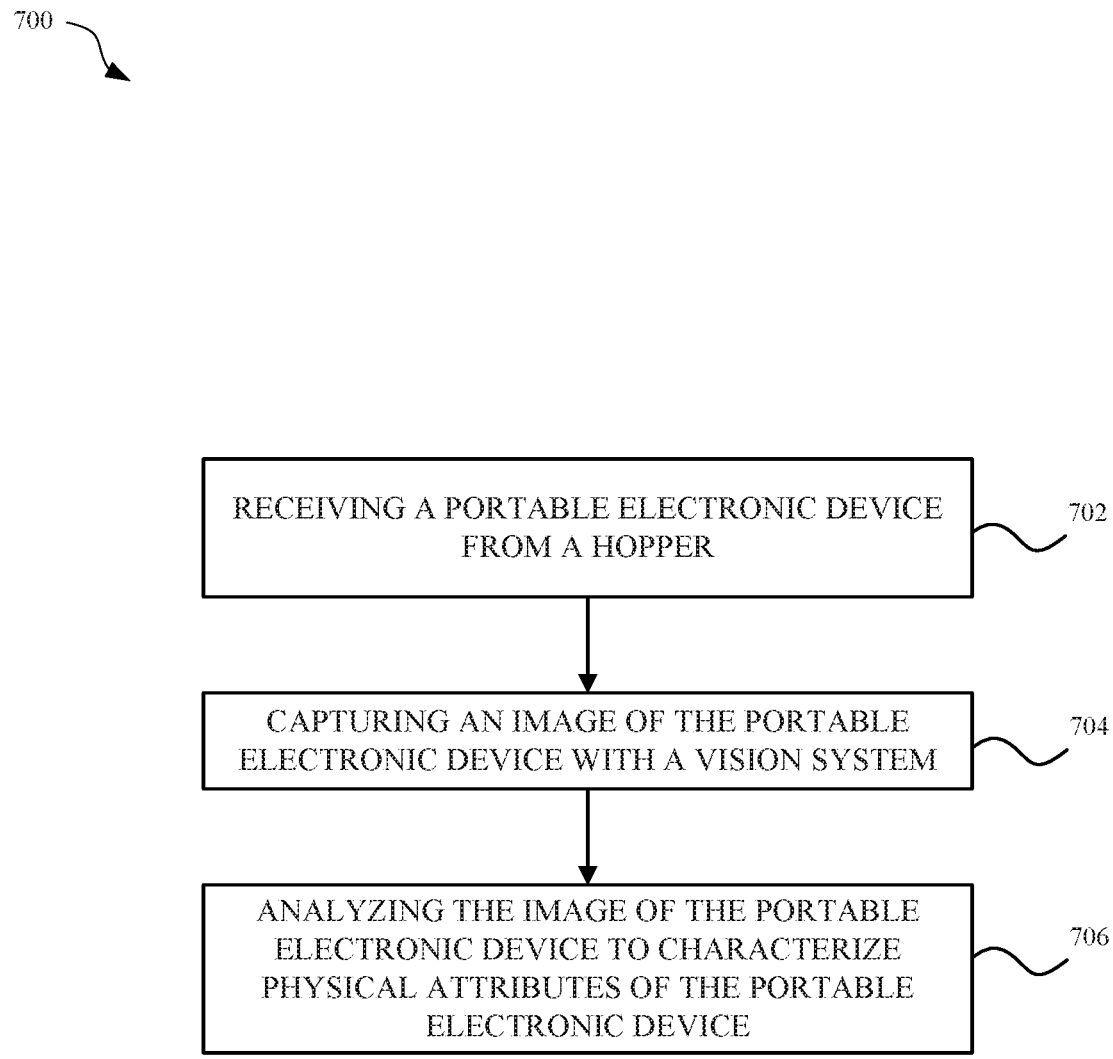
FIG. 7 illustrates a flow diagram of a method for separating a display assembly from a housing of the portable electronic device utilizing the first module, in accordance with some embodiments.

FIG. 7 illustrates a flow diagram of a method for separating a display assembly 254 from a housing 252 of the portable electronic device 250 utilizing the first module 110, in accordance with some embodiments. FIG. 7 illustrates a method 700 carried out by the modular system 100. In some embodiments, the method 700 can be implemented as logic configured to control the operation of each of the different modules of the modular system 100. The logic can include instructions, executed by a controller of the control system, for carrying out one or more disassembly tasks utilizing the modules of the modular system 100.

At step 702, the first module 110 receives a portable electronic device 250 from a hopper of the in-feed unit 106. In some embodiments, an operator loads one or more portable electronic devices 250 into a hopper of a first module 110 in the modular system 100. Each portable electronic device 250 loaded into the hopper is removed by an automatic loading station 310 by being transferred from the hopper to a conveyor. The portable electronic device 250 can be inspected using a vision system.

At step 704, the vision system captures an image of the portable electronic device 250. In some embodiments, the image is captured based on a signal received from the controller. The signal can be responsive to the portable electronic device 250 passing through a laser beam of a motion detector. The image is transmitted from the vision system to the controller.

At step 706, the image is analyzed to characterize physical attributes of the portable electronic device 250. In some embodiments, the image is processed according to an edge detection algorithm in order to locate the edges various structures of the portable electronic device 250. The edges can be used to calculate dimensions associated with the portable electronic device 250, such as by measuring a number of pixels between two edges and converting the number of pixels to a unit of length (e.g., inches, millimeters, etc.).

It will be appreciated that the methods described with reference to FIG. 7 may include additional steps for performing additional disassembly tasks. Alternatively, in some embodiments, some steps in the methods described herein can be omitted or performed in a different order.

Second Module (Also Referred to as "a Battery Removal Module")

Figure 8A:
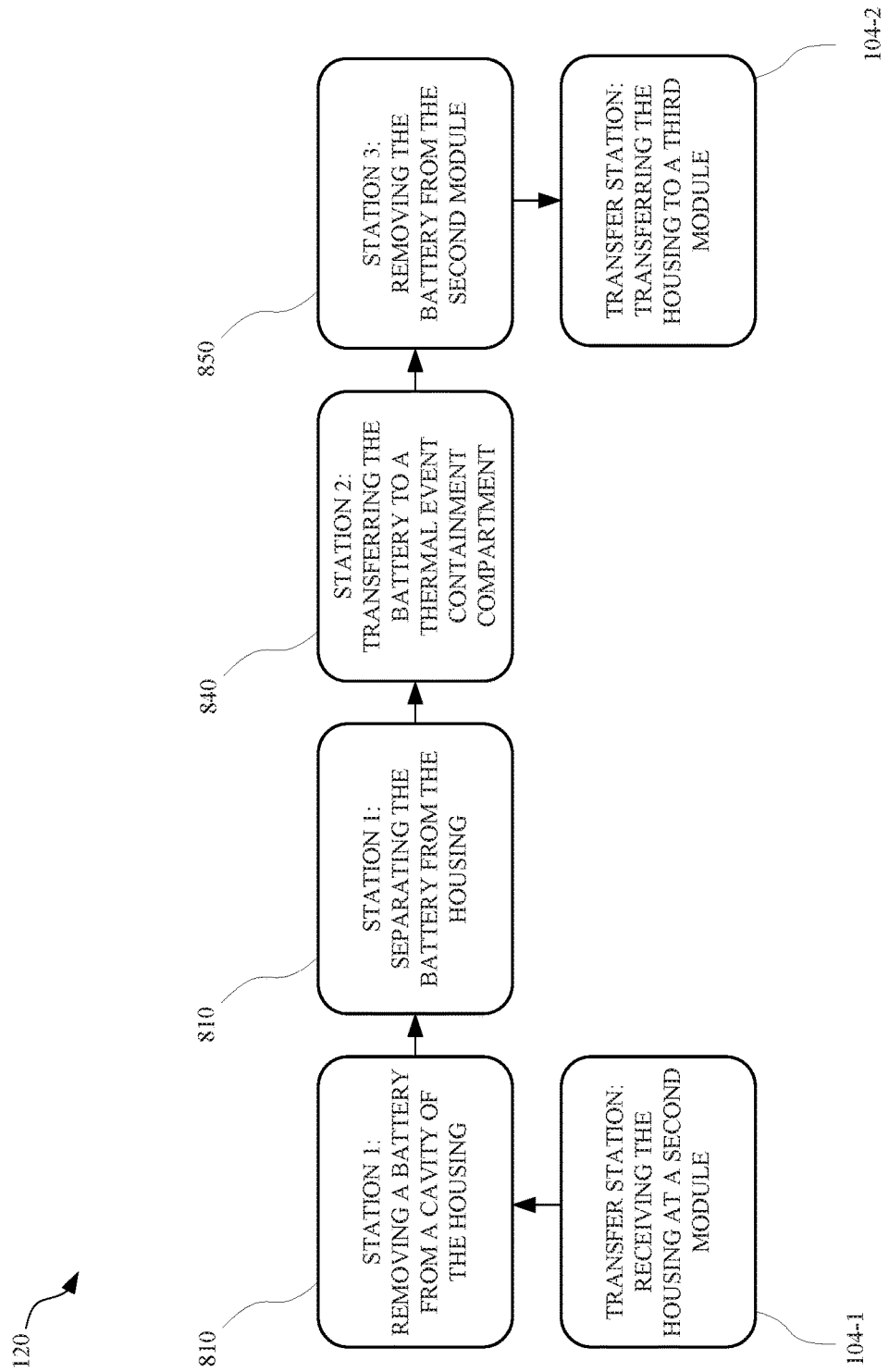
FIG. 8A illustrates a system diagram of a second module for disassembling portable electronic devices, in accordance with some embodiments.

FIG. 8A illustrates a system diagram of a second module for disassembling portable electronic devices, in accordance with some embodiments. As shown in FIG. 8A, the second module 120 includes a number of station that are arranged to perform dedicated functions for disassembling a large-scale of portable electronic devices. The second module 120 can receive portable electronic devices from the first transfer station 104-1. The second module 120 can include an electronic component removal station 810 that is capable of removing a battery from a cavity of the housing of the portable electronic device. Thereafter, the electronic component removal station 810 separates the battery from the housing.

Subsequently, a conveyor transport unit 840 is capable of receiving the battery from the electronic component removal station 810, and transferring the battery to a thermal event containment compartment. Thereafter, the conveyor transport unit 840 moves the battery to a removal station 850 so that the battery can be removed from the second module 120. Thereafter, a transfer station 104-2 transfers the housing from the second module 120 to a third module 130.

Figure 8B:
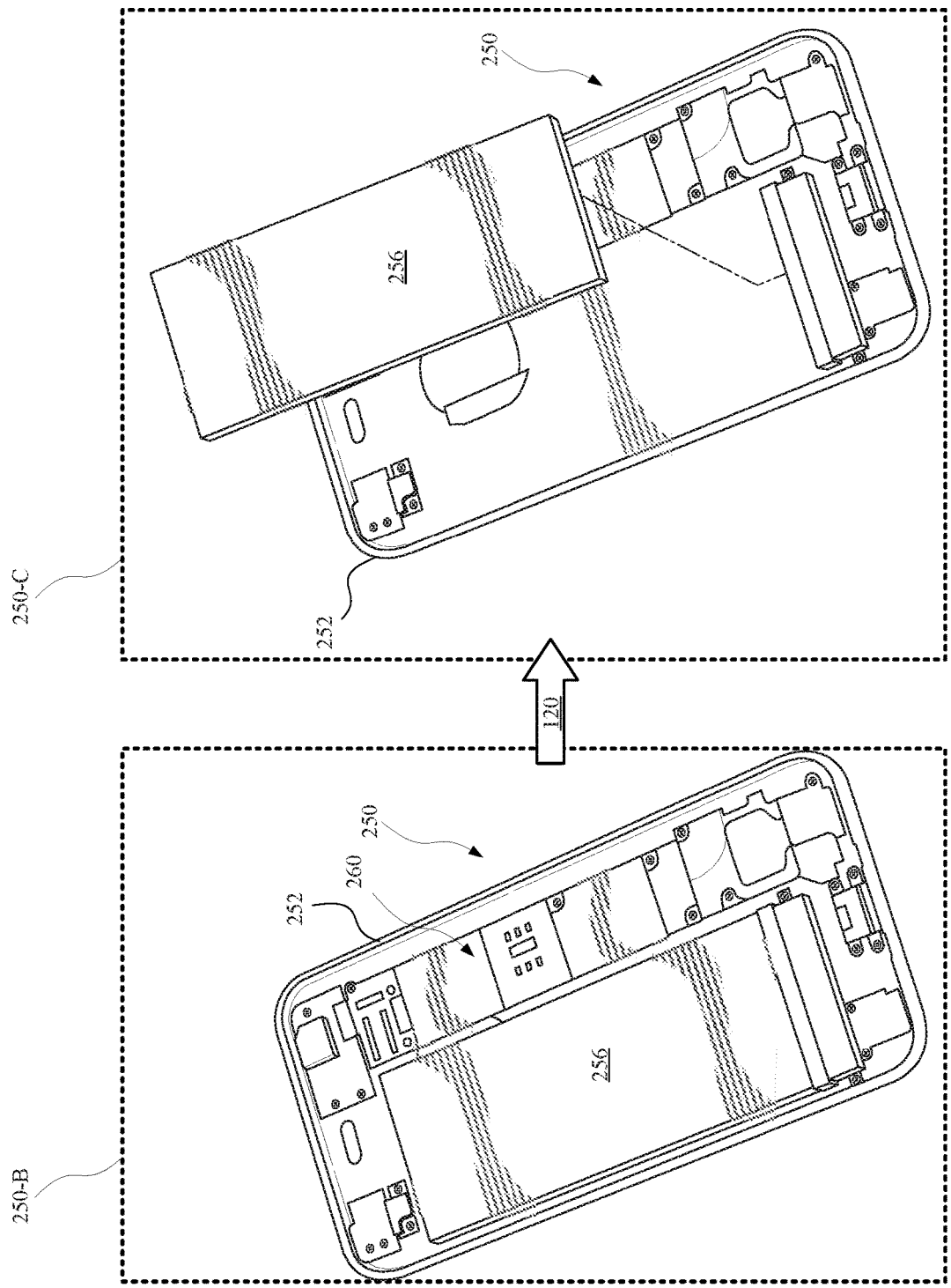
FIG. 8B illustrates an exploded view of a portable electronic device that is disassembled by the second module, in accordance with some embodiments.

FIG. 8B illustrates an exploded view of the exemplary portable electronic device 250 subsequent to being disassembled by the second module 120, in accordance with some embodiments. FIG. 8B illustrates a second state 250-B of the portable electronic device 250, which corresponds to a state of the portable electronic device 250 subsequent to being processed by the first module 110. In particular, during the second state 250-B, the display assembly 254 is separated from the housing 252. FIG. 8B illustrates a third state 250-C of the portable electronic device 250 subsequent to the portable electronic device 250 being processed by the second module 120. In particular, during the third state 250-C, an electronic component 256 (or battery) is removed and separated from a cavity of the housing 252.

Figure 8C:
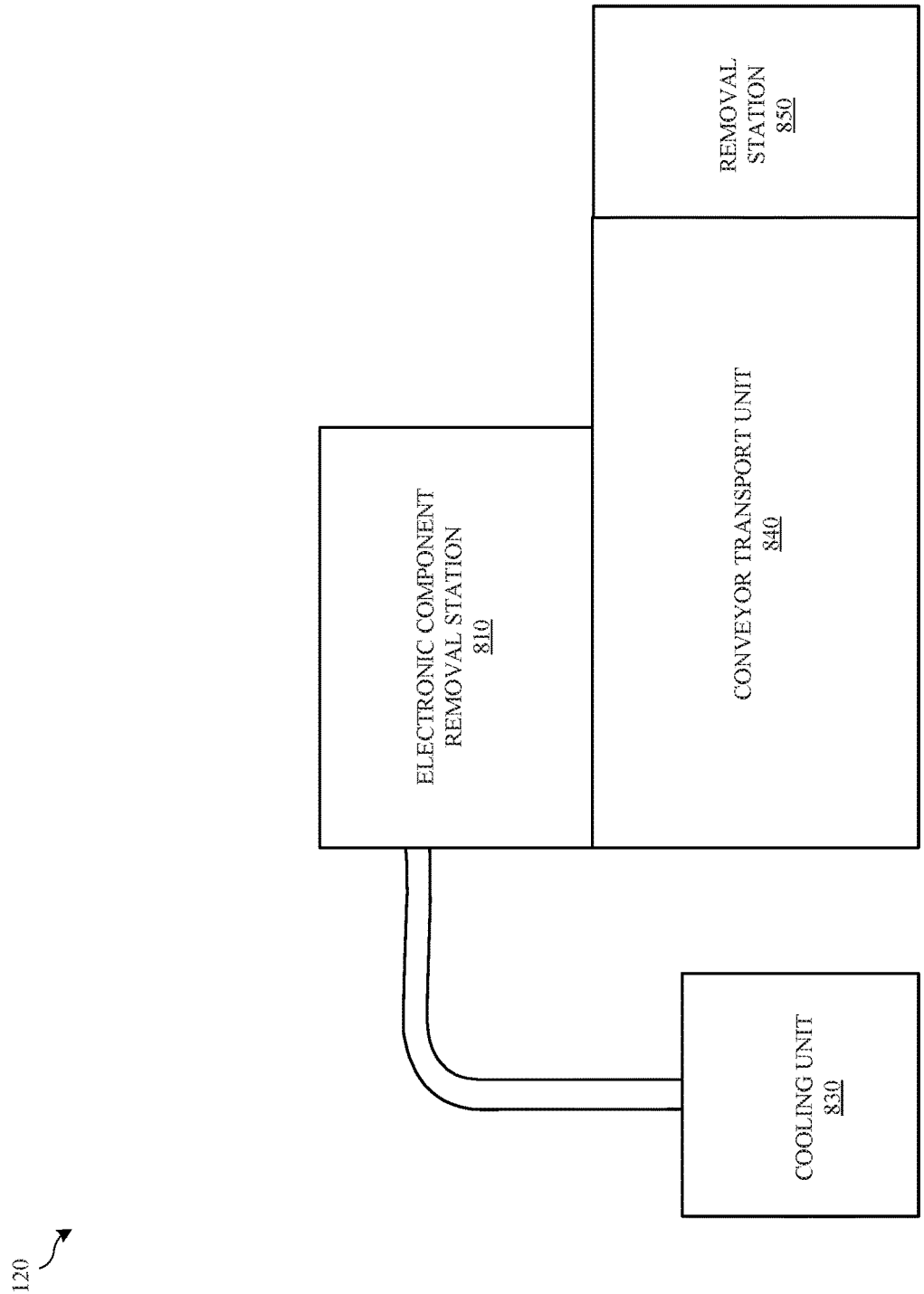
FIGS. 8C-8D illustrate various views of a second module 120 for removing an electronic component that is carried within a cavity defined by a housing of a portable electronic device, in accordance with some embodiments.
Figure 8D:
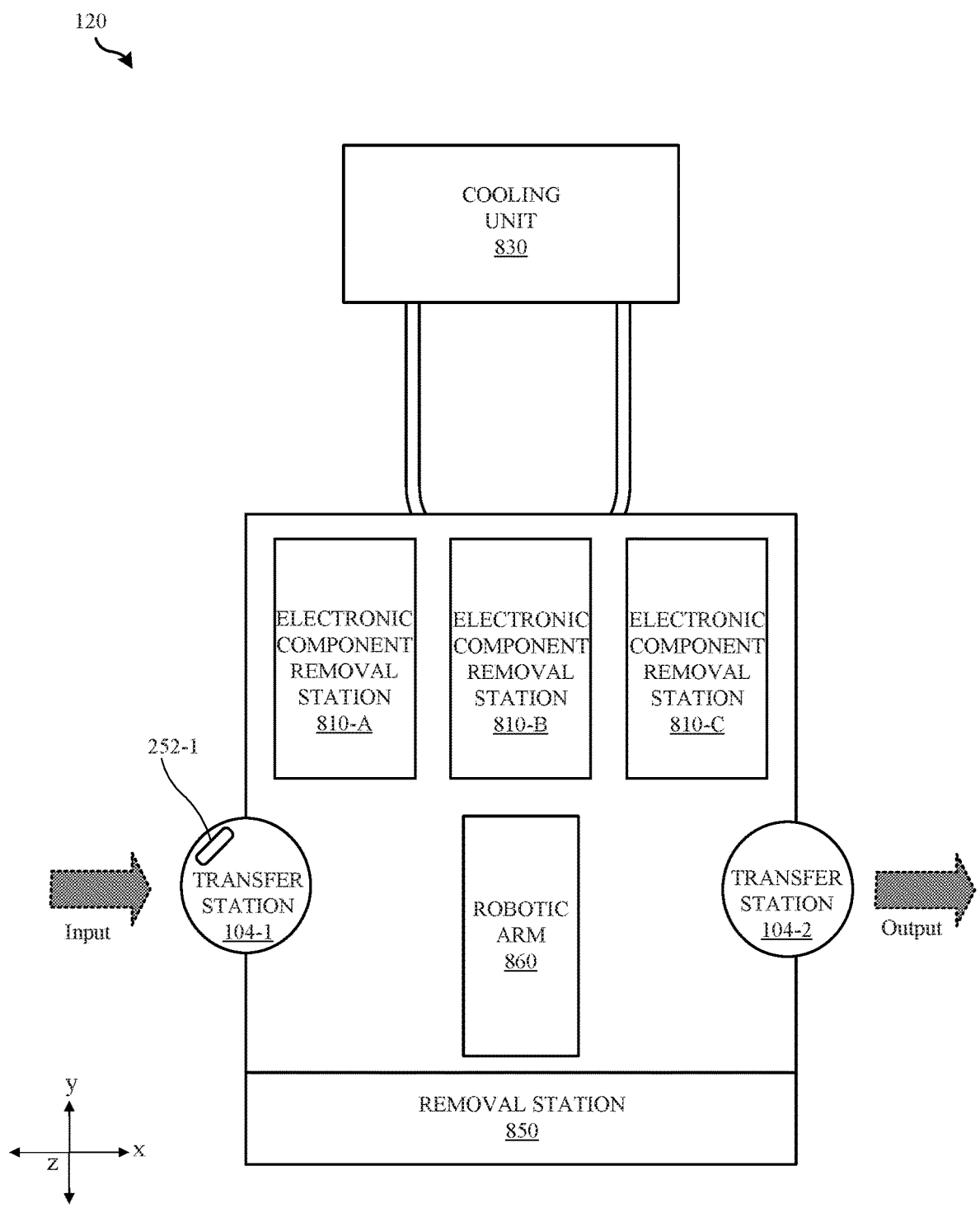

FIGS. 8C-8D illustrate various views of a second module 120 for removing an electronic component that is carried within a cavity defined by a housing of a portable electronic device—e.g., the portable electronic device 250, in accordance with some embodiments. The second module 120 is configured to remove the at least one electronic component subsequent to separating a display assembly 254 from the housing 252 of the portable electronic device 250, as previously described herein.

FIG. 8C illustrates a side view of the second module 120 that is configured to remove at least one electronic component that is carried by the housing 252 of the portable electronic device 250. According to some examples, the at least one electronic component can refer to a battery, a power supply, a processor, an electronic circuit, an antenna, and the like. Additionally, the at least one electronic component is secured to the housing and/or an operational component of the portable electronic device 250 by at least one bonding agent. Furthermore, in some examples, the at least one electronic component is capable of generating heat, such as by increasing a temperature of the at least one electronic component.

According to some embodiments, the second module 120 can include an electronic component removal station 810 that is capable of processing the housing 252 of the portable electronic device 250 so as to remove the electronic component from within the cavity of the housing 252, as will be described in greater detail with reference to FIGS. 10A-10E. In some embodiments, the second module 120 can include a peripheral frame that establishes an operating environment. In particular, the frame can carry and support at least one of a barrier, a wall, or a glass that defines the operating environment. In some examples, the operating environment is characterized as having a regulated pressure environment by using a feedback control mechanism. In particular, the operating environment is characterized as having a negative pressure. Beneficially, the negative pressure can ensure that any fumes or smoke caused by removal of the electronic component does not escape the operating environment and exit into an environment external to the second module 120.

According to some embodiments, the second module 120 is connected to a cooling unit 830 that is capable of cooling the housing 252 and/or the portable electronic device 250. In particular, the cooling unit 830 can provide a coolant, in the form of a liquid or a gas, to the electronic component removal station 810 via pipes. The second module 120 can include any number of the cooling unit 830 as needed to sufficiently cool the housing 252 and/or the portable electronic device 250. In some embodiments, a controller is capable of controlling at least one of a cooling temperature, flow rate, coolant mixture, and the like that is provided to the electronic component removal station 810. In some embodiments, the cooling unit 830 is a part of the second module 120.

According to some embodiments, the second module 120 can include a conveyor transport unit 840 that is capable of receiving the at least one electronic component that has been separated from a corresponding housing 252 subsequent to being processed by the electronic component removal station 810, and capable of transporting the electronic component to a removal station 850, where the electronic component can be removed from the second module 120 via an unload door. The transport unit 840 and the component removal station 850 will be described in greater detail with reference to FIGS. 12A-12D.

FIG. 8D illustrates a top view of the second module 120. As illustrated in FIG. 8D, a robotic arm 860 is capable of transferring the housing 252-1 of the portable electronic device 250-1 between the first transfer station 104-1, the second transfer station 104-2, and the electronic component removal station 810. The first transfer station 104-1 can include one or more slots, where each of the one slots are arranged to receive and retain the housing 252-1. In particular, the first transfer station 104-1 rotates about a rotation axis subsequent to the housing 252-1 being received so as to position the housing 252-1 closer to the robotic arm 860. FIG. 8D illustrates an X-Y-Z reference frame, where the first transfer station 104-1 rotates the slots in the X-Y plane and parallel to the Z-axis. The robotic arm 860 is configured to pick the housing 252-1 from the slot and place the housing 252-1 at the electronic component removal station 810.

According to some embodiments, subsequent to the electronic component having been removed from the housing 252-1 at the electronic component removal station 810, the robotic arm 860 is configured to transfer the housing to the second transfer station 104-2. FIG. 8D illustrates an X-Y-Z reference frame, where the second transfer station 104-2 rotates the slots about a rotation axis in the X-Y plane and parallel to the Z-axis.

According to some embodiments, the second module 120 can include multiple electronic component removal stations 810 that are each capable of independently processing and removing the electronic component from the housing. FIG. 8D illustrates three electronic component removal stations 810-A-810-C that are each capable of receiving cooled liquid/gas from the cooling unit 830. Beneficially, in this manner, the second module 120 is configured to concurrently remove electronic components, thereby increasing processing efficiency.

According to some embodiments, the second module 120 can include a robotic arm 860 that is capable of transferring the housing 252 for the portable electronic device 250 from the first transfer station 104-1 to the electronic component removal station 810. It will be appreciated that first transfer station 104-1 can be omitted in instances where a transfer station is provided in an adjacent module—e.g., the first module 110. In some examples, the robotic arm 860 is mounted to the frame. In other examples, the robotic arm 860 is mounted to a linear slide axis, which is capable of providing the robotic arm 860 with an additional axis of movement. According to some examples, the housing 252 that is retained at the first transfer station 104-1 is unprocessed, which is to mean that the electronic component remains carried by the housing 252 within a cavity of the portable electronic device 250. Subsequent to the housing 252 having been processed by the electronic component removal station 810, the electronic component can be separated from the housing 252, and the robotic arm 860 can transfer the processed housing 252 to a second transfer station 104-2. The second transfer station 104-2 can retain the housing 252 until the housing 252 is ready to be processed by a modular system—e.g., the third module 130—as described with reference to FIGS. 15-17.

According to some embodiments, the robotic arm 860 is capable of moving in multiple degrees of freedom. In particular, the robotic arm 860 is referred to as a multi-axis robotic arm, where the robotic arm 860 is configured to rotate or translate according to at least one of an X-axis, a Y-axis, or a Z-axis. Accordingly, the robotic arm 860 can move up to 6 degrees-of-freedom. In some examples, the robotic arm 860 is referred to as an inverted robotic arm. In some examples, the robotic arm 860 is mounted to a linear slide, thereby enabling the robotic arm 860 to translate in multiple directions. In some examples, the robotic arm 860 includes a handler unit having a working tool that is capable of picking the housing 252-1 and placing the housing 252-1 at the electronic component removal station 2110.

According to some embodiments, the second module 120 can include an inspection unit (e.g., optical scanner, etc.) that is configured to determine whether the electronic component is carried within a cavity defined by the housing 252-1 of the portable electronic device 250-1 prior to the robotic arm 860 placing the housing 252-1 at the electronic component removal station 810. If the inspection unit determines that the specific electronic component is present, then the inspection unit can provide a detection signal to the controller, which responds by instructing the robotic arm 860 to place the housing 252-1 at a receiving region of the electronic component removal station 810. Alternatively, if the inspection unit determines that the specific electronic component of interest is not present within the cavity, then the inspection unit can provide a notification signal to the controller, which can respond by instructing the robotic arm 860 to place the housing 252-1 at the second transfer station 104-2; thereby, bypassing the process of removing the electronic component from the housing 252-1 at the electronic component removal station 2110.

Figure 9:
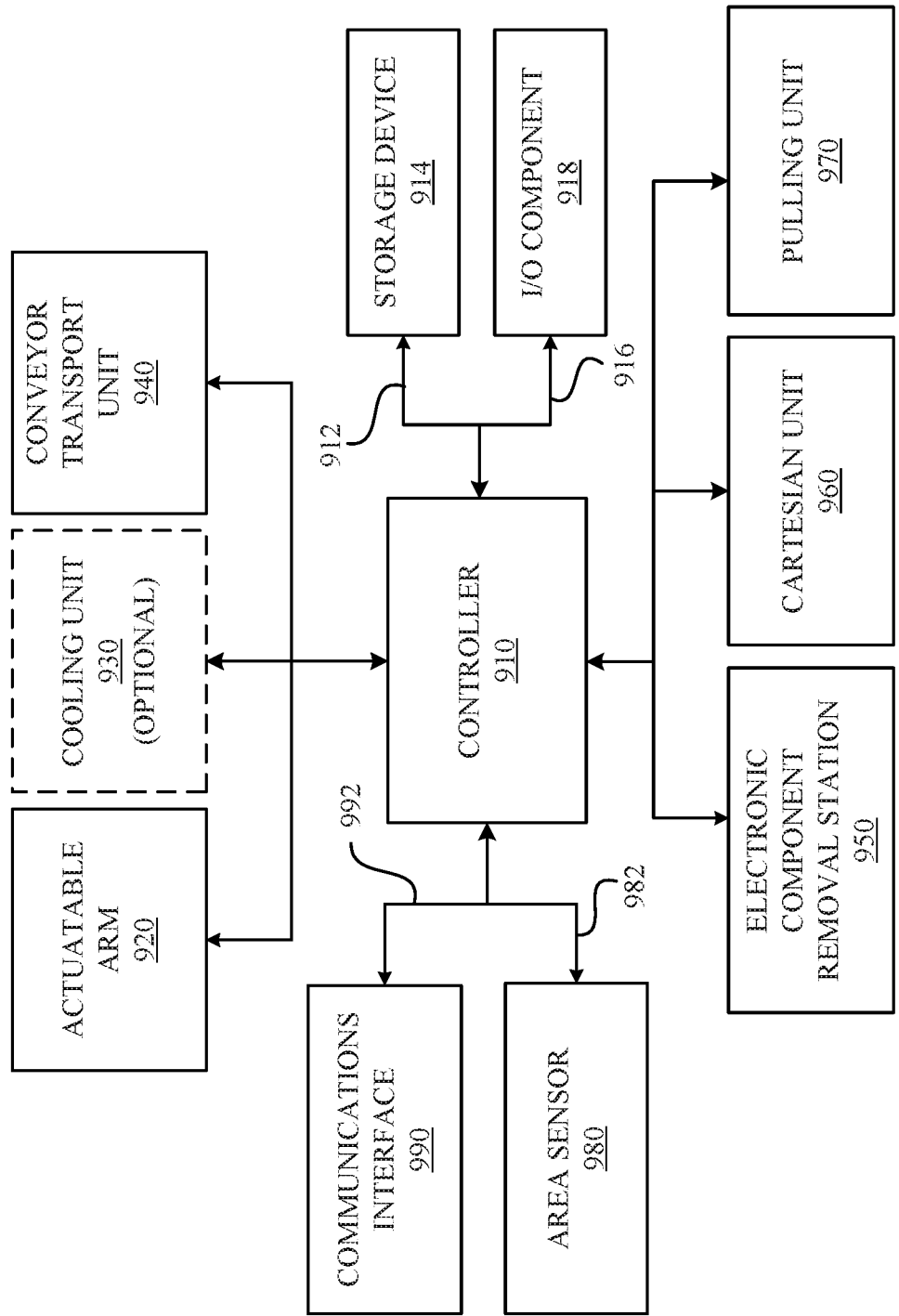
FIG. 9 illustrates a block diagram of the second module that is capable of implementing the various techniques described herein, in accordance with some embodiments.

FIG. 9 is a conceptual block diagram of a portion of a control system for the second module 120 that is capable of implementing the various techniques described herein, in accordance with some embodiments. As illustrated in FIG. 9, the second module 120 can include one or more controllers 910 for executing functions of the second module 120. The one or more controllers 910 can refer to at least one of a central processing unit (CPU) or microcontrollers for performing dedicated functions.

According to some embodiments, the second module 120 can include at least one storage device 914, such as a memory, which can include a single disk or multiple disks (e.g., hard drives), and includes a storage management module that manages one or more partitions within the storage device 914. In some cases, storage device 914 can include flash memory, semiconductor (solid state) memory or the like. The second module 120 can also include a Random Access Memory (RAM) and a Read-Only Memory (ROM). The ROM can store programs, utilities or processes to be executed in a non-volatile manner. The RANI can provide volatile data storage, and stores instructions related to the operation of the second module 120. In some embodiments, the storage device 914 refers to a non-transitory computer readable medium, where an operating system (OS) is established at the storage device 914 that is configured to execute applications or software programs that are stored at the storage device 914. In some embodiments, a data bus 912 can facilitate data transfer between the storage device 914 and the controller 910.

According to some embodiments, the second module 120 can include one or more input/output (I/O) components 918 that enable communication between an operator and the second module 120. In some cases, the I/O component 918 can refer to button or a switch that is capable of being actuated by the operator. In some cases, the I/O component 918 can refer to a soft key that is flexibly programmable to invoke any number of functions. When the I/O component 918 is actuated, the I/O component 918 can cause an electrical signal to be provided to the controller 910 via link 916.

According to some embodiments, the second module 120 can include an area sensor 980 that monitors an environmental condition of the operating environment of the second module 120. In some examples, the area sensor 980 can monitor the operating environment for at least one of a current temperature, presence of certain chemical agents (or toxins) gases, and the like. The area sensor 980 is configured to provide a detection signal to the controller 910 via a link 982 so as to cause the controller 910 to provide a control signal to activate an environmental pressure regulatory system (not illustrated) of the second module 120. In some cases, a feedback loop mechanism is established between the controller 910/storage device 914/area sensor 980 and other units and stations of the second module 120.

According to some embodiments, the second module 120 can include a communications interface 990 that enables the controller 910 to communicate with another controller—e.g., the controller of the first module 110—in at least one of a wired or wireless manner. In some examples, an electrical signal is provided between the controller 910 and the communications interface 990 via a link 992.

According to some embodiments, the controller 910 can control an electronic component removal station 950, such as an actuatable arm 920 that is capable of striking a portion of the housing against a surface of a detachment component, as will be described in greater detail with reference to FIGS. 10A-10E. In particular, the controller 910 can provide a control signal that can cause the actuatable arm 920 to pivot relative to a pivot axis. In some examples, the controller 910 can control at least one of when the actuatable arm 920 is actuated, a speed, and the like. Additionally, the second module 120 can optionally include a cooling unit 930 that is capable of cooling the housing, so as to facilitate the ease by which the electronic component removal station 950 is able to remove the electronic component from within the cavity of the housing. The controller 910 is configured to adjust one or more parameters of the cooling unit 930 to facilitate removal of the electronic component, such as at least one of a temperature, a flow rate, a coolant mixture, and the like.

According to some embodiments, the controller 910 can provide a control signal to a pulling unit 970. As will be described in greater detail herein, the pulling unit 970 is capable of separating the electronic component 256-1 from the housing 252-1; thereby, enabling the electronic component 256-1 to be further processed.

According to some embodiments, the controller 910 can provide a control signal to the conveyor transport unit 940. As will be described in greater detail herein, the conveyor transport unit 940 is configured to receive the electronic component from the electronic component removal station 950, and transport the electronic component to a removal station 950 such that the electronic component can be safely removed from the second module 120.

According to some embodiments, the second module 120 can include a Cartesian unit 960 that is capable of translating the housing 252 between different units/stations of the second module 120. The controller 910 is capable of providing control signals to translate the Cartesian unit 960 according to multiple degrees of freedom.

According to some embodiments, the controller 910 can utilize an inspection unit to determine whether the electronic component is carried within a cavity defined by a housing 252 of the portable electronic device 250. Additionally, the inspection unit can also be configured to determine whether the electronic component has been removed by the electronic component removal station 950, such as by using optical detection to determine if the electronic component has been transferred in a chute, as will be described in greater detail with reference to FIG. 12B. In turn, the inspection unit can provide a detection signal to the controller 910. In response, the controller 910 can provide a control signal to cause the conveyor transport unit 940 to transport the container to the electronic component removal station 950.

FIGS. 10A-10F illustrate various conceptual diagrams of an electronic component removal station 810 capable of removing at least one electronic component from the housing for the portable electronic device, in accordance with some embodiments. This can occur, for example, subsequent to the robotic arm 860 placing the housing—e.g., the housing 252-1 of the portable electronic device 250-1—onto a receiving region of the electronic component removal station 810.

Figure 10A:
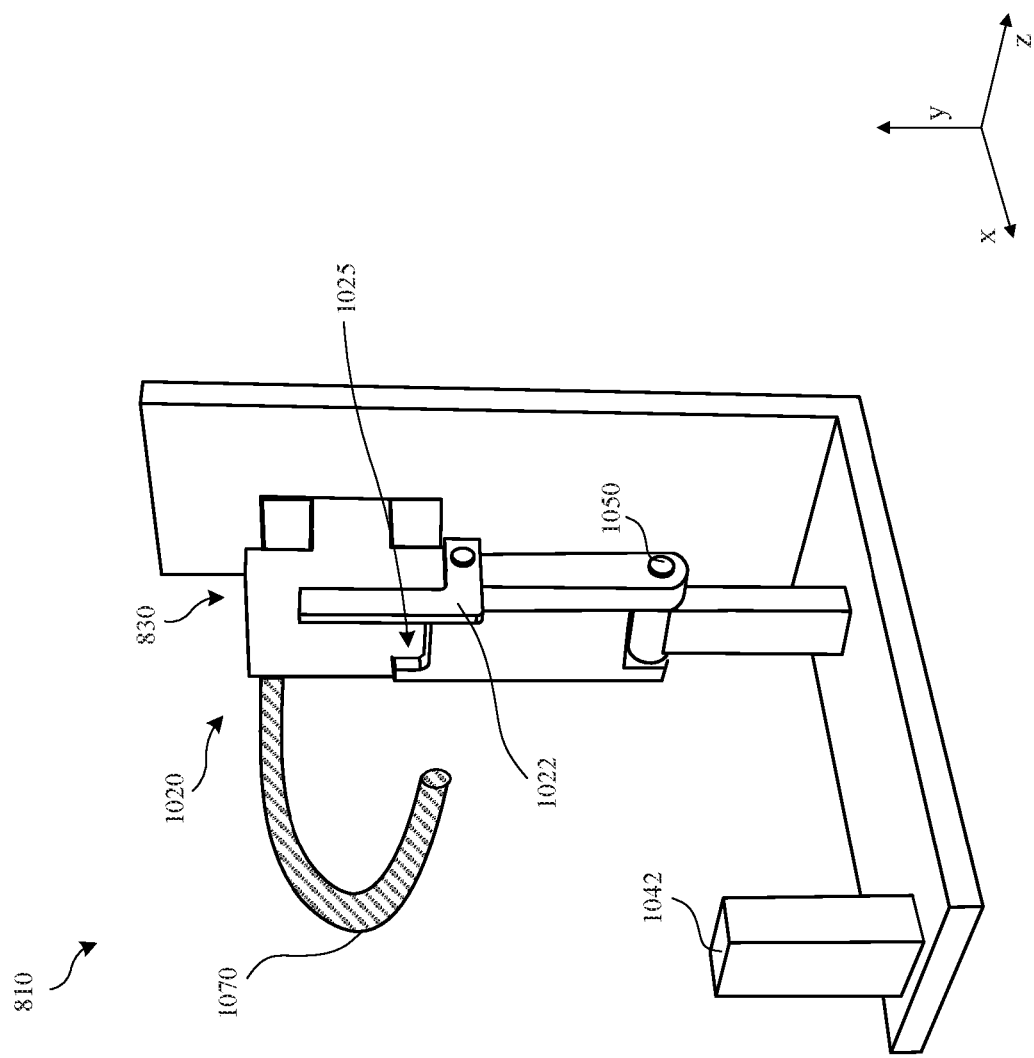

FIG. 10A illustrates a perspective view of a conceptual diagram of the electronic component removal station 810 as described with reference to FIGS. 8C-8D. As illustrated in FIG. 10A, an actuatable arm 1020 (or swing arm) is configured to raise the housing 252-1 of the portable electronic device 250-1 to a cooling unit 830 of the electronic component removal station 810 for the purpose of weakening any bonding agent that secures the electronic component to the housing 252-1 and/or an operational component that is carried by the housing 252-1. Beneficially, weakening the bonding agent can facilitate subsequently removing the electronic component from within the cavity. In some examples, the cooling unit 830 includes one or more vents capable of directly cooling a back surface of the housing 252-1. In turn, the electronic component 256-1 can be cooled by the one or more vents of the cooling unit 830.

FIG. 10A also illustrates an X-Y-Z reference frame, where the actuatable arm 1020 is configured to be oriented in at least one of the X-axis or Y-axis. According to some embodiments, the actuatable arm 1020 can include a retention cavity 1025 that is capable of receiving the housing 252-1 of the portable electronic device 250-1. In some examples, the actuatable arm 1020 is secured to a surface 1052 of the electronic component 256-1. In some examples, the robotic arm 860 is configured to place the housing 252-1 within the retention cavity 1025 while the actuatable arm 1020 is oriented in a horizontal manner (i.e., parallel to the X-axis). The actuatable arm 1020 is configured to be raised in the vertical manner so as to position the housing 252-1/the portable electronic device 250-1 adjacent to the cooling unit 830. In some examples, the actuatable arm 1020 is secured to the housing 252-1 by way of a mechanical retention member, a suction element, or an adhesive.

According to some embodiments, the electronic component 256-1 is capable of being cooled directly with a cooling nozzle 1070 that is connected to the cooling unit 830. The cooling nozzle 1070 is capable of moving in at least one of a lateral direction (i.e., parallel to the X-axis) or in a vertical direction (i.e., parallel to the Y-axis). Beneficially, the cooling nozzle 1070 is capable of cooling the electronic component 256-1 more efficiently than the cooling unit 830.

According to some embodiments, the actuatable arm 1020 is operable by a servo motor and a clutch. The servo motor is configured to raise the actuatable arm 1020 along a pivot axis 1050 (e.g., a hinge, etc.) and lower the actuatable arm 1020 along the pivot axis 1050. The pivot axis 1050 is configured to raise and lower the frame member 1022. In some examples, the actuatable arm 1020 is operated by a pneumatic gas chamber.

FIG. 10B illustrates a perspective view of a conceptual diagram of the electronic component removal station 810. The actuatable arm 1020 raises the electronic component 256-1 and the housing 252-1 adjacent to the cooling unit 830 so that the electronic component 256-1 is stiffened by the coolant provided by the cooling unit 830, and any bonding agent 1054 (see FIG. 8C) that secures the electronic component 256-1 to the housing 252-1 is weakened.

According to some embodiments, the electronic component 256-1 is capable of being cooled directly with the cooling nozzle 1070 that is connected to the cooling unit 830. In some examples, when the actuatable arm 1020 raises the electronic component 256-1 and the housing 252-1 adjacent to the cooling unit 830, the cooling nozzle 1070 is capable of moving in at least one of a lateral direction (i.e., parallel to the X-axis) or in a vertical direction (i.e., parallel to the Y-axis) to be closer to a front surface of the housing 252-1 in order to directly cool the electronic component 256-1. Additionally, in some examples, the cooling nozzle 1070 is capable of moving away from the front surface of the housing 252-1, such as when the actuatable arm 1020 prepares to slam the portion of the housing 252-1 against the surface 1042 of the detachment component 1040, as will be illustrated by FIG. 10D.

In some examples, the electronic component 256-1 is secured to at least one of the housing 252-1 or operational components carried within a cavity defined by the housing 252-1 by the bonding agent 1054, such as an adhesive or a glue. The cooling unit 830 is configured to provide coolant, in the form of a liquid or a gas that can cool and stiffen the bonding agent 1054, thereby weakening the bonding agent 1054. Some examples of the coolant can include liquid nitrogen. Beneficially, weakening the bonding agent 1054 can facilitate removing the bonding agent 1054 and promote ease of removal of the electronic component 256-1 from the cavity. Beneficially, stiffening the electronic component 256-1 can minimize or prevent the electronic component 256-1 from bending when the actuatable arm 1020 forcefully strikes a portion of the housing 252-1 against a surface 1042 of the detachment component 1040, as described in detail with reference to FIG. 10D. Furthermore, stiffening the electronic component 256-1 can prevent the electronic component 256-1 from causing a thermal event, such as if the electronic component 256-1 strikes the surface 1042 of the detachment component 1040 at an impact point.

According to some examples, the cooling unit 830 can cool the electronic component 256-1 and/or the housing 252-1 with a cooled liquid or gas having a temperature between about 70° C.-80° C. for about 25 seconds. In some examples, the cooling unit 830 can cool the electronic component 256-1 and/or the housing 252-1 for between about 5 to about 60 seconds with a temperature that is less than room temperature (i.e., between about 20° C. to about 25° C.). Although it should be noted that the temperature of the cooled liquid or gas is low enough so as to prevent the electronic component 256-1 from spontaneously inducing an unwanted thermal event due to a temperature of the electronic component 256-1 rising above a threshold temperature value.

According to some embodiments, at least one parameter of the cooling unit 830 used for cooling the electronic component 256-1 and/or the housing 252-1, such as the temperature of the cooled liquid or gas, the type of coolant utilized, the cooling time, the cooling frequency, and the like are adjustable by the controller 910.

It should be noted that other techniques may be utilized in substitution or to supplement the techniques described herein to weaken the bonding agent 1054. For example, heat can be applied to the bonding agent 1054 in order to weaken and/or remove the bonding agent 1054. In another example, the bonding agent 1054 is capable of being weakened by being spun at a high rotational speed. In yet another example, the electronic component 256-1 can be pulled from the housing 252-1 with a high amount of force that is sufficient to weaken the adhesion strength of the bonding agent 1054. In yet another example, the housing 252-1 and/or the electronic component 256-1 can be submerged (partially or entirely) within a cold water bath.

FIG. 10C illustrates a partial exploded view of the electronic component removal station 810. In particular, FIG. 10C illustrates the display assembly 254-1 of the portable electronic device 250-1 is removed. Thus, the surface 1052 of the electronic component 256-1 is exposed. Additionally, operational components 260 of the portable electronic device 250-1 are exposed, such as a camera module 260-A, a circuit board 260-B, an antenna 260-C, and a haptic feedback module 260-D. It should be noted, in some examples, the actuatable arm 1020 is configured to secure to surfaces of these operational components (e.g., 260A-260C); thereby, enabling the second module 120 to remove these operational components from within the cavity.

Figure 10D:
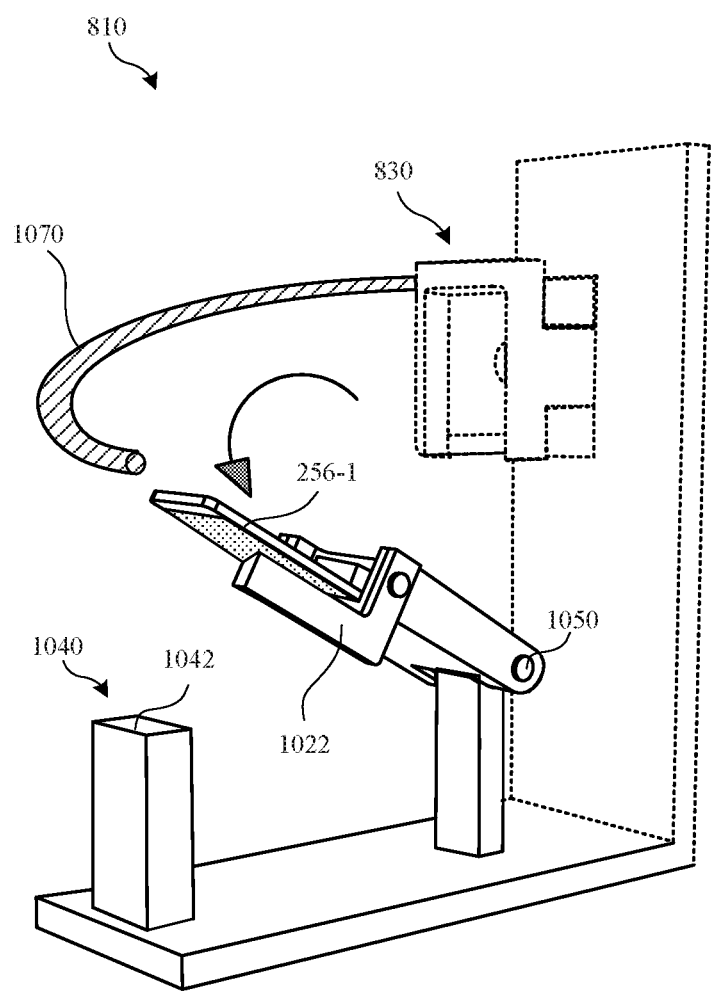

FIG. 10D illustrates a perspective view of a conceptual diagram of the electronic component removal station 810. As illustrated in FIG. 10D, the controller 910 provides a control signal to cause the actuatable arm 1020 and the frame member 1022 to swing away from the cooling unit 830 along the pivot axis 1050 and towards the surface 1042 of the detachment component 1040. In some examples, the controller 910 is configured to receive a notification signal from a sensor associated with the cooling unit 830 that indicates that the electronic component 256-1 has been sufficiently cooled. Indeed, according to some embodiments, the cooling nozzle 1070 is moved, by the controller 910, laterally and/or vertically away from the housing 252-1 and/or the electronic component 256-1 in order to facilitate the controller 910 to cause the actuatable arm 1020 to swing unimpeded towards the surface 1042 of the detachment component 1040.

In some embodiments, the controller 910 provides a control signal that engages the clutch at the servo motor causing the actuatable arm 1020 to swing forcefully towards the surface 1042 of the detachment component 1040. In particular, the servo motor spins up, and when the clutch engages the servo motor causes the actuatable arm 1020 to be forcefully swung. It should be noted that although the actuatable arm 1020 is swung with a large amount of force, the momentum associated with only swinging the actuatable arm 1020 may not be sufficient to weaken the bonding agent 1054. Instead, as will be described in greater detail with reference to FIG. 10E, the impact of the portion of the housing 252-1 striking the surface 1042 of the detachment component 1040 causes the electronic component 256-1 to be forcefully removed from the cavity.

Figure 10E:
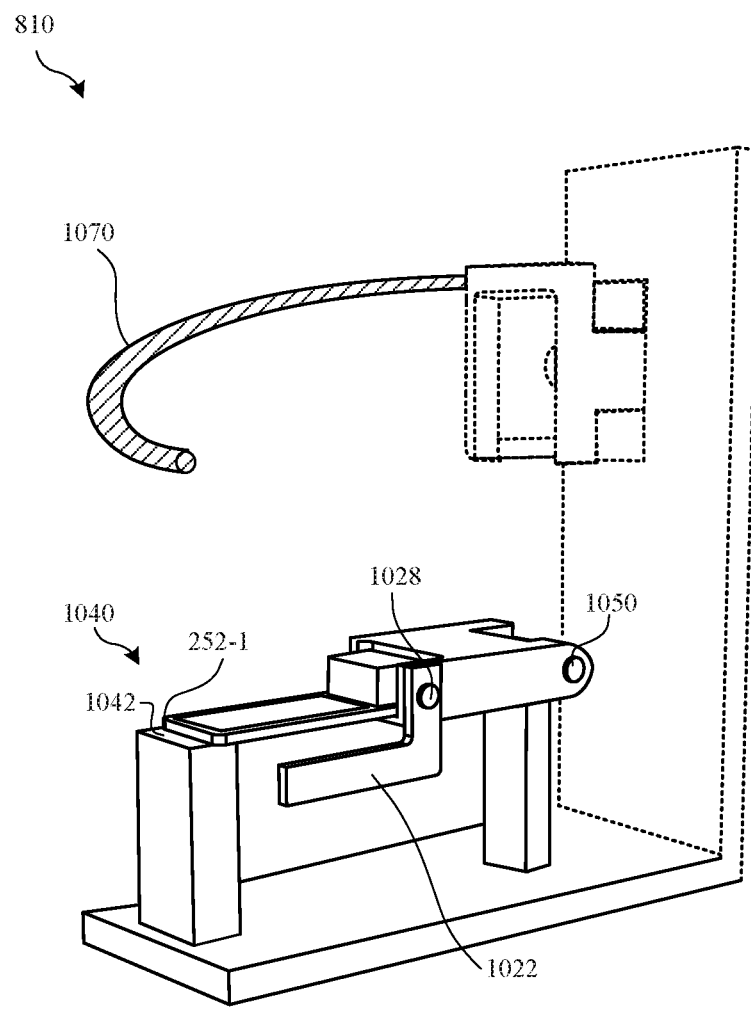

FIG. 10E illustrates a perspective view of a conceptual diagram of the electronic component removal station 810. As illustrated in FIG. 10E, the controller 910 can provide a control signal to cause the actuatable arm 1020 to swing away from the cooling unit 830 such that a portion of the housing 252-1 forcefully strikes the surface 1042 of the detachment component 1040. In particular, when the portion of the housing 252-1 strikes the surface 1042, the surface 1042 can abruptly stop the momentum of the housing 252-1 swinging with the actuatable arm 1020.

Figure 10F:
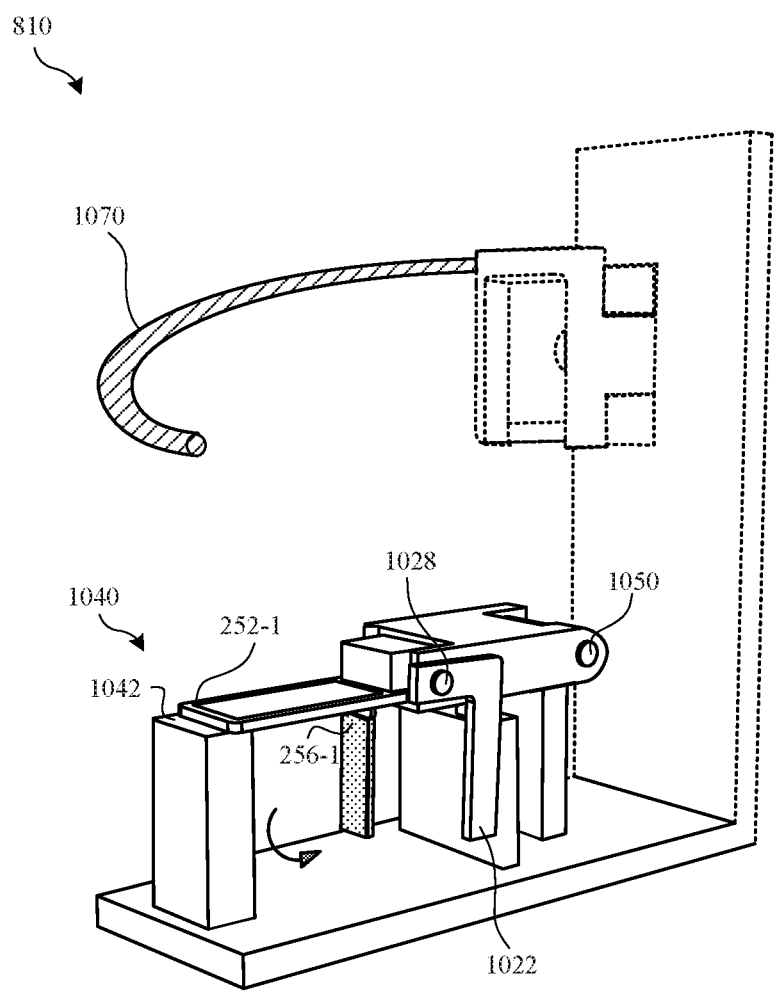

FIG. 10F illustrates a perspective view of a conceptual diagram of the electronic component removal station 810. As illustrated in FIG. 10F, the momentum of the frame member 1022 carries the electronic component 256-1 to swing past the surface 1042. For example, the electronic component 256-1 can remain adhered to the housing 252-1 and/or operational component of the portable electronic device 250-1 by a bonding agent 1054. However, the bonding agent 1054 is significantly weakened as a result of striking the portion of the housing 252-1 against the surface 1042. While the portion of the housing 252-1 remains resting against the surface 1042, the momentum carries the electronic component 256-1 away from the cavity defined by the housing 252-1. As illustrated in FIG. 10F, the frame member 1022 is further rotated along the pivot axis 1050.

It should be noted that in some examples, the impact between the portion of the housing 252-1 and the surface 1042 is sufficient to cause the electronic component 256-1 to be forcefully removed from within the cavity of the housing 252-1. In particular, the impact of the portion of the housing 252-1 at the surface 1042 can be greater than (i.e., overcome) an attachment force associated with the bonding agent 1054 that attaches the electronic component 256-1 to the housing 252-1. In some examples, the electronic component 256-1 can remain connected to the housing 252-1 via one or more cables or connectors, and the like. Although in other examples, the force alone associated with the portion of the housing 252-1 striking the surface 1042 can cause the electronic component 256-1 to become physically separated from the housing 252-1.

FIG. 10F illustrates that the electronic component 256-1 remains connected to a part of the housing 252-1. Beneficially, this enables the second module 120 to maintain control and awareness of the location of the electronic component 256-1. As will be described in greater detail with reference to FIG. 10F, the second module 120 can verify that the electronic component 256-1 is removed from the cavity of the housing 252-1 but remains secured to the housing 252-1 by an optical scanning system.

Figure 11A:
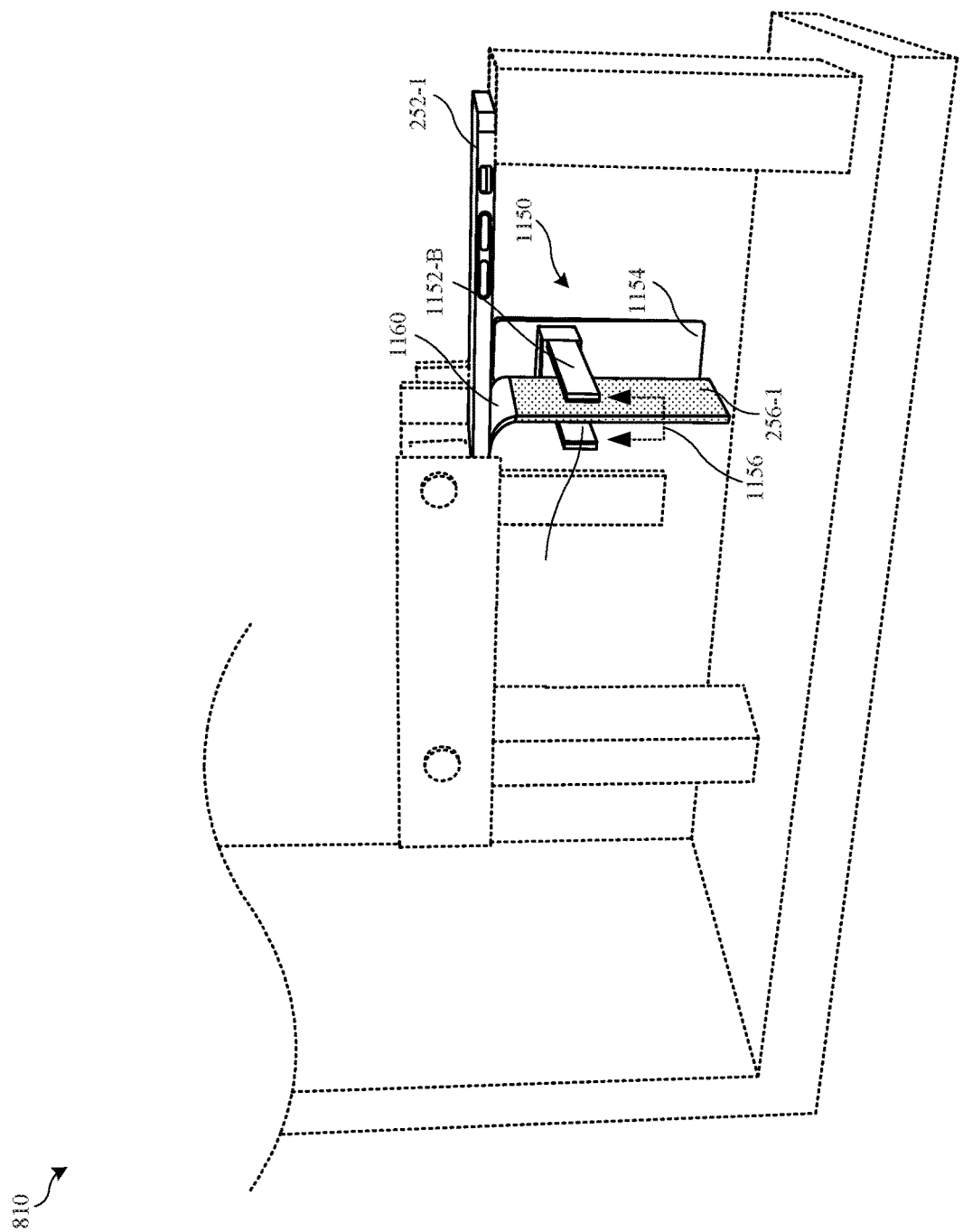
FIGS. 11A-11B illustrate perspective views of conceptual diagrams of the second module, in accordance with some embodiments.

FIG. 11A illustrates a perspective view of a conceptual diagram of the second module 120, in accordance with some embodiments. In particular, FIG. 11A illustrates a pulling unit 1150—e.g., the pulling unit 970—that is capable of separating the electronic component 256-1 from the housing 252-1; thereby, enabling the electronic component 256-1 to be further processed separately from the housing 252-1. This can occur, subsequent to the electronic component 256-1 being removed from the cavity of the housing 252-1.

According to some embodiments, the pulling unit 1150 includes a set of pulling plates 1152-A-1152-B that are capable of applying pressure against different surfaces (e.g., the surface 1052 and an opposing surface, etc.) of the electronic component 256-1 such that a size of the receiving region 1156 corresponds to a width of the electronic component 256-1.

As illustrated in FIG. 11A, the pulling unit 1150 is positioned below the electronic component removal station 810. The pulling unit 1150 can include a set of pulling plates 1152-A-1152-B that are diametrically opposed from each other or parallel to each other. The set of pulling plates 1152-A-1152-B can define a receiving region 1156, where a size of the receiving region 1156 is adjustable so as to accommodate for different widths and geometry of the electronic component 256-1.

Figure 11B:
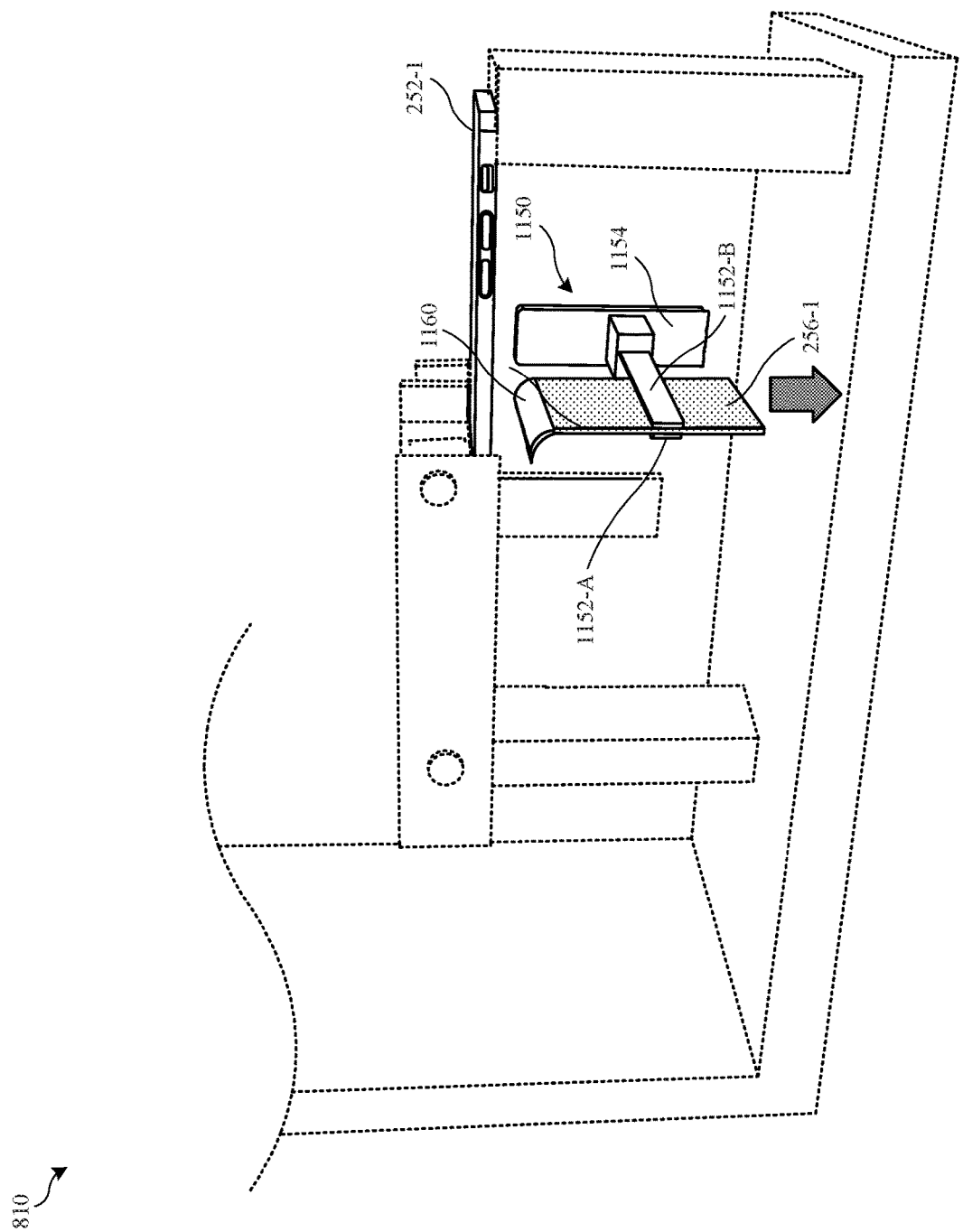

FIG. 11B illustrates a perspective view of a conceptual diagram of the second module 120, in accordance with some embodiments. The controller 910 is configured to provide a control signal to the pulling unit 1150 to cause the set of pulling plates 1152-A-1152-B to pull the electronic component 256-1 in a downwards pulling motion from the housing 252-1. It should be noted that set of pulling plates 1152-A-1152-B pull the electronic component 256-1 quickly and with sufficient force so as to tear a connector 1160 and/or bonding agent 1054 that attaches the electronic component 256-1 to the housing 252 and/or the operational component. It should be further noted that if the set of pulling plates 1152-A-1152-B instead pull the electronic component 256-1 slowly, it may merely stretch the bonding agent 1054. This may be undesirable in that it merely stretches the bonding agent 1054 while leaving the electronic component 256-1 still attached to the housing 252-1. Upon successfully removing the connector 1160 and/or bonding agent 1054, the set of pulling plates 1152-A-1152-B can maintain the grip against the surfaces of the electronic component 256-1 and then transfer the electronic component 256-1 to a chute.

Subsequent to pulling the electronic component 256-1 away from the housing 252-1, the electronic component 256-1 can be transitioned to a chute. The chute includes a sensor capable of determining whether the electronic component 256-1 is within the chute and providing a corresponding signal to the controller 910. In some examples, the chute is lined with a non-electrically conductive material so as to prevent shorting of the electronic component 256-1 that comes into contact with a surface of the chute.

FIGS. 12A-12D illustrate various perspective views of the second module 120 for processing the at least one electronic component—e.g., the electronic component 256-1—for example, subsequent to separating the electronic component 256-1 from the housing 252-1 of the portable electronic device 250-1, in accordance with some embodiments.

Figure 12A:
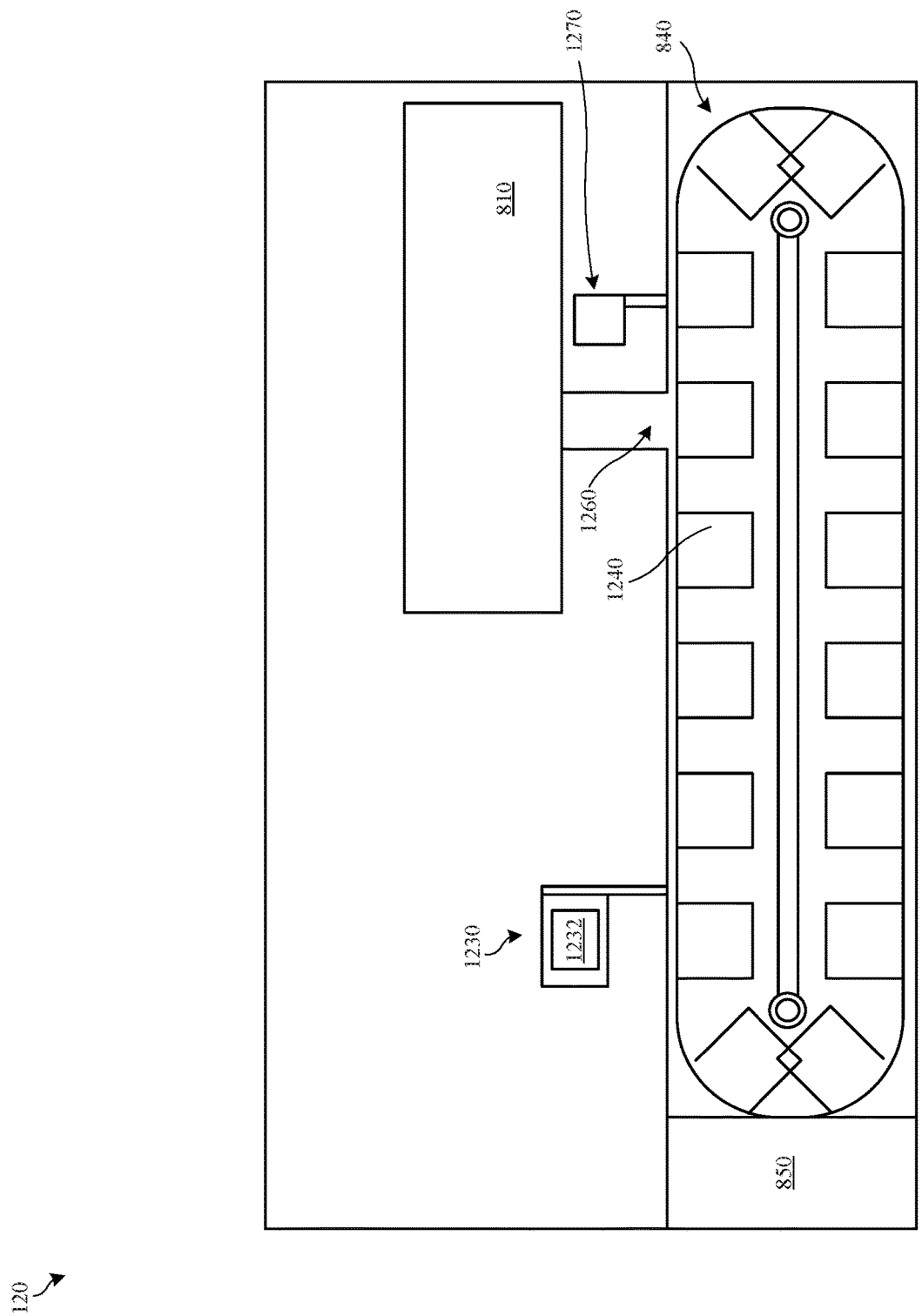
FIGS. 12A-12D illustrate various perspective views of the second module for processing the electronic component, in accordance with some embodiments.

FIG. 12A illustrates a perspective view of the second module 120. The second module 120 includes the electronic component removal station 810 configured to remove the electronic component 256-1 at a chute of a receiving station 1260. The receiving station 1260 is configured to transfer the electronic component 256-1 from the electronic component removal station 810 to the removal station 850 via a conveyor transport unit 840.

According to some embodiments, the conveyor transport unit 840 includes a motor-driven chain of containers 1240 that are arranged to cycle along a track. Each of the containers 1240 is configured to receive and retain the electronic component 256 at the receiving station 1260. Once the electronic component 256 is retained within one of the containers 1240, the conveyor transport unit 840 transports the container 1240 to the removal station 850. The conveyor transport unit 840 transports the containers 1240 sequentially to pass through a detection region 1230 and the removal station 850 before returning to the receiving station 1260.

According to some embodiments, the conveyor transport unit 840 can refer to an indexing conveyor transport unit 840 that is capable of indexing the number of containers 1240 so as to restrict that only one electronic component 256 is received within each container 1240. For example, the indexing system of the conveyor transport unit 840 can rely upon vision or non-vision control.

In some examples, each container 1240 is lined with a non-electrically conductive material so as to prevent shorting of the electronic component 256. Furthermore, each of the containers 1240 is characterized as having a geometry (e.g., length, depth, width, etc.) that is sufficient to enclose the electronic component 256 within the container 1240. Beneficially, enclosing the electronic component 256 within the container 1240 can prevent the electronic component 256 from becoming wedged between a distal end of the chute and a proximal end of container 1240, which would otherwise affect the ability of the conveyor transport unit 840 to transport the container 1240 to the removal station 850.

Figure 12B:
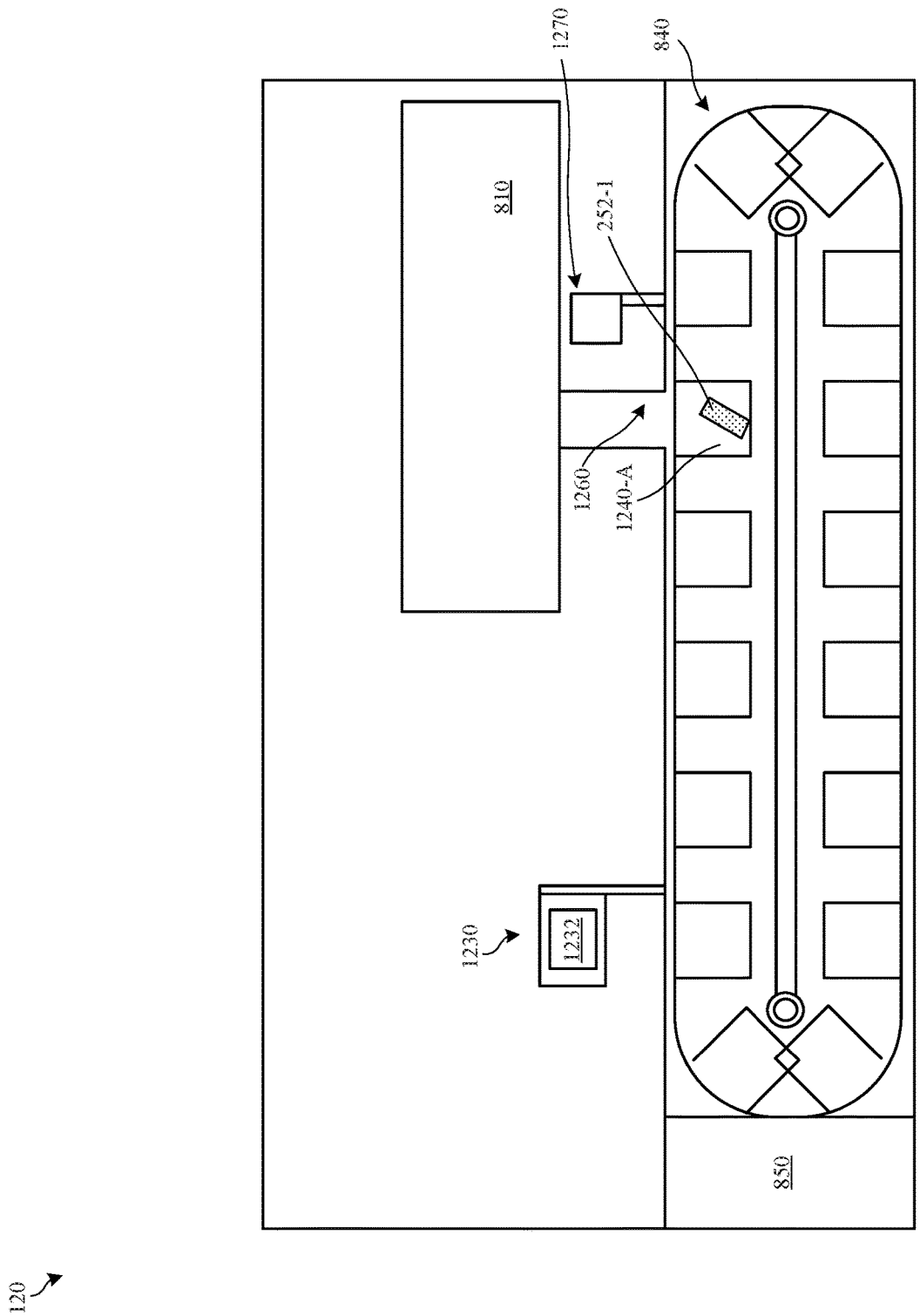

FIG. 12B is a perspective view of the second module 120 that illustrates a electronic component 256-1 that is transferred by the second module 120 into a container 1240-A at the receiving station 1260. As illustrated in FIG. 12B, the container 1240-A has a shape and geometry that is sufficient to enclose the electronic component 256-1 therein.

According to some embodiments, the conveyor transport unit 840 can utilize a drop sensor 1270 to determine whether the electronic component 256-1 has been transferred within the container 1240-A. In response to the drop sensor 1270 determining that the electronic component 256-1 has been transferred within the container 1240-A, the drop sensor 1270 can provide a detection signal to the controller 910. Accordingly, the controller 910 can respond by indexing the conveyor transport unit 840 such that a subsequent container 1240 lines up with the distal end of the chute. As a result, the conveyor transport unit 840 is configured to establish a queue of electronic components 256 within the containers 1240. It should be noted that in some examples, the conveyor transport unit 840 waits to transport containers 1240 that carry the electronic components 256 until a container 1240 at the receiving station 1260 also receives the electronic component 256. Beneficially, in this manner, the conveyor transport unit 840 can maximize a yield of the electronic components 256 that are removed from the second module 120 by ensuring that each of the containers 1240 carries the electronic components 256.

Figure 12C:
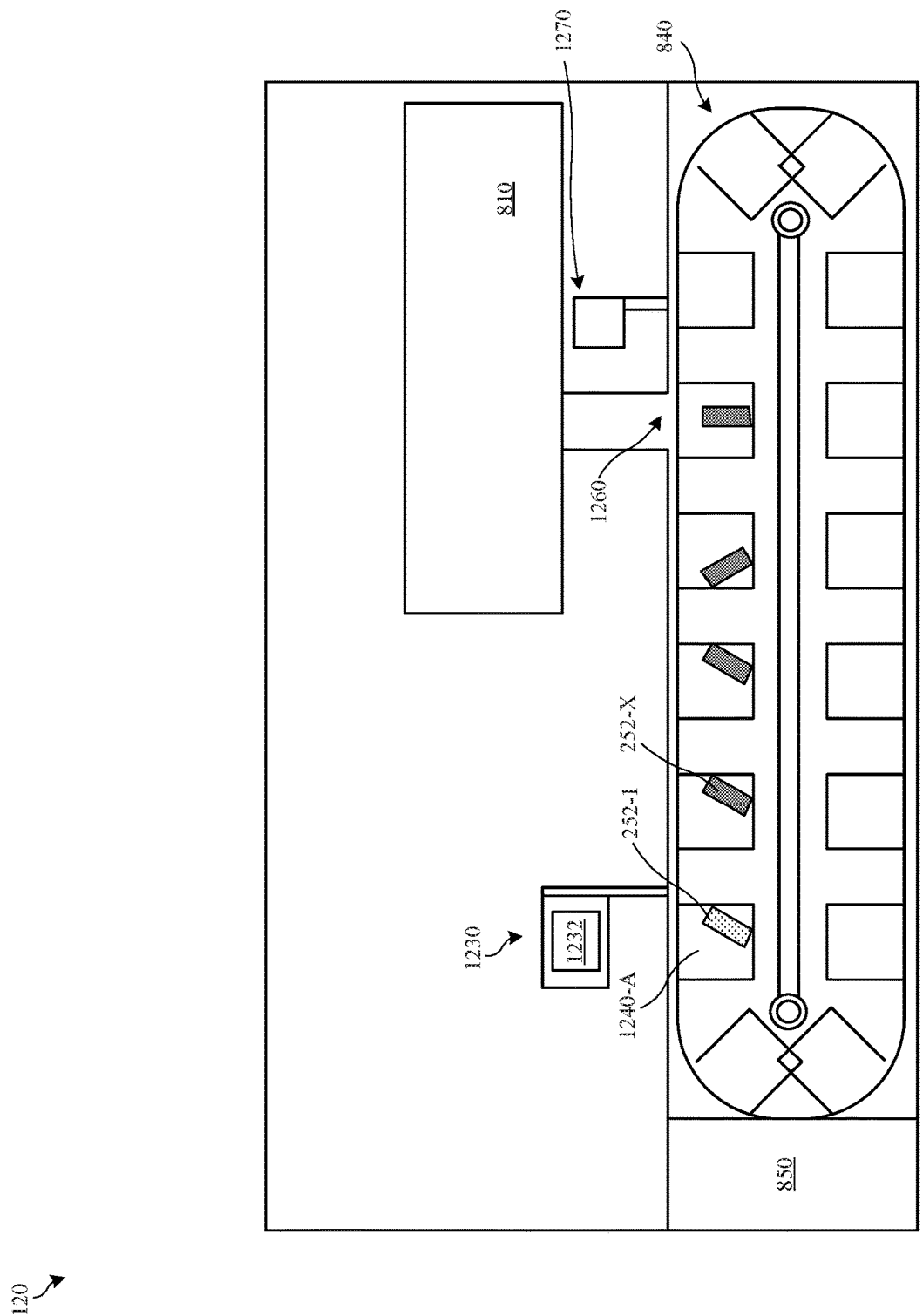

FIG. 12C is a perspective view of the second module 120 that illustrates detecting a thermal energy associated with the electronic component 256-1 at the detection region 1230. Prior to the electronic component 256-1 passing through the detection region 1230, the second module 120 is configured to increase a temperature of the electronic component 256-1.

As previously described herein, the electronic components 256 that were previously cooled after being exposed to cooled liquid or gas from the cooling unit 830. Prior to removing the electronic component 256-1 from the second module 120, the second module 120 takes precautions to ensure that the electronic component 256-1 will not cause a thermal event outside of the second module 120. In some examples, these precautions include monitoring a temperature of the electronic component 256-1 as the container 1240 moves the electronic component 256-1 towards the removal station 850. The temperature of the electronic component 256-1 increases due to the electronic component 256-1 being warmed by ambient air in the operating environment. If a thermal event is generated, the controller 910 can stop the container 1240 from moving towards the removal station 850 until the temperature of the electronic component 256-1 is less than a threshold temperature value. In particular, the second module 120 enables the electronic component 256-1 to entirely dissipate its thermal energy if a thermal event was caused before the container 1240 resumes transporting the electronic component 256-1 to the removal station 850.

In some embodiments, the thermal energy associated with the thermal event can be dissipated and contained entirely within the container 1240. Beneficially, this can prevent the thermal energy from reaching other containers 1240 or affecting the stations and units of the second module 120. In some examples, each of the containers 1240 is lined with a flame-retardant material. In some examples, the container 1240 is formed of electrically insulative material, such as anodized metal, including anodized aluminum.

According to some embodiments, a detector 1232 of the detection region 1230 is configured to detect the thermal energy of the electronic component 256-1. In some examples, the detector 1232 is a thermal imaging infrared camera. The detector 1232 is configured to compare the thermal energy of the electronic component 256-1 to a thermal energy threshold value or range (e.g., temperature threshold value, etc.). In response to determining that the thermal energy of the electronic component 256-1 exceeds the thermal energy threshold value, the detector 1232 can provide a notification signal to the controller 910. In some examples, the container 1240 stops moving and is fixed in position to allow the thermal energy (e.g., heat) to dissipate so that a temperature/thermal energy of the electronic component 256-1 is less than the thermal energy threshold value in order for the electronic component 256-1 to be safely removed from the second module 120. Thus, the controller 910 may stop the conveyor transport unit 840 from transporting the electronic component 256-1 to further allow the electronic component 256-1 to dissipate any additional thermal energy. Periodically, the detector 1232 can monitor the thermal energy of the electronic component 256-1 to determine whether the thermal energy is less than the thermal energy threshold value before providing a notification signal to the controller 910 that indicates that the electronic component 256-1 is safely removed from the second module 120. In other embodiments, the detector 1232 is configured to measure the temperature of the electronic component 256-1 and compare the temperature to a temperature threshold value.

According to some embodiments, an operating environment of the second module 120 has a negative pressure differential with respect to an ambient environment external to the second module 120. Thus, when the first electronic component 256-1 causes a thermal event, any smoke or fumes caused by the thermal event can be contained within the second module 120. In some examples, the second module 120 can include a smoke detector that is capable of detecting the thermal event and an outlet duct having an air filtration system to prevent fumes from the thermal event from escaping into the external environment.

Figure 12D:
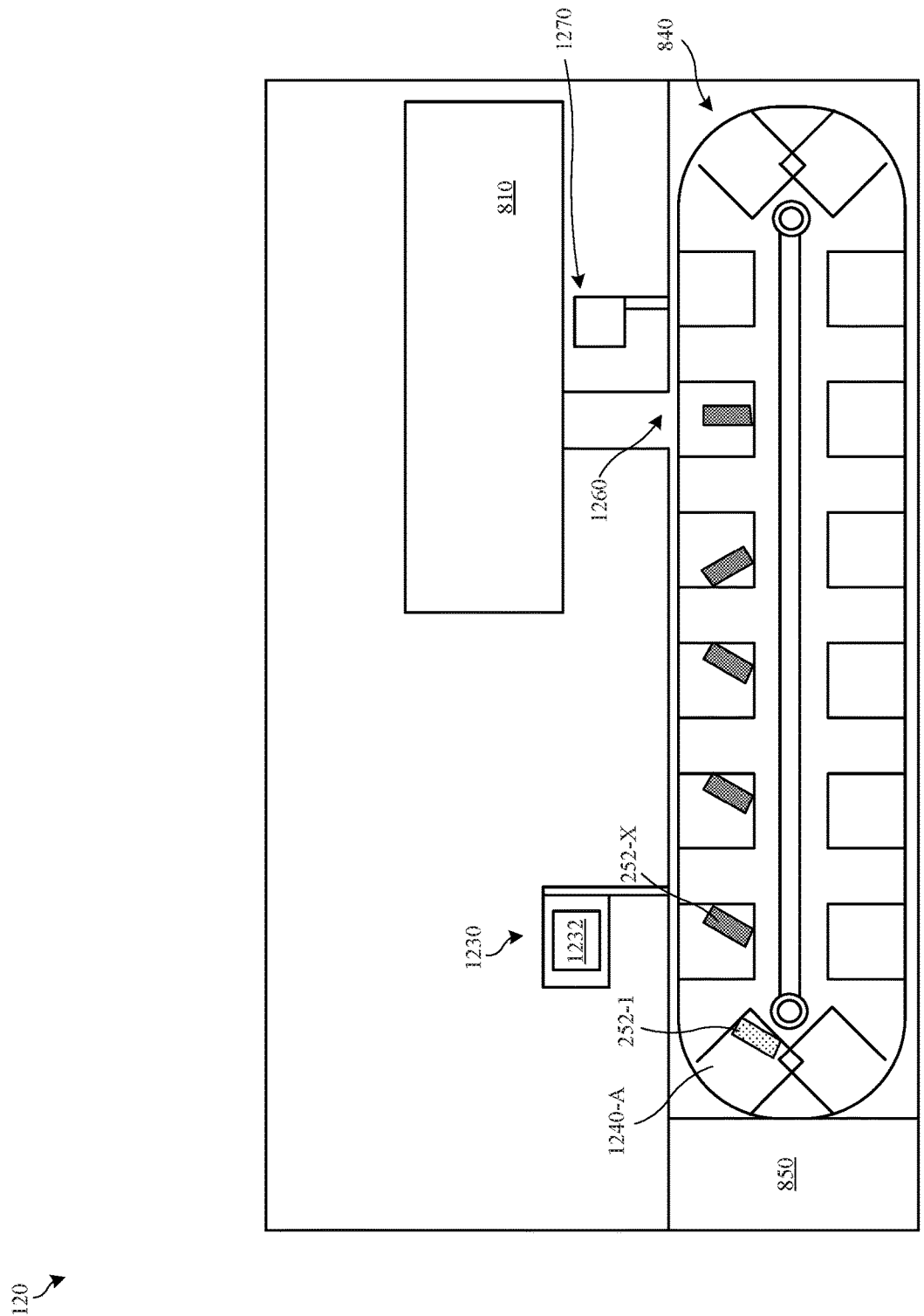

FIG. 12D is a perspective view of the second module 120 that illustrates removing the electronic component 256-1 at the removal station 850. In some examples, FIG. 12D illustrates the second module 120 subsequent to the detector 1232 determining that the thermal energy of the electronic component 256-1 has been sufficiently expended so as to enable safe removal of the electronic component 256-1 from the second module 120.

As illustrated in FIG. 12D, when the electronic component 256-1 has reached the removal station 850, an operator is permitted to reach through an unload door in order to remove the electronic component 256-1 at the removal station 850. In some embodiments, the removal station can include a sensor that is configured to detect when the operator's hand reaches into the removal station 850. In some examples, the sensor can emit a light curtain. When the light curtain is interrupted by the operator's hand, the sensor can provide a detection signal to the controller 910 that responds to cause the track of the conveyor transport unit 840 to stop moving the containers 1240. Beneficially, this ensures no risk of injury to the operator when attempting to reach into the removal station 850 to remove the electronic component 256-1.

According to some embodiments, once the electronic component 256-1 has been removed from the second module 120, the operator can press an acknowledge button that signifies that the electronic component 256-1 has been removed, and that the conveyor transport unit 840 can continue to transport electronic components 256 via containers 1240 to the removal station 850. According to other embodiments, the conveyor transport unit 840 is configured to automatically continue transporting the containers 1240 to the second transfer station 104-2 upon determining that the light curtain is no longer interrupted with the operator's hand.

According to some embodiments, the conveyor transport unit 840 can include a receptacle capable of retaining debris associated with the portable electronic device 250-1 (e.g., wires, cables, etc.) aside from the electronic component 256-1.

Figure 13A:
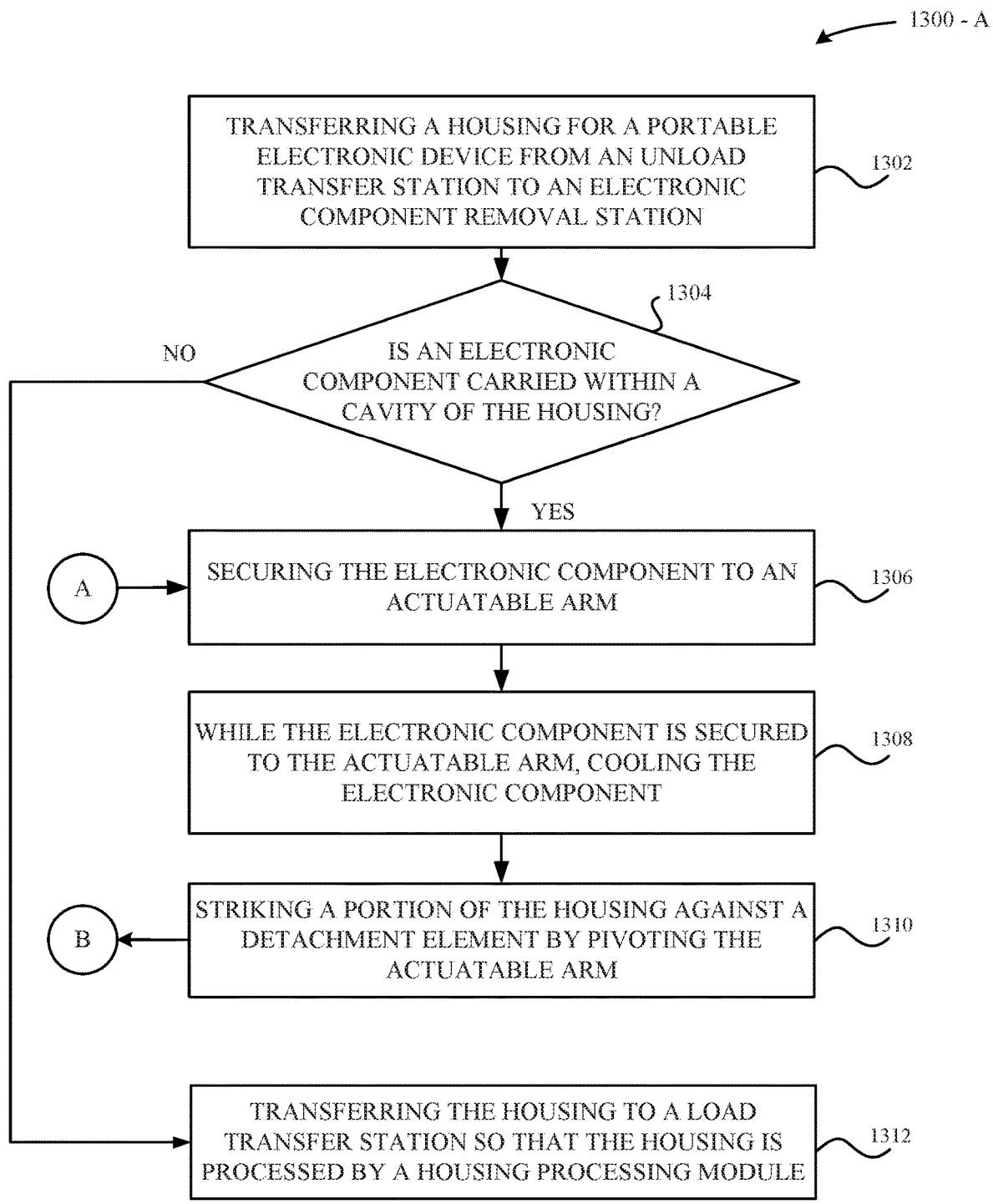
FIG. 13A illustrates a flow diagram of a method for removing the electronic component from the housing of the portable electronic device, in accordance with some embodiments.

FIG. 13A illustrates a flow diagram of a method 1300-A for removing an electronic component from a housing of a portable electronic device, in accordance with some embodiments. As illustrated in FIG. 13A, the method 1300-A begins at step 1302, where the second module 120—e.g., the controller 910—provides a control signal that causes the robotic arm 860 to pick the housing 252-1 of the portable electronic device 250-1 from the first transfer station 104-1 and place the housing 252-1 at an electronic component removal station 810. This can occur, for example, subsequent to the modular system separating the display assembly 254-1 from the housing 252-1 of the portable electronic device 250-1.

At step 1304, the controller 910 determines whether the electronic component 256-1 is carried within a cavity defined by the housing 252-1. If the controller 910 determines that the electronic component 256-1 is not carried within the cavity of the housing 252-1, then the controller 910 can provide a control signal that causes the housing 252-1 to be translated by the robotic arm 860 to the second transfer station 104-2, as indicated by step 1312.

Alternatively, at step 1304, if the controller 910 determines that the electronic component 256-1 is carried within the cavity of the housing 252-1, then the controller 910 provides a control signal that causes the electronic component 256-1 to be secured to an actuatable arm 1020, as indicated by step 1306.

At step 1308, while the electronic component 256-1 is secured to the actuatable arm 1020, the controller 910 provides a control signal to the cooling unit 830 to cool the electronic component 256-1.

At step 1310, the controller 910 provides a control signal that causes the actuatable arm 1020 to swing along its hinge at a pivot axis 1050 to cause a portion of the housing 252-1 to strike a surface 1042 of the detachment component 1040. In turn, the method 1300-A proceeds to the method 1300-B of FIG. 13B, which is described below in greater detail.

Figure 13B:
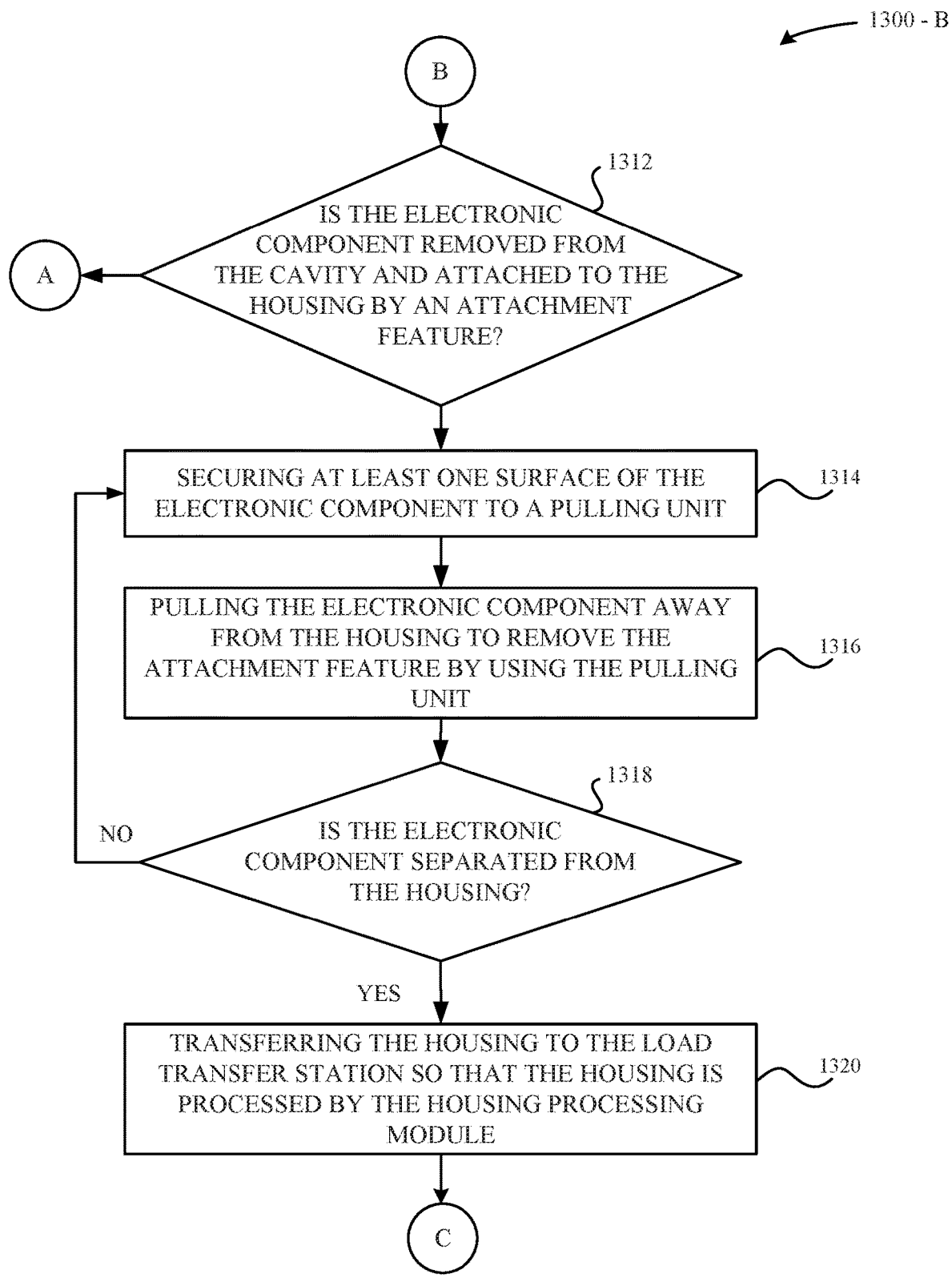
FIG. 13B illustrates a flow diagram of a method for removing the electronic component, in accordance with some embodiments.

FIG. 13B illustrates a flow diagram of a method 1300-B for processing the electronic component that was removed from the cavity of the housing and extends the method 1300-A, in accordance with some embodiments. As illustrated in FIG. 13B, the method 1300-B begins at step 1312, where the second module 120—e.g., the controller 910—determines whether the electronic component 256-1 has been removed from the cavity of the housing 252-1 while still being attached to the housing 252-1 and/or an operational component of the portable electronic device 250-1 by an attachment feature.

If the controller 910 determines that the electronic component 256-1 is not carried within the cavity of the housing 252-1, then the controller 910 can repeat the steps recited with respect to the method 1300-A.

Alternatively, at step 1312, if the controller 910 determines that the electronic component 256-1 has been removed from the cavity while still being attached to the housing 252-1, then the controller 910 can proceed to step 1314, where the controller 910 provides a control signal to cause at least one surface of the electronic component 256-1 to be secured to the pulling unit 970.

At step 1316, the controller 910 provides a control signal that causes the pulling unit 970 to pull the electronic component 256-1 away from the housing 252-1; thereby, completely separating the electronic component 256-1 from the housing 252-1 and/or the operational components.

At step 1318, the controller 910 determines whether the electronic component 256-1 has been completely separated from the housing 252-1. If the controller 910 determines that the electronic component 256-1 has not been completely separated from the housing 252-1, then the controller 910 can return to step 1314.

Alternatively, at step 1318, if the controller 910 determines that the electronic component 256-1 has been completely separated from the housing 252-1, then the controller 910 can cause the robotic arm 860 to transfer the housing 252-1 from the electronic component removal station 810 to the second transfer station 104-2 such that the housing 252-1 can be processed at a housing processing station as described below in greater detail, as indicated by step 1320.

Figure 13C:
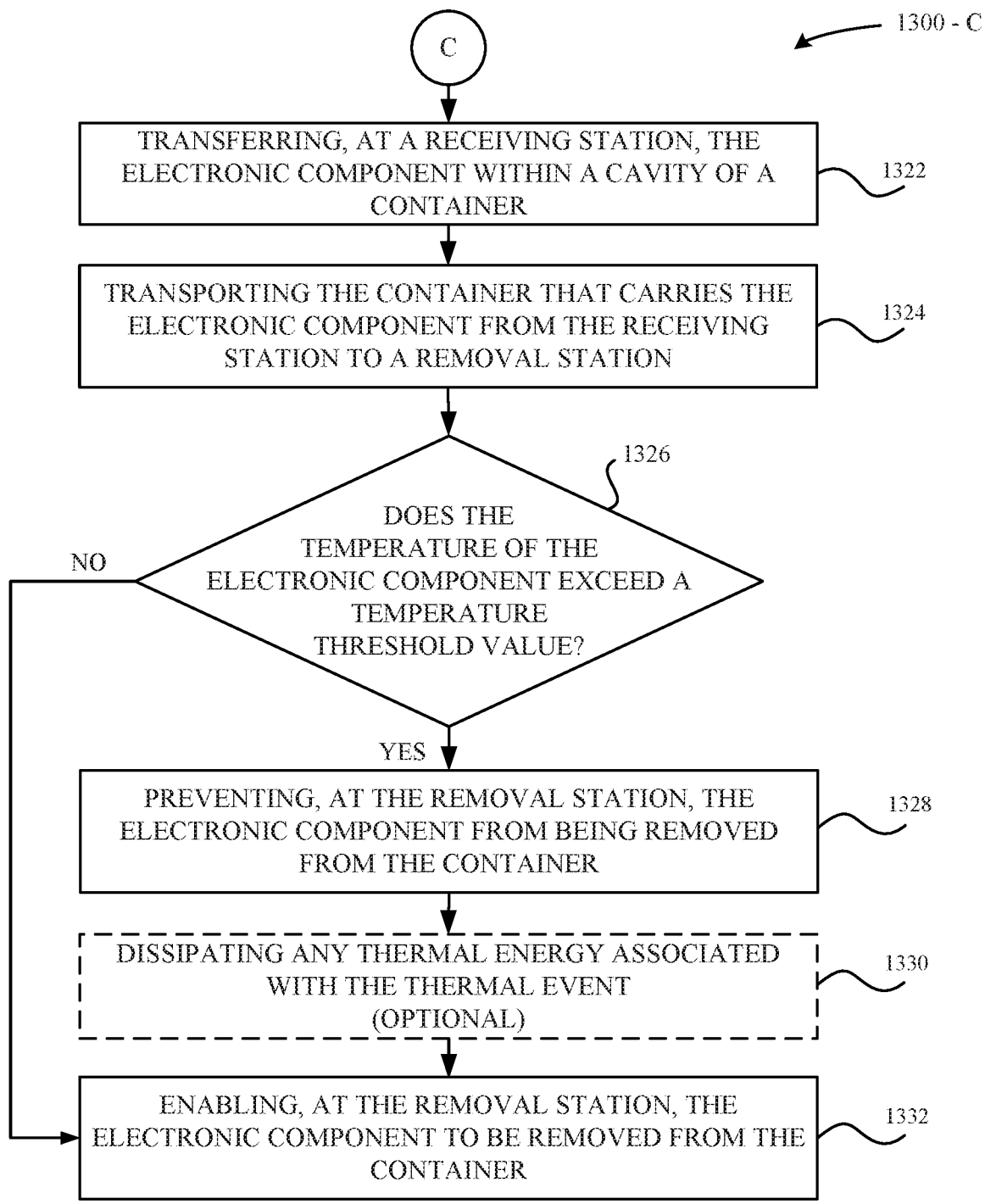
FIG. 13C illustrates a flow diagram of a method for processing the electronic component, in accordance with some embodiments.

FIG. 13C illustrates a flow diagram of a method 1300-C for processing an electronic component, in accordance with some embodiments. In particular, the method 1300-C can extend the method 1300-B (described in conjunction with FIG. 13B). The method 1300-C can involve processing the electronic component 256-1 subsequent to having separated the electronic component 256-1 from the housing 252-1 of the portable electronic device 250-1.

As illustrated in FIG. 13C, the method 1300-C begins at step 1322, where the second module 120 can transfer the electronic component 256-1 within a cavity of a container 1240 at a receiving station 1260. At the receiving station 1260, a chute can transport the electronic component 256-1 into the container 1240.

At step 1324, the second module 120 can provide a control signal that causes the conveyor transport unit 840 to transport the container 1240 that carries the electronic component 256-1 from the receiving station 1260 to a removal station 850. In some examples, while the conveyor transport unit 840 transports the container 1240 and the electronic component 256-1 to the removal station 850, the temperature of the electronic component 256-1 may be increased. In some examples, the electronic component 256-1 is warmed by exposure to ambient air temperature in the operating environment.

At step 1326, the second module 120 can determine whether the temperature of the electronic component 256-1 exceeds a temperature threshold value. If the second module 120 determines that the temperature of the electronic component 256-1 exceeds the temperature threshold value, then the second module 120 can prevent the electronic component 256-1 from being removed at the removal station 850, as indicated by step 1328.

Subsequently, at step 1330, the second module 120 can optionally dissipate any thermal energy, such as if the electronic component 256-1 causes a thermal event. In some examples, the second module 120 can utilize active mechanisms to dissipate the thermal energy, such as by cooling the electronic component 256-1.

Subsequent to dissipating the thermal energy, at step 1332, the second module 120 can enable the electronic component 256-1 to be removed from the container 1240 at the removal station 850. According to some examples, the second module 120 can enable the container 1240 to be removed at the removal station 850 by providing a control signal to the conveyor transport unit 840 to cause the container 1240 to reach the removal station 850. In other examples, the unload door of the removal station 850 is locked until the second module 120 determines that the electronic component 256-1 can be safely removed from the second module 120.

Alternatively, at step 1326, if the second module 120 determines that the temperature of the electronic component 256-1 does not exceed the temperature threshold value, then the second module 120 can permit the electronic component 256-1 to be removed from the container 1240, as indicated by step 1332.

Figure 14A:
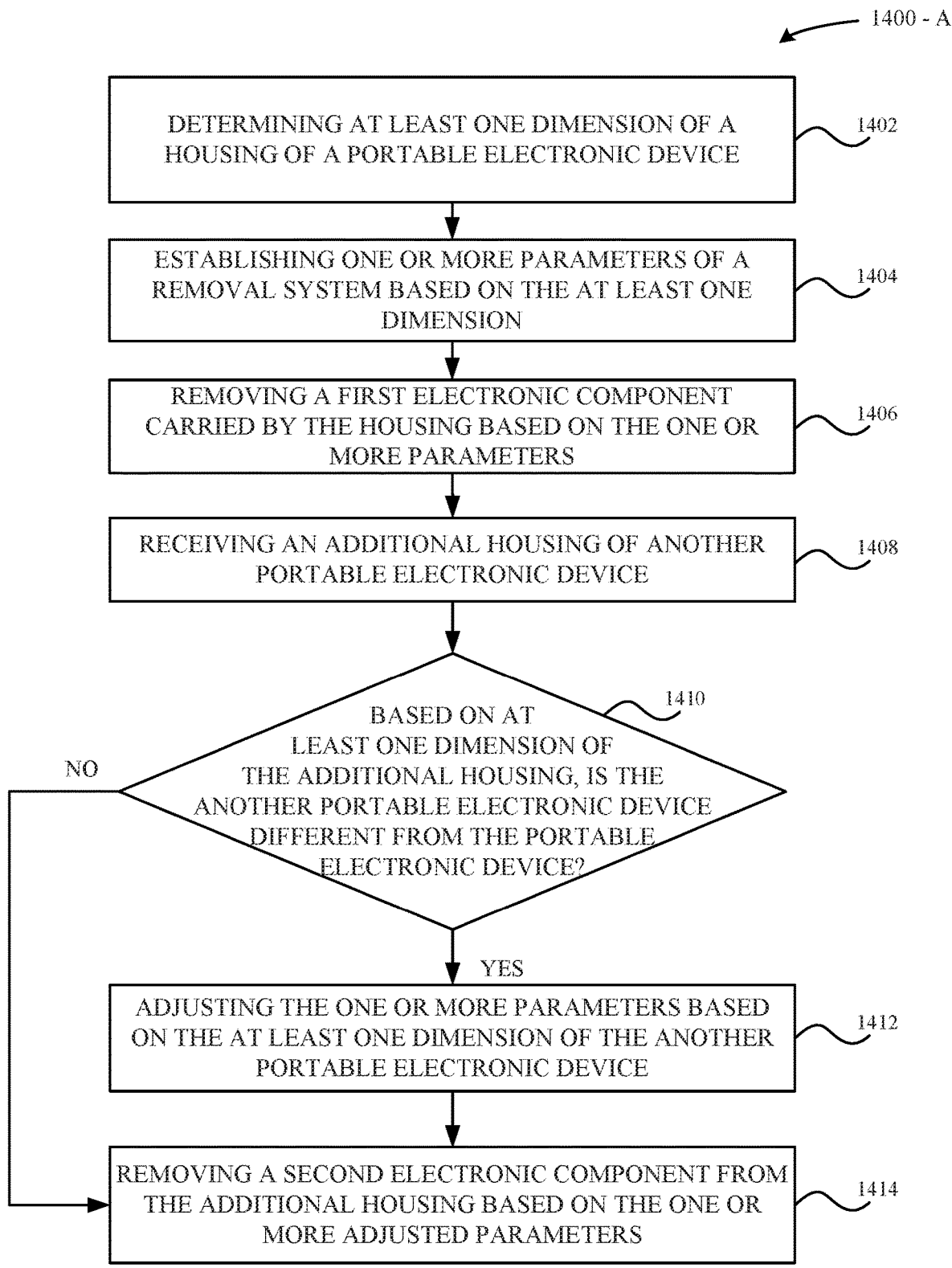
FIG. 14A illustrates a flow diagram of a method for adjusting parameters of the second module, in accordance with some embodiments.

FIG. 14A illustrates a flow diagram of a method 1400-A for adjusting parameters of the second module 120 based on at least one dimension of a portable electronic device, in accordance with some embodiments. As illustrated in FIG. 14A, the method 1400-A begins at step 1402, where the second module 120—e.g., the controller 910—determines least one dimension of the housing 252-1 of the portable electronic device 250-1.

At step 1404, based on the at least one dimension of a housing 252-1 of the portable electronic device 250-1, the controller 910 establishes one or more parameters of the electronic component removal station 810. For example, if the portable electronic device 250-1 has a housing 252-1 with an oversized shape, then the controller 910 can provide a control signal to the cooling unit 830 that causes the cooling unit 830 to increase the duration of cooling the electronic component 256-1.

At step 1406, the second module 120 removes the electronic component 256-1 from the housing 252-1 based on the one or more parameters. In particular, the actuatable arm 920 strikes a portion of the housing 252-1 against the surface 1042 of the detachment component 1040, thereby removing the electronic component 256-1 from the housing 252-1 of the portable electronic device 250-1.

At step 1408, the second module 120 receives an indication of an additional housing 252-X of another portable electronic device 250-X that is received at the electronic component removal station 810.

At step 1410, the controller 910 determines based on at least one dimension of the additional housing whether the additional housing has at least one dimension that is different than the at least one dimension of the housing 252-1 of the portable electronic device 250-1 that was previously processed. In response to determining that the at least one dimension of the additional housing is different, the controller 910 further adjusts the one or more parameters of the electronic component removal station 810. Thereafter, at step 1414, the controller 910 can remove the electronic component 256-X from the additional housing based on the one or more further adjusted parameters.

Alternatively, at step 1410, in response to determining that the at least one dimension of the additional housing 252-X is not different than the at least one dimension of the housing 252-1 of the portable electronic device 250-1, then the second module 120 removes the electronic component 256-X from the additional housing 252-X based on the one or more adjusted parameters, at step 1414.

Figure 14B:
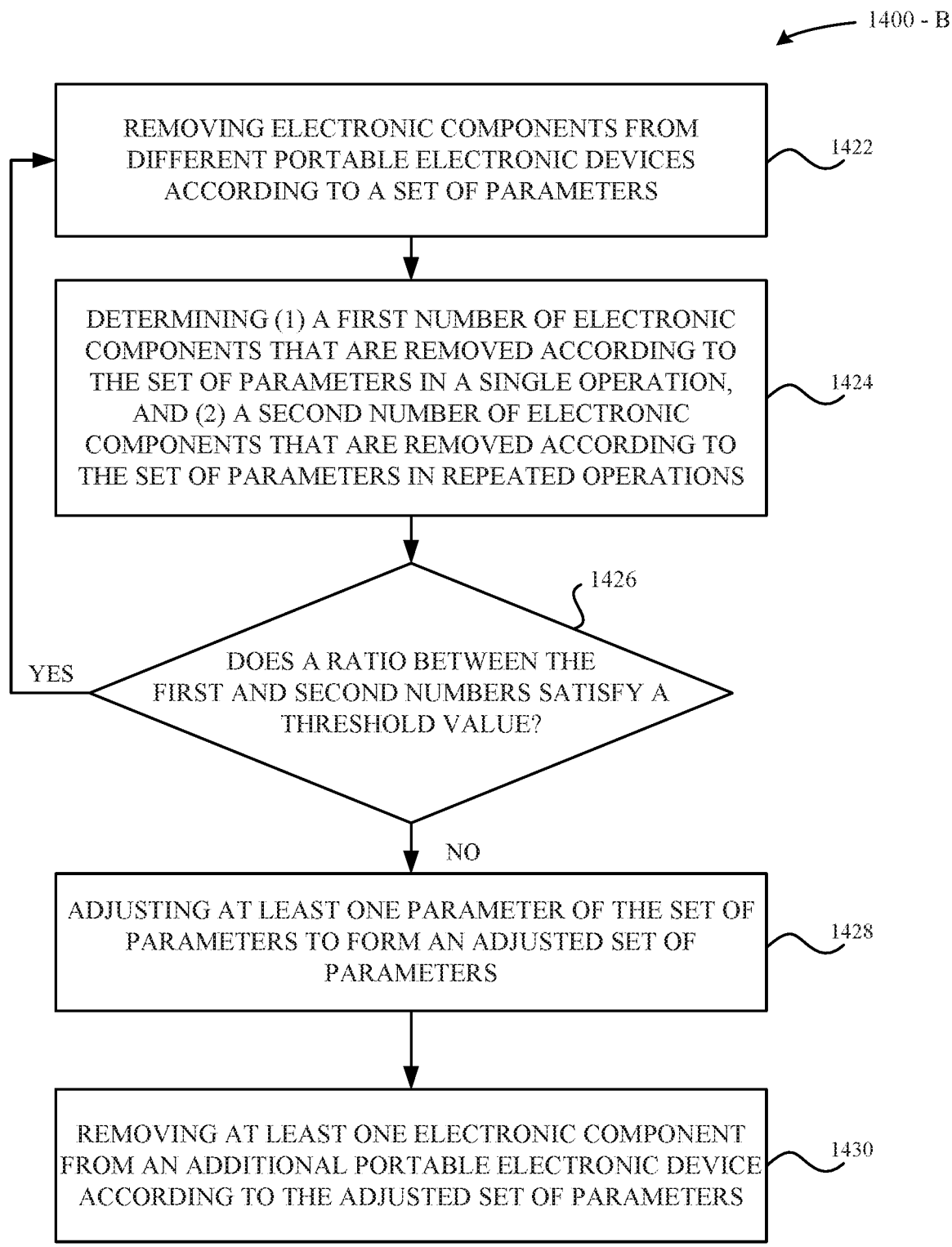
FIG. 14B illustrates a flow diagram of a method for adjusting a set of parameters of the second module, in accordance with some embodiments.

FIG. 14B illustrates a flow diagram of a method 1400-B for adjusting a set of parameters of the second module 120—e.g., the electronic component removal station 810—to yield a number of electronic components that are removed from different portable electronic devices in a single operation, in accordance with some embodiments.

At step 1422, the second module 120 removes electronic components from different portable electronic devices according to a set of parameters. While removing the electronic components, the second module 120 can track the number of operations that are required to remove each of the electronic components from their respective housings.

At step 1424, the second module 120 determines (i) a first number of electronic components that are removed according to the set of parameters in a single operation, and (ii) a second number of electronic components that are removed according to the set of parameters in repeated operations. Beneficially, by tracking the number of operations that are required to remove the electronic components from their respective housings, the second module 120 can determine how to increase the yield of electronic components that are removed in a single operation; thereby, increasing efficiency of the second module 120.

At step 1426, the second module 120 determines if a ratio between the first number of electronic components and the second number of electronic components satisfies a threshold value. In response to determining that the ratio does not satisfy the threshold value, the second module 120 adjusts at least one parameter of the set of parameters to form an adjusted set of parameters, at step 1428.

At step 1430, the second module 120 removes at least one additional electronic component from an additional portable electronic device according to the set of adjusted parameters.

Alternatively, at step 1426, in response to determining that the ratio satisfies the threshold value, then the second module 120 continues to remove at least one additional electronic component associated with an additional portable electronic device according to the set of parameters.

Third Module (Also Referred to as "a Housing Processing Module")

Figure 15A:
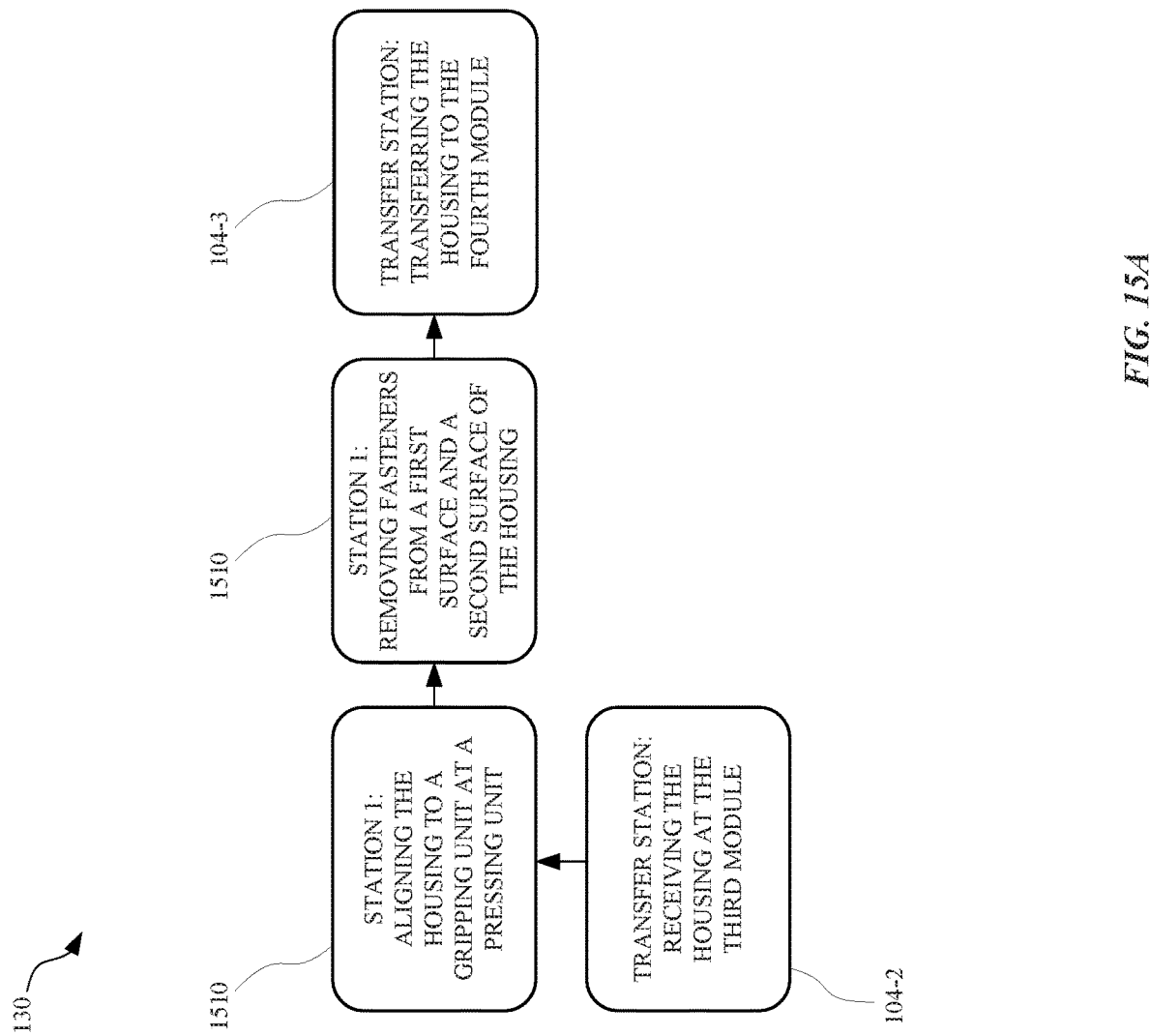
FIG. 15A illustrates a system diagram of a third module of the modular system for disassembling portable electronic devices, in accordance with some embodiments.

FIG. 15A illustrates a system diagram of a third module for disassembling portable electronic devices, in accordance with some embodiments. As shown in FIG. 15A, the third module 130 includes a number of station that are arranged to perform dedicated functions for disassembling a large-scale of portable electronic devices. The third module 130 can receive portable electronic devices from the second transfer station 104-2. The third module 130 can include a processing station 1510 that is capable of aligning the housing to a gripping unit. Thereafter, the third module 130 can remove fasteners 258 from a first surface and a second surface of the housing. Thereafter, a third transfer station 104-3 transfers the housing from the third module 130 to a fourth module 140.

Figure 15B:
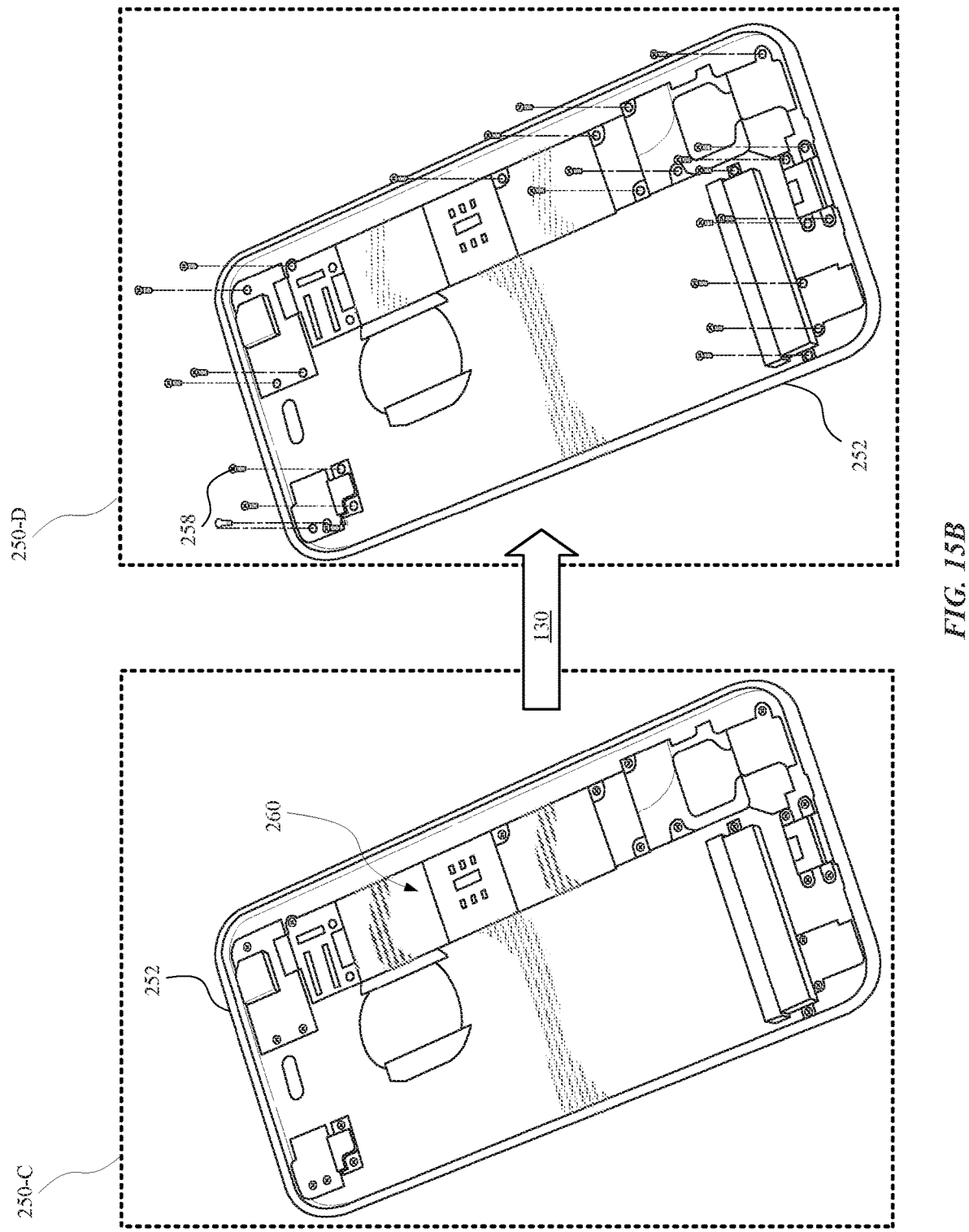
FIG. 15B illustrates an exploded view of a portable electronic device that is disassembled by the third module, in accordance with some embodiments.

FIG. 15B illustrates an exploded view of the exemplary portable electronic device 250 subsequent to being disassembled by the third module 130, in accordance with some embodiments. FIG. 15B illustrates a third state 250-C of the portable electronic device 250, which corresponds to a state of the portable electronic device 250 prior to being processed by the third module 130. In particular, during the third state 250-C, the electronic component 256 (or battery) is removed and separated from a cavity of the housing 252. Subsequent to the portable electronic device 250 being processed by the third module 130, FIG. 15B illustrates a fourth state 250-D of the portable electronic device 250. In particular, during the fourth state 250-D, fasteners 258 that secure operational components 260 to the housing 252 are removed from the housing 252.

Figure 15C:
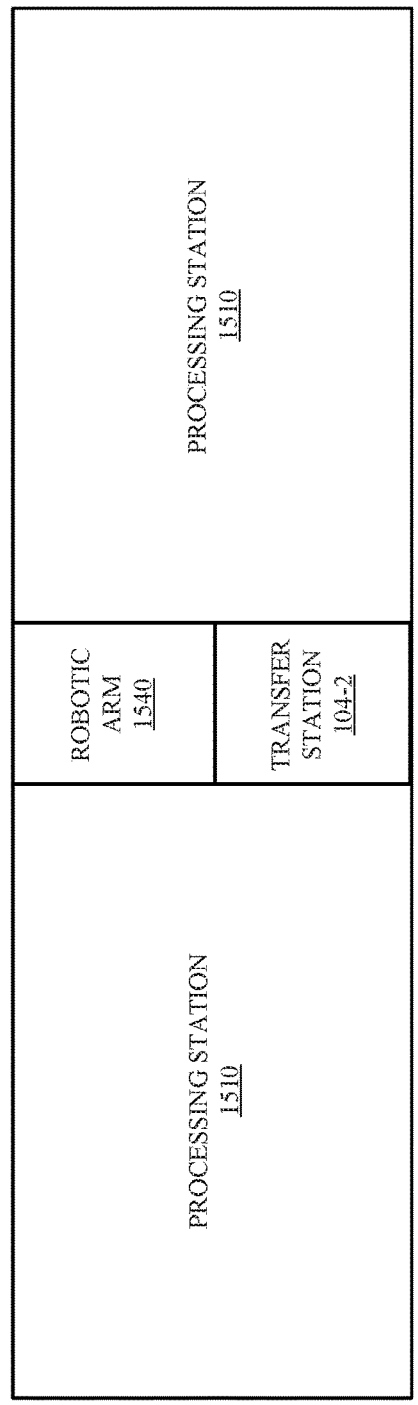
FIGS. 15C-15D illustrate various views of a third module for processing the housing of the portable electronic device, in accordance with some embodiments.
Figure 15D:
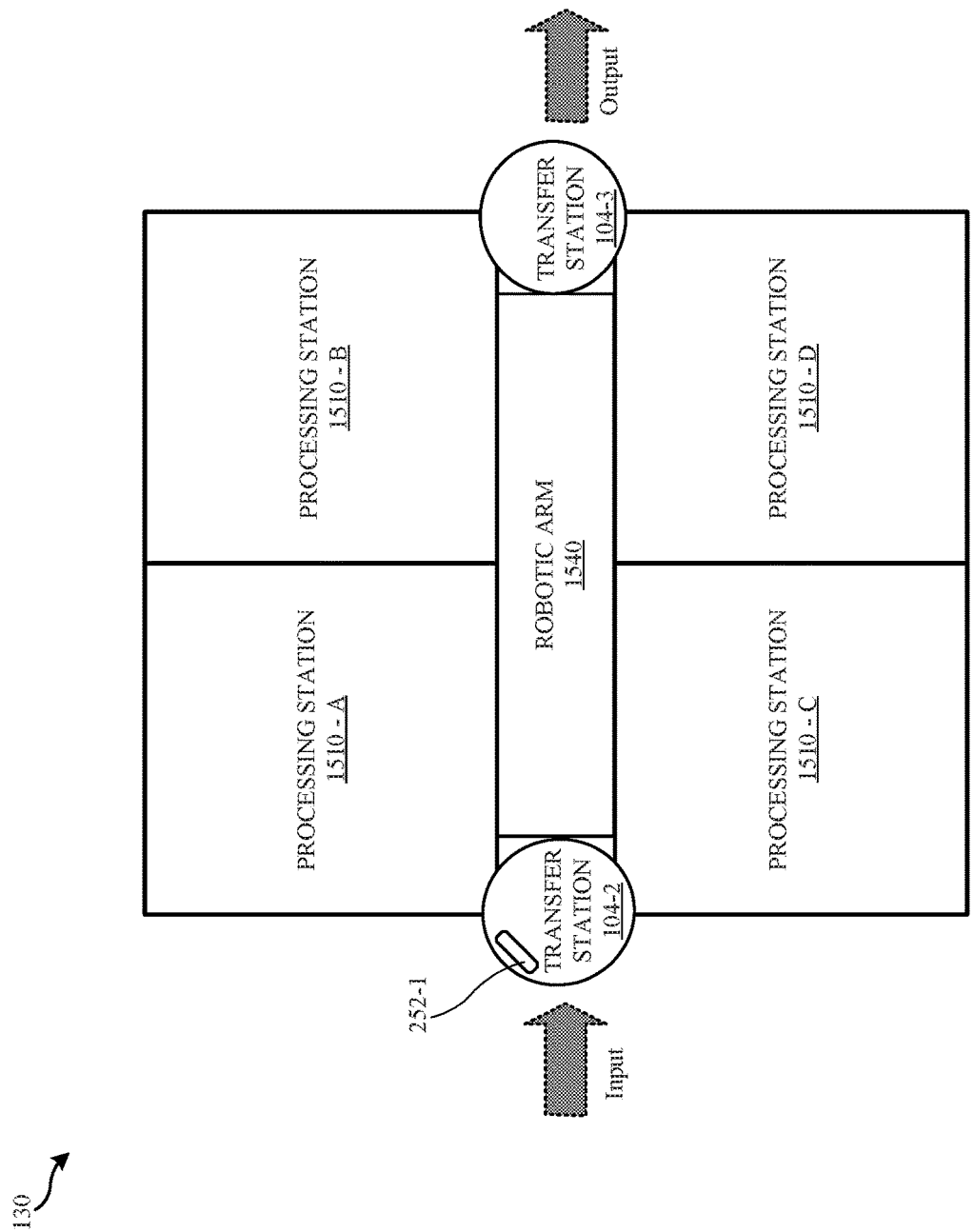

FIGS. 15C-15D illustrate various views of a third module 130 for processing a housing—e.g., the housing 252-1—of the portable electronic device 250-1, in accordance with some embodiments. This can occur, for example, subsequent to the second module 120 removing an electronic component—e.g., the electronic component 256-1—from the portable electronic device 250-1, as previously described with reference to FIGS. 8-14.

FIG. 15C illustrates a side view of the third module 130 that is configured to process the housing 252-1 of the portable electronic device 250-1. The third module can include a frame that defines a processing environment that includes one or more processing stations 1510 that are each capable of processing the housing 252-1. In some examples, the processing environment is characterized as having a negative pressure differential relative to an environment external to the modular system 100.

As illustrated in FIG. 15C, the third module 130 includes multiple processing stations 1510-A-1510-D that are each capable of processing the housing 252-1. As described in detail herein, processing the housing 252-1 can refer to at least one of removing a fastener, removing a fastener from an operational component, removing an adhesive component, separating a securing component from an operational component, removing a fastener from the housing 252-1, and the like. In some examples, the operational component is a cable bracket, a camera assembly bracket, a logic board bracket, a display assembly bracket, and the like.

According to some embodiments, the third module 130 can include a robotic arm 1540 that is configured to translate along an X-axis according to a linear slide. The robotic arm 1540 is configured to transport the housing 252 between the second transfer station 104-2 of the second module 120 and the multiple processing stations 1510-A-1510-D. In some examples, the robotic arm 1540 is an inverted robotic arm that hangs from the linear slide in an inverted orientation. According to some embodiments, the robotic arm 1540 includes at least one rotational axis that is arranged to enable the robotic arm 1540 to move in multiple degrees-of-freedom (e.g., 6-DOF, etc.). Additionally, by mounting the robotic arm 1540 along the linear slide, the robotic arm 1540 is configured to move along an additional seventh axis.

According to some embodiments, the third module 130 is connected to the second transfer station 104-2 that is capable of receiving the housing 252-1 subsequent to the housing 252-1 having been processed by one of the processing stations 1510-A-1510-D. The second transfer station 104-2 can include one or more slots that are each capable of receiving and retaining the housing 252 therein.

FIG. 15D illustrates a top view of the third module 130. The third module 130 includes multiple processing stations 1510-A-1510-D that are each capable of processing the housing 252-1. In particular, the robotic arm 1540 is capable of translating along the linear slide as well as rotating according to one or more pivot axes to pick and place the housing 252-1 between the second transfer station 104-2, one of the processing stations 1510-A-1510-D, and the third transfer station 104-3.

Figure 16:
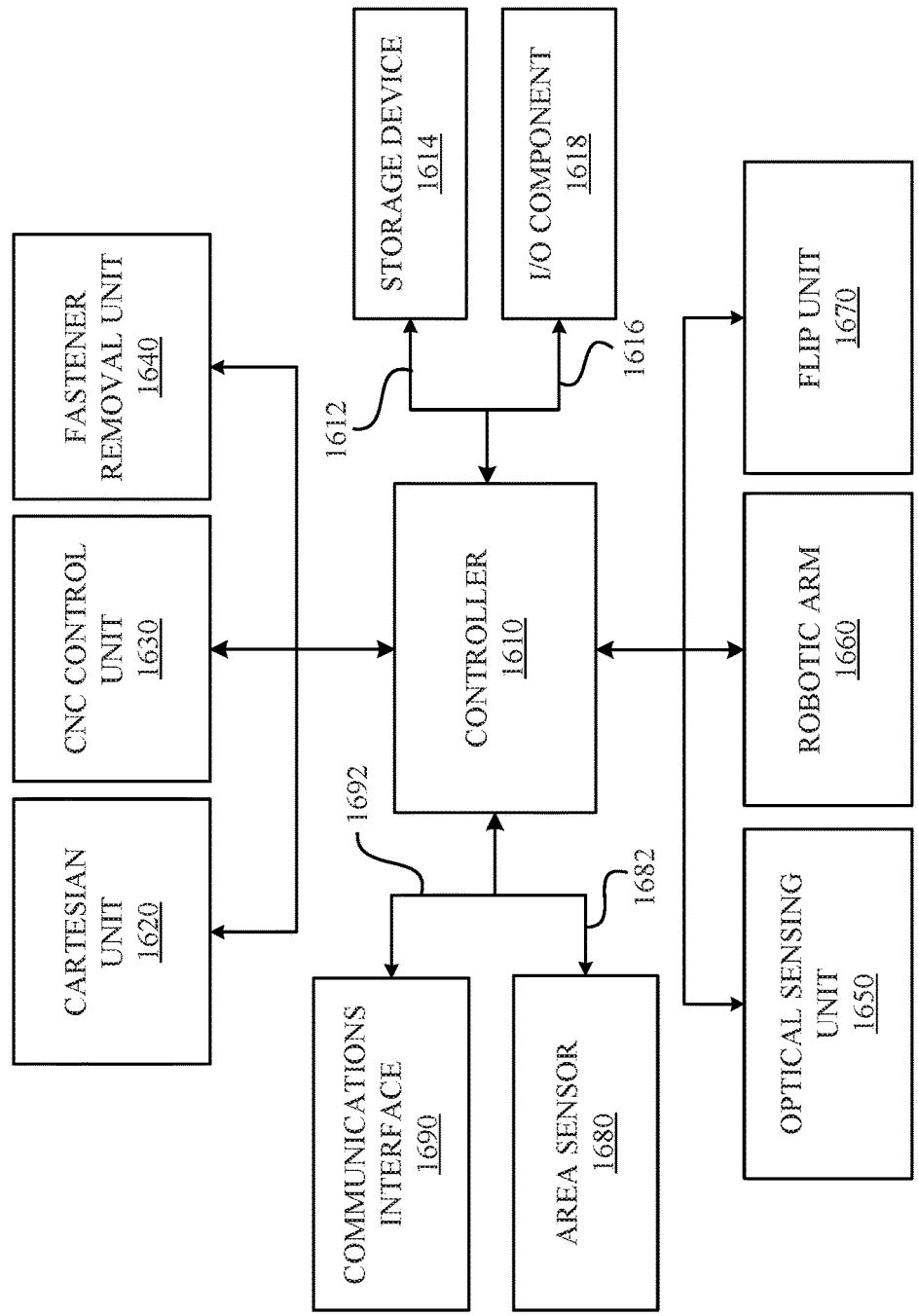
FIG. 16 illustrates a block diagram of the third module that is capable of implementing the various techniques described herein, in accordance with some embodiments.

FIG. 16 illustrates a block diagram of a modular system that is capable of implementing the various techniques described herein, in accordance with some embodiments. As illustrated in FIG. 16, the third module 130 includes one or more controllers 1610 for executing functions of the third module 130. The one or more controllers 1610 can refer to at least one of a central processing unit (CPU) or microcontrollers for performing dedicated functions.

According to some embodiments, the third module 130 can include at least one storage device 1614, such as a memory, which can include a single disk or multiple disks (e.g., hard drives), and includes a storage management module that manages one or more partitions within the storage device 1614. In some cases, storage device 1614 can include flash memory, semiconductor (solid state) memory or the like. The third module 130 can also include a Random Access Memory (RAM) and a Read-Only Memory (ROM). The ROM can store programs, utilities or processes to be executed in a non-volatile manner. The RAM can provide volatile data storage, and stores instructions related to the operation of the third module 130. In some embodiments, the storage device 1614 refers to a non-transitory computer readable medium, where an operating system (OS) is established at the storage device 1614 that is configured to execute applications or software programs that are stored at the storage device 1614. In some embodiments, a data bus 1612 can facilitate data transfer between the storage device 1614 and the controller 1610.

According to some embodiments, the third module 130 includes one or more input/output (I/O) components 1618 that enable communication between an operator and the third module 130. In some cases, the I/O component 1618 can refer to button or a switch that is capable of being actuated by the operator. In some cases, the I/O component 1618 can refer to a soft key that is flexibly programmable to invoke any number of functions. When the I/O component 1618 is actuated, the I/O component 1618 can cause an electrical signal to be provided to the controller 1610 via link 1616.

According to some embodiments, the third module 130 can include a communications interface 1690 that enables the controller 1610 to communicate with another controller—e.g., the controller 910—of the second module 120 in at least one of a wired or wireless manner. In some examples, an electrical signal is provided between the controller 1610 and the communications interface 1690 via a link 1692.

According to some embodiments, the third module 130 includes a Cartesian unit 1620 that is capable of translating the housing 252-1 between different units within one of the processing stations 1510-A-1510-D. The controller 1610 can provide control signals to translate the Cartesian unit 1620 according to at least one of an X-axis, Y-axis, or a Z-axis.

According to some embodiments, the third module 130 includes a fastener removal unit 1640 that is capable of removing/unscrewing a fastener 258 from the housing 252-1. Although, it should be noted that the fastener removal unit 1640 is capable of removing other securing features from operational components and/or the housing 252-1. The controller 1610 is configured to control the fastener removal unit 1640 in conjunction with a computer numerical control (CNC) unit 1630. In some embodiments, the fastener removal unit 1640 is capable of processing multiple surfaces of the housing 252-1. To facilitate this process, the controller 1610 can provide control signals to a flip unit 1670. In turn, the flip unit 1670 is capable of rotating the housing 252-1 so as to facilitate processing of multiple surfaces of the housing 252-1 at the fastener removal unit 1640. In some embodiments, the fastener removal unit 1640 can include a tool such as pins, presses, drivers, and the like that are capable of being actuated to remove the at least one fastener 258 from the housing 252-1. In some examples, the fastener removal unit 1640 is configured to remove the at least one fastener 258 without damaging the housing 252-1. Beneficially, in this manner, the cosmetic appearance of the housing 252-1 is preserved and also enables generally all of the metal associated with the housing 252-1 to be recycled. The fastener removal unit 1640 is configured to actuate the tool to translate an amount of pressure against the housing 252-1 and/or the fastener 258. In some examples, the fastener removal unit 1640 can remove fasteners from between 35 to 60 different locations. In some examples, the fastener removal unit 1640 can remove fasteners from between 1 to 1000 different locations According to some embodiments, the modular system includes an optical alignment unit 1650 that is capable of determining at least one of an angle, an orientation, or a position of the housing 252-1 relative to a grip unit (not illustrated) of the Cartesian unit 1620 when removing one or more fasteners 258 at the fastener removal unit 1640. In some examples, the grip unit includes diametrically opposed grippers that are adjustable in size so as to accommodate for housings having different dimensions.

According to some embodiments, the third module 130 includes an area sensor 1680 that monitors an environmental condition of the processing environment. In some examples, the area sensor 1680 is configured to monitor the processing environment for at least one of a temperature, a presence of certain chemical agents (or toxins), gases, and the like. In turn, the area sensor 1680 can provide a detection signal to the controller 1610 so as to cause the controller 1610 to provide a control signal to activate an environmental pressure regulatory system (not illustrated) of the third module 130. In some cases, a feedback loop mechanism is established between the controller 1610/storage device 1614/area sensor 1680 and other units and stations of the third module 130.

Figure 17:
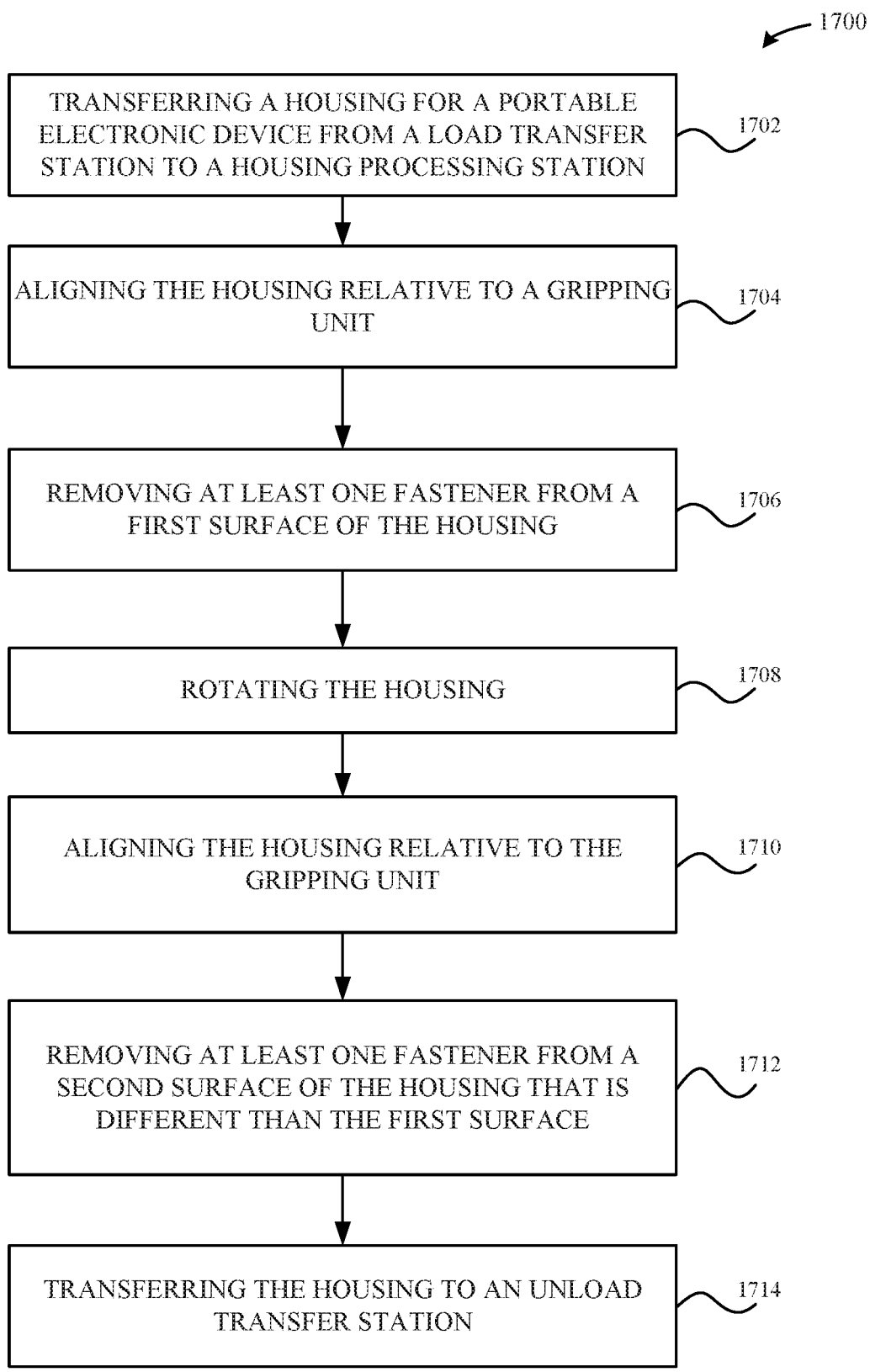
FIG. 17 illustrates a flow diagram of a method for processing the housing of the portable electronic device, in accordance with some embodiments.

FIG. 17 illustrates a flow diagram of a method 1700 for processing a housing for a portable electronic device, in accordance with some embodiments. As illustrated in FIG. 17, the method 1700 begins at step 1702 where the third module 130 instructs the Cartesian unit 1620 to pick the housing 252-1 from the transfer station 104-2 and place the housing 252-1 at the fastener removal unit 1640.

At step 1704, the third module 130 is configured to determine at least one of an orientation, alignment, or position of the housing 252-1 relative to a grip unit of the Cartesian unit 1620 by using the optical alignment unit 1650.

At step 1706, the third module 130 removes at least one fastener 258 from a first surface of the housing 252-1 at the fastener removal unit 1640.

At step 1708, the flip unit 1670 of the third module 130 rotates the housing 252-1 such that a second surface of the housing 252-1 is exposed such that the fastener removal unit 1640 is capable of processing a second surface of the housing 252-1. In some examples, the second surface is opposite of the first surface.

At step 1710, the third module 130 aligns the housing 252-1 relative to the grip unit of the Cartesian unit 1620 by using the optical alignment unit 1650. Thereafter, at step 1712, the fastener removal unit 1640 removes at least one fastener 258 from the second surface of the housing 252-1.

At step 1714, the third module 130 picks the housing 252-1 from the fastener removal unit 1640 and places the housing 252-1 at the transfer station 104-3.

Fourth Module (Also Referred to as "an Operational Component Removal Module")

Figure 18A:
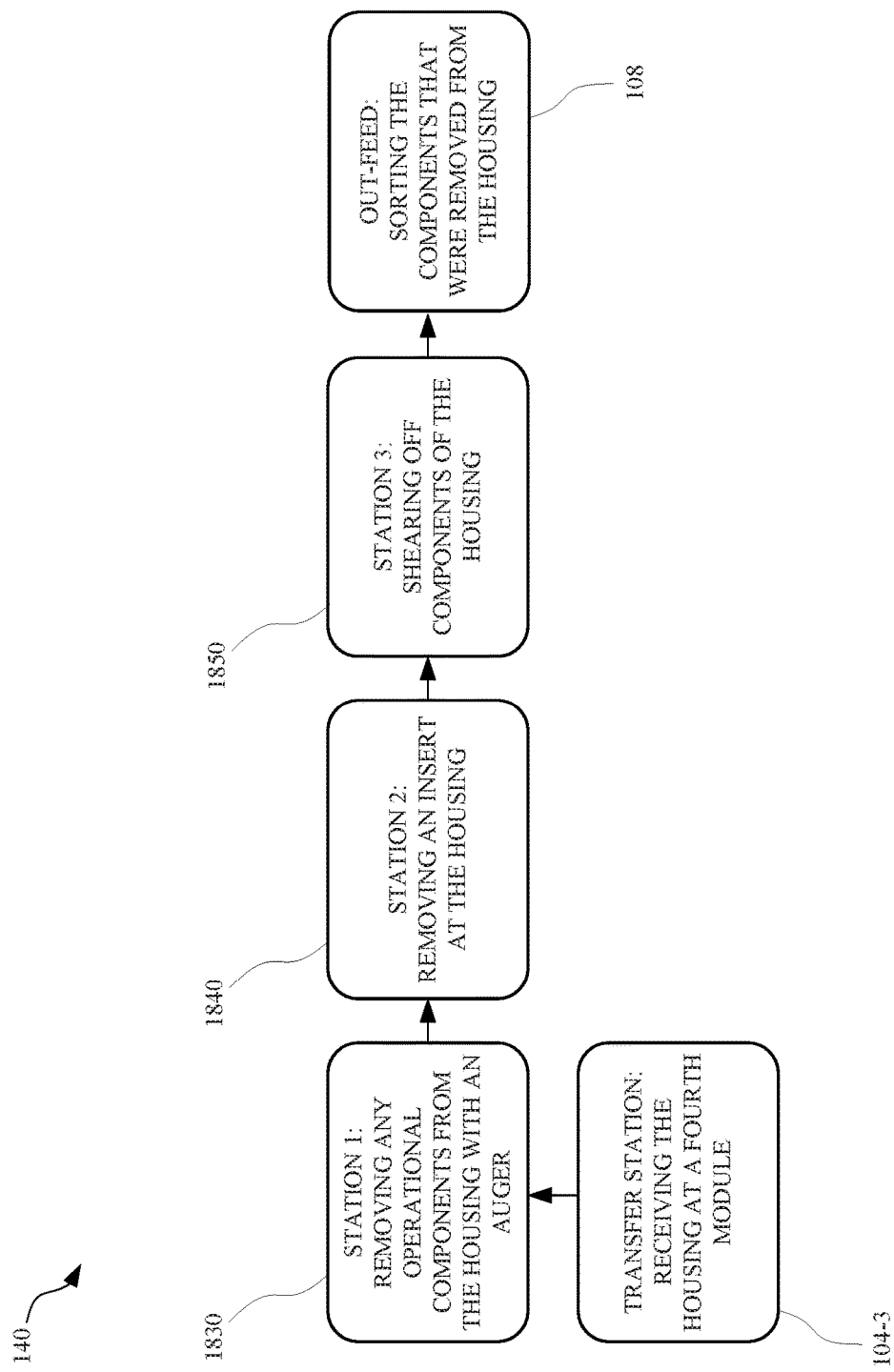
FIG. 18A illustrates a system diagram of a fourth module of the modular system for disassembling portable electronic devices, in accordance with some embodiments.

FIG. 18A illustrates a system diagram of a fourth module for disassembling portable electronic devices, in accordance with some embodiments. As shown in FIG. 18A, the fourth module 140 includes a number of station that are arranged to perform dedicated functions for disassembling a large-scale of portable electronic devices. The fourth module 140 can receive portable electronic devices from the third transfer station 104-3. The fourth module 140 can include a first disassembly station 1830 operable to remove operational components from the housing. The fourth module 140 can include a second disassembly station 1840 is operable to displace any loose operational components within the housing in order to sort the operational components onto the conveyor. The fourth module 140 can include a third disassembly station 1850 operable to shear off components of the housing. Subsequently, the out-feed unit 108 can place the operational components in receptacles so that the operational components can be sorted.

Figure 18B:
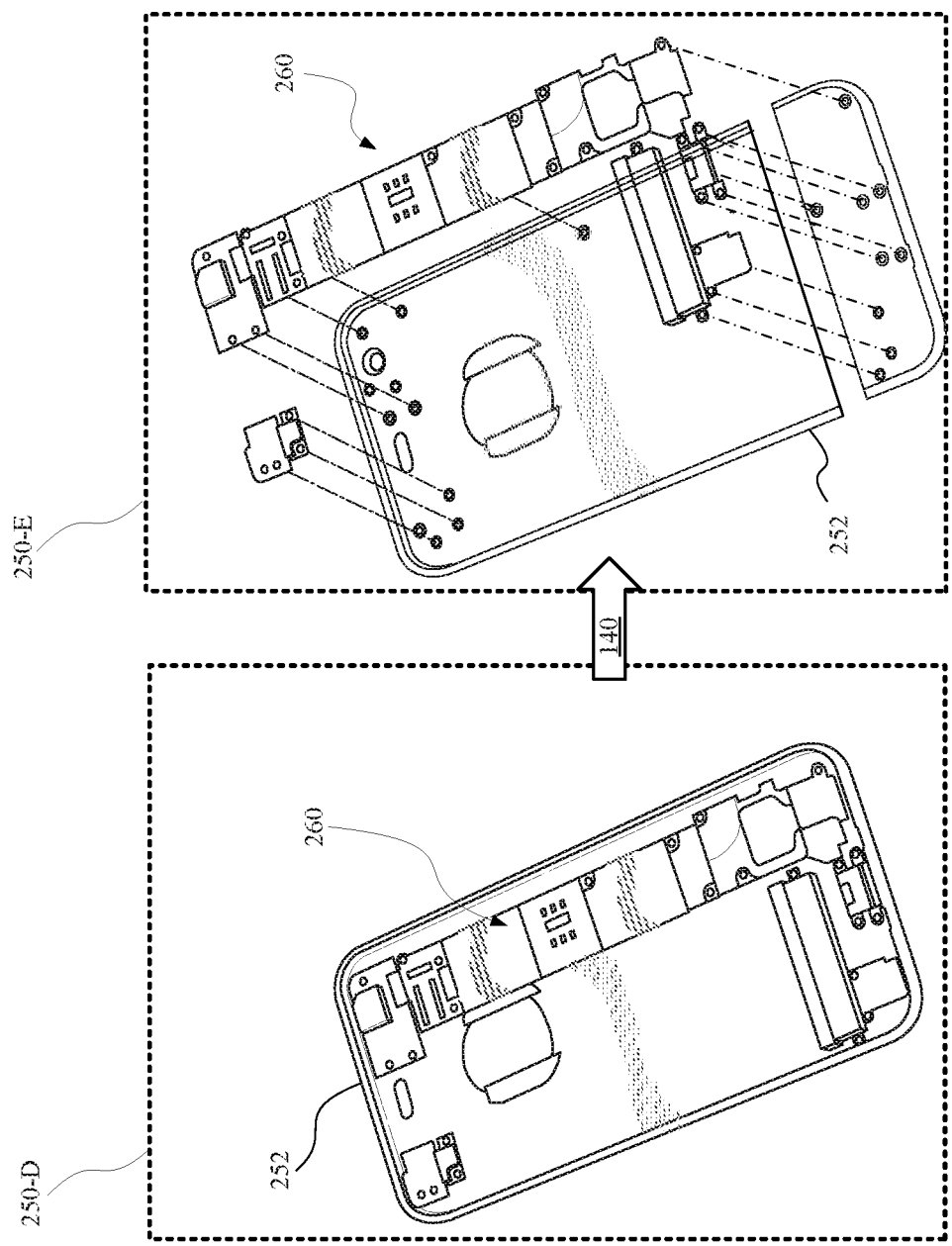
FIG. 18B illustrates an exploded view of a portable electronic device that is disassembled by the fourth module, in accordance with some embodiments.

FIG. 18B illustrates an exploded view of the exemplary portable electronic device 250 subsequent to being disassembled by the fourth module 140, in accordance with some embodiments. FIG. 18B illustrates a fourth state 250-D of the portable electronic device 250, which corresponds to a state of the portable electronic device 250 prior to being processed by the fourth module 140. In particular, during the fourth state 250-D, the fasteners 258 are removed from the housing 252. FIG. 18B illustrates a fifth state 250-E of the portable electronic device 250, which corresponds to a state of the portable electronic device 250 subsequent to being processed by the fourth module 140. In particular, during the fifth state 250-E, the operational components 260 are removed from the housing 252 and a portion of the housing 252 is sheared off.

Figure 18C:
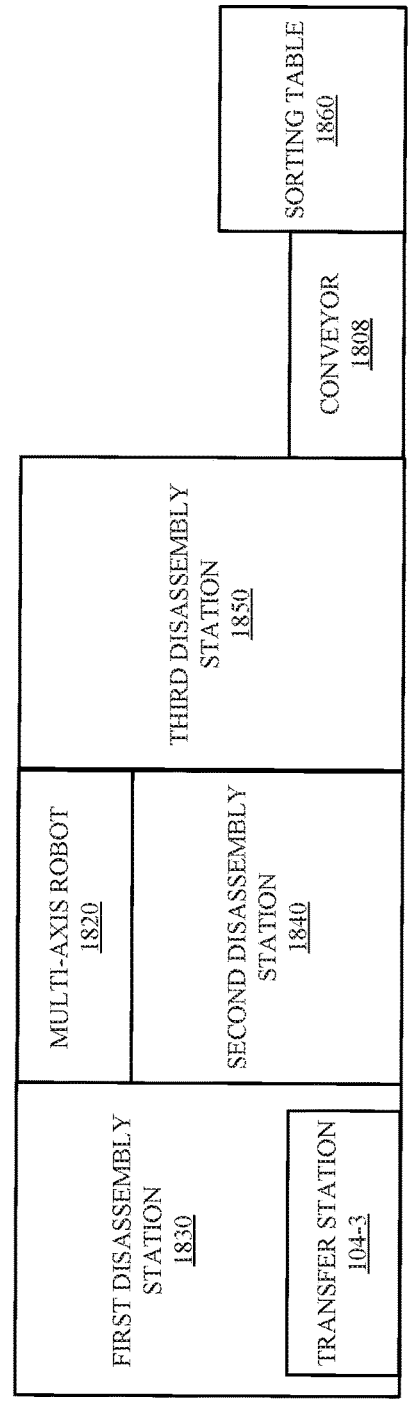
FIGS. 18C-18D illustrate various views of a fourth module for processing the housing of a portable electronic device, in accordance with some embodiments.
Figure 18D:
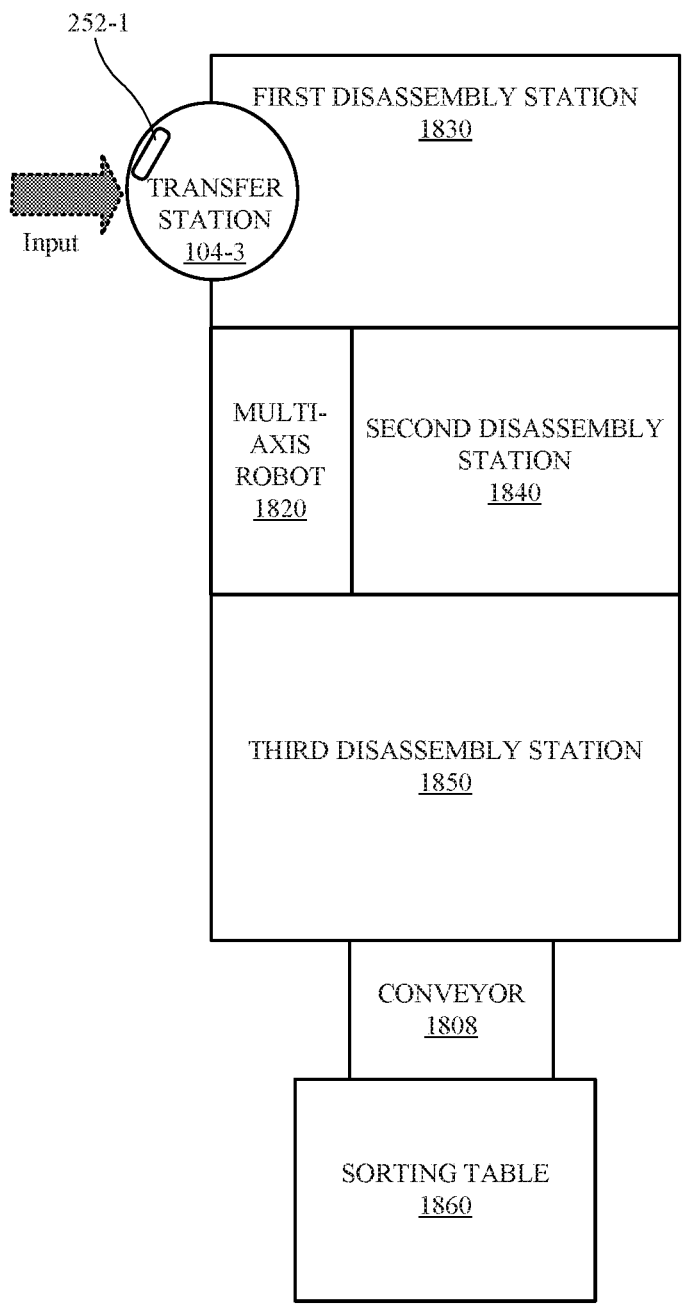

FIGS. 18C-18D illustrate various views of a fourth module 140 for processing a housing—e.g., the housing 252-1—of the portable electronic device 250-1, in accordance with some embodiments. This can occur, for example, subsequent to the second module 120 removing an electronic component—e.g., the electronic component 256-1—from the portable electronic device 250-1, as previously described with reference to FIGS. 8-14.

FIG. 18C illustrates a side view of the fourth module 140 in the modular system 100 of FIG. 1B and FIG. 18D illustrates a top down view of the fourth module 140. In some embodiments, the fourth module 140 includes a third transfer station 104-3, a multi-axis robot 1820, a first disassembly station 1830, a second disassembly station 1840, and a third disassembly station 1850. The first disassembly station 1830, the second disassembly station 1840, and the third disassembly station 1850 are operable to remove one or more operational components from the housing 252-1 of the portable electronic device 250-1. The operational components are deposited onto a conveyor 1808 that travels the length of the fourth module 140 down a midline of the fourth module 140. The conveyor 1808 is connected to a sorting table 1860 where an operator sorts the components into a plurality of receptacles based on a material type or a type of component.

In some embodiments, the multi-axis robot 1820 retrieves a housing 252-1 of a portable electronic device 250-1 from the third transfer station 104-3 and moves the housing 252-1 to a first disassembly station 1830. The first disassembly station 1830 is operable to remove operational components from the housing 252-1. In some embodiments, the operational components include an insert of a logo that is press fit into the housing and accessible from a rear surface of the housing 252-1.

The multi-axis robot 1820 transfers the housing 252-1 of the portable electronic device 250-1 from the first disassembly station 1830 to a second disassembly station 1840. The second disassembly station 1840 is operable to displace any loose operational components carried within the housing 252-1 in order to sort the operational components onto the conveyor 1808.

The multi-axis robot 1820 transfers the housing 252-1 of the portable electronic device 250-1 from the second disassembly station 1840 to a third disassembly station 1850. The third disassembly station 1850 is operable to shear off a portion of the housing 252-1, such as one or more antennas carried by the housing 252-1.

The housing 252-1 and operational components are transferred to the sorting table 1860, which can include rotating table top positioned underneath one end of the conveyor 1808. The sorting table 1860 also includes a number of orifices in the surface of a table top, located proximate the rotating table top, that open into chutes directed down into one or more receptacles underneath the surface of the table top. Each of the receptacles can include a handle and wheels for removing a bin containing the sorted components.

Figure 19:
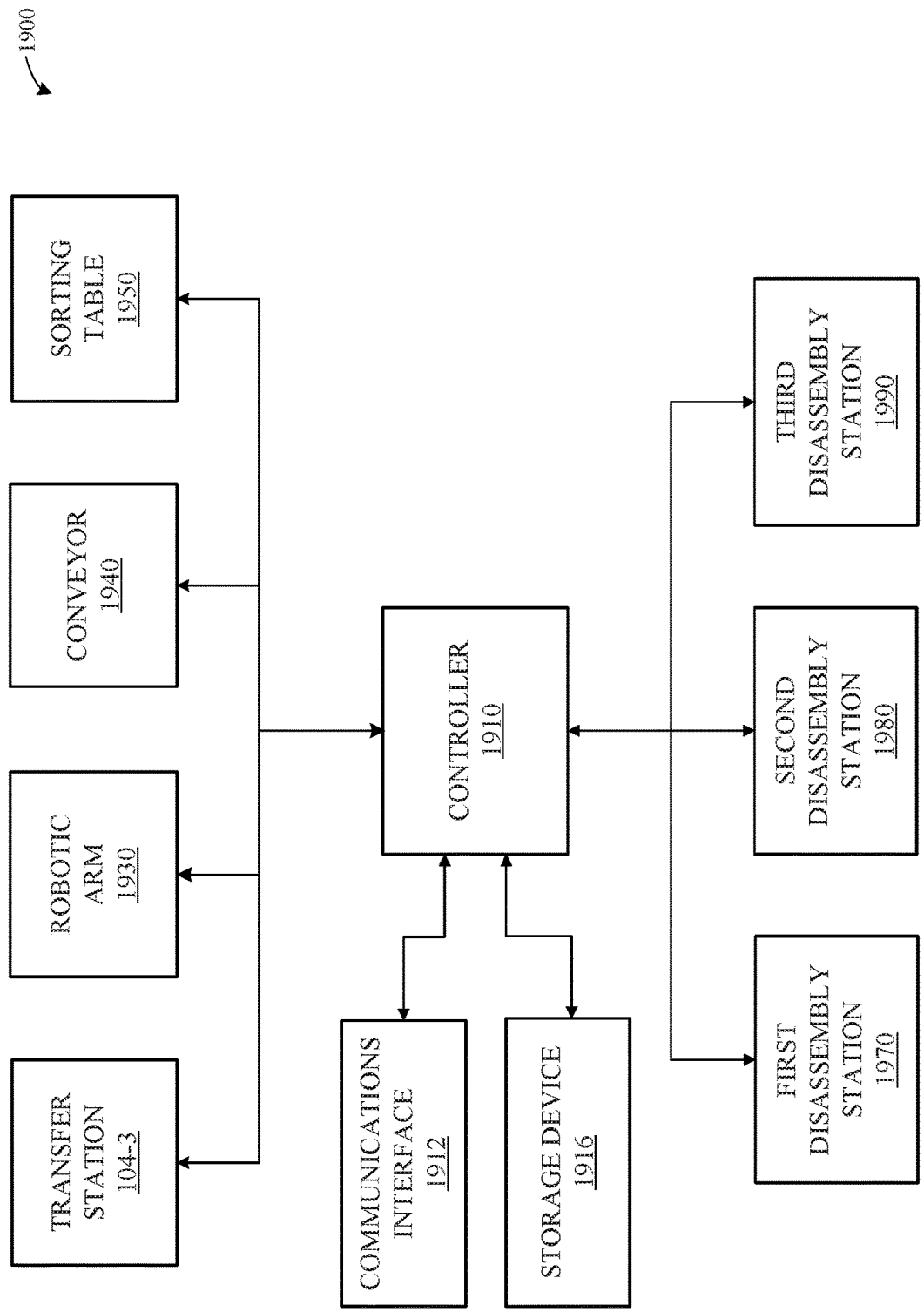
FIG. 19 illustrates a block diagram of the fourth module that is capable of implementing the various techniques described herein, in accordance with some embodiments.

FIG. 19 is a conceptual block diagram 1900 of a portion of the control system for the fourth module 140 that is capable of implementing the various techniques described herein, in accordance with some embodiments. As shown in FIG. 19, the control system includes a controller 1910 coupled to a communications interface 1912 and a storage device 1916. The controller 1910 communicates with remote computers or other controllers via the communications interface 1912 and can store data in the storage device 1916. The storage device can include volatile memory such as dynamic random access memory (DRAM) and/or non-volatile memory such as a hard disk drive (HDD) or solid state drive (SSD).

The controller 1910 is coupled to the various stations or components within the fourth module 140. As shown in FIG. 19, the controller 1910 is coupled to a transfer station 104-3, a robotic arm 1930, a conveyor 1940, a sorting table 1950, a first disassembly station 1970, a second disassembly station 1980, and a third disassembly station 1990. It will be appreciated that the various blocks shown in FIG. 19 represent signals associated with a corresponding station or component of the fourth module 140. The signals can be communicated via electrical signals or control fluid. The interface between the controller 1910 and each of the blocks can include unidirectional signals, transmitted from the controller to the block or from the block to the controller, as well as bi-directional signals where information is transmitted in both directions utilizing the same physical channel.

The transfer station 104-3 represents a set of signals associated with the third transfer station 104-3. The set of signals can include input signals, such as proximity sensor signals, and output signals, such as motor control signals for an electric motor. The robotic arm 1930 represents a set of signals associated with the multi-axis robot 1820. The set of signals can include input signals, such as encoder feedback or accelerometer feedback, and output signals, such as actuator controls for one or more axes of the multi-axis robot 1820. The conveyor 1940 represents a set of signals associated with the conveyor 1808. The set of signals can include input signals, such as encoder feedback motion detectors, and output signals, such as motor control signals for an electric motor. The sorting table 1950 represents a set of signals associated with the sorting table 1860. The set of signals can include input signals, such as motion detectors, and output signals, such as motor control signals for an electric motor.

The first disassembly station 1970 represents a set of signals associated with the first disassembly station 1830. The set of signals can include input signals, such as an optical sensor, and output signals, such as actuator controls. The second disassembly station 1980 represents a set of signals associated with the second disassembly station 1840. The set of signals can include input signals, such as encoder feedback or home switches, and output signals, such as actuator controls for one or more axes of a multi-axis machine, spindle controls, etc. The third disassembly station 1990 represents a set of signals associated with the third disassembly station 1850. The set of signals can include input signals, such as optical sensors, and output signals, such as actuator controls for a hydraulic press.

It will be appreciated that each of the conceptual blocks shown in FIG. 19 represents signals connected to the controller 1910, and that the full description of the signals depends on the design of each corresponding station or component in the fourth module 140. As described in more detail below, each actuator and/or sensor included in each station of the fourth module 140 can be connected to the controller 1910, either directly or indirectly through one or more additional components, such as a relay or VFD. Furthermore, the control system can include additional input signals or output signals connected to the controller 1910 not explicitly shown in FIG. 19.

In some embodiments, controller 1910 can be a stand-alone controller configured to communicate with other discrete controllers included in each of the other modules. It will be appreciated that the block diagram of FIG. 19 is not a schematic, and that the set of signals incorporates any electrical components or mechanical components necessary for routing signals between the controller 1910 and the actuators and/or sensors. For example, a signal can be routed through a relay to change a voltage level of the signal. In another example, an electrical signal can be routed to a valve that converts the signal from an electrical signal to a fluid signal (e.g., hydraulic fluid or pressurized air).

Figure 20:
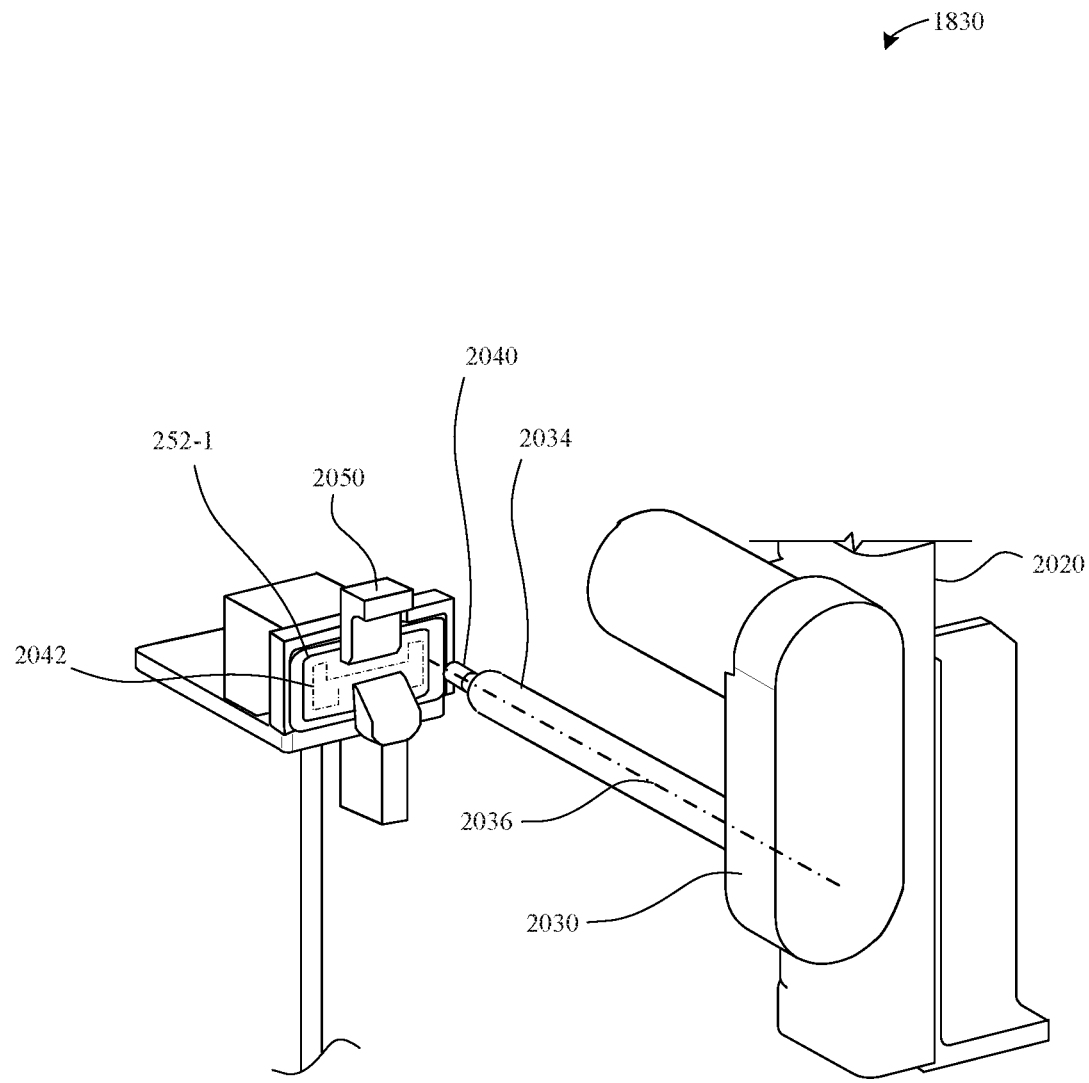
FIG. 20 illustrates a first disassembly station in the fourth module, in accordance with some embodiments.

FIG. 20 illustrates the first disassembly station 1830 in the fourth module 140, in accordance with some embodiments. FIG. 20 illustrates a milling head 2030 connected to a vertical slide 2020. The milling head 2030 includes a spindle motor coupled to a spindle 2034 via pulleys or gears. The spindle motor operates to rotate the spindle 2034 around an axis 2036. An auger 2040 is connected to the spindle 2034. An X-Y table can be incorporated with the first disassembly station 1830 to cooperate with the vertical slide 2020 to enable the auger 2040 to be moved in three dimensions relative to a housing 252-1 secured in a clamping mechanism 2050. The first disassembly station 1830 can include a shield that is utilized to direct parts discharged from the housing 252-1 into the conveyor 1808.

In operation, the multi-axis robot 1820 transfers the housing 252-1 to the clamping mechanism 2050. The housing 252-1 is secured in the clamping mechanism 2050 with a cavity of the housing 252-1 facing the auger 2040. Operational components secured within the housing 252-1 were loosened during a disassembly task performed by the third module 130. However, such operational components may still remain in the cavity of the housing 252-1. In some cases, the operational components may not have been dully dislodged during the disassembly task in the previous module. In order to ensure the cavity of the housing 252-1 is fully cleared of operational components, the auger 2040 is moved through the cavity, following a tool path 2042 based on the physical attributes of the portable electronic device 250-1. The tool path 2042 ensures that the auger 2040 removes any operational components left inside the housing 252-1 and forces the operational components onto the conveyor 1808.

Figure 21:
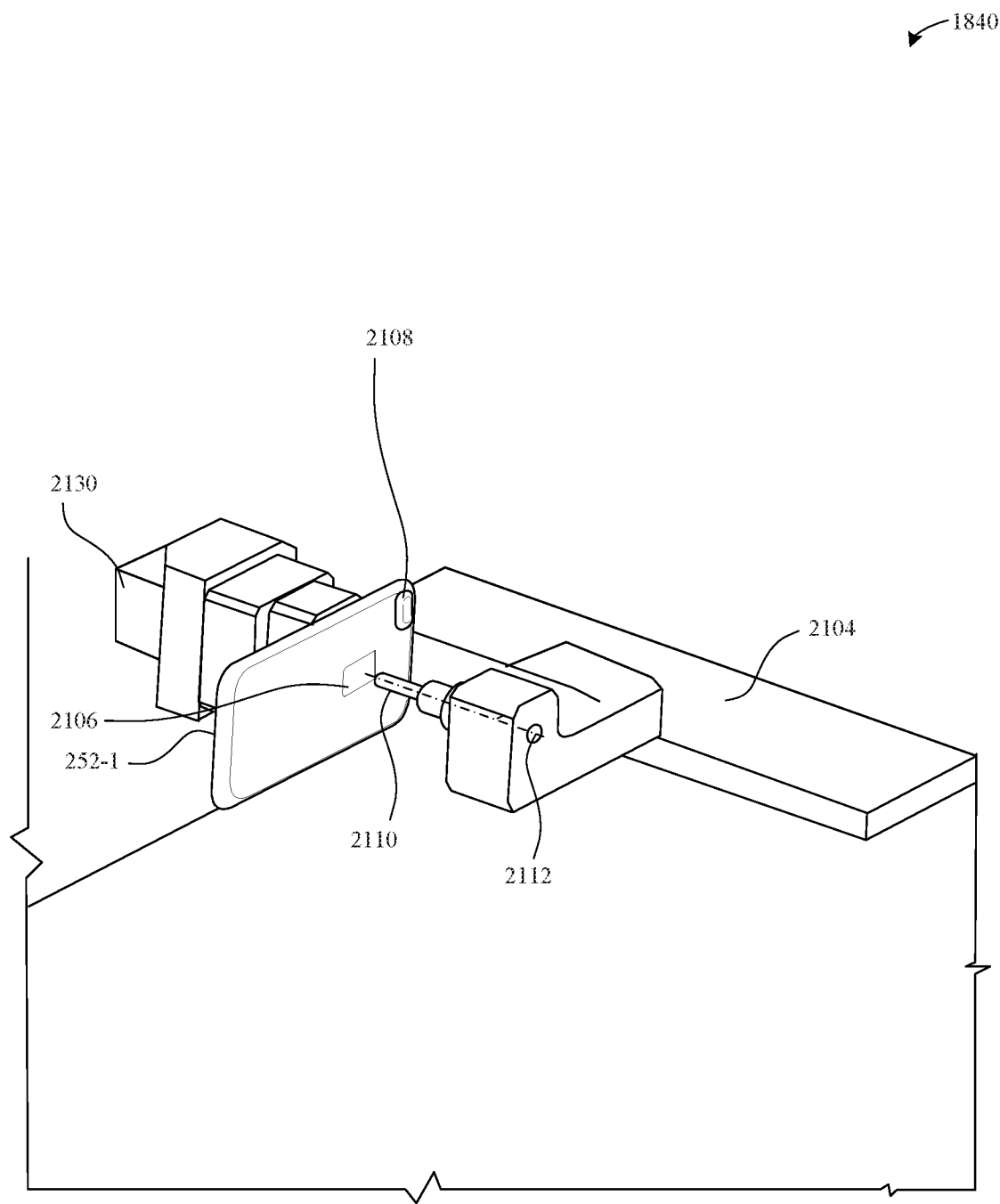
FIG. 21 illustrates a second disassembly station in the fourth module, in accordance with some embodiments.

FIG. 21 illustrates the second disassembly station 1840 in the fourth module 140, in accordance with some embodiments. FIG. 21 illustrates a tool 2110 associated with an axis 2112. The housing 252-1 is secured on a mechanism positioned at the end of a ram connected to an actuator 2130. In some embodiments, the actuator 2130 is a pneumatic cylinder and the mechanism positioned at the end of the ram is a suction device. The mechanism is operable to secure the housing 252-1 to the second disassembly station 1840 during a disassembly task for removing an insert 2106 or a structure 2108 surrounding a rear-facing camera. The actuator 2130 moves the housing 252-1 towards the tool 2110. In some embodiments the movement of the actuator 2130 is parallel to the axis 2112. The insert 2106 and the structure 2108 have been press fit into a corresponding hole in the housing 252-1. In some embodiments, the insert 2106 is a logo for a manufacturer of the portable electronic device 250-1.

As shown in FIG. 21, the second disassembly station 1840 includes a base structure 2104. An X-Y table can be affixed to the base structure 2104 and connected to a tool 2110. In some embodiments, the tool 2110 is made of tool steel or an otherwise hard material. The X-Y table is operable to move the tool 2110 in at least two dimensions relative to the housing 252-1. A sensor, such as an optical sensor, can be coupled to an arm near the tool 2110 to provide feedback regarding the location of the tool 2110 as the X-Y table is moved to position the tool 2110. Once the tool 2110 is in place at the first location, the actuator 2130 pushes the housing 252-1 toward the tool 2110, which contacts the insert 2106. The insert 2106 is then pressed out of the corresponding hole in the housing 252-1 to separate the insert 2106 from the housing 252-1.

Once the insert 2106 has been removed, the tool 2110 is moved to a second location. Once the tool 2110 is in place at the second location, the actuator 2130 pushes the housing 252-1 toward the tool 2110, which contacts the structure 2108. The structure 2108 is then pressed out of the corresponding hole in the housing 252-1 to separate the structure 2108 from the housing 252-1. It will be appreciated that additional structures can be pressed out of the housing 252-1 by repeating these steps to move to a separate location relative the edges of the housing 252-1.

Figure 22:
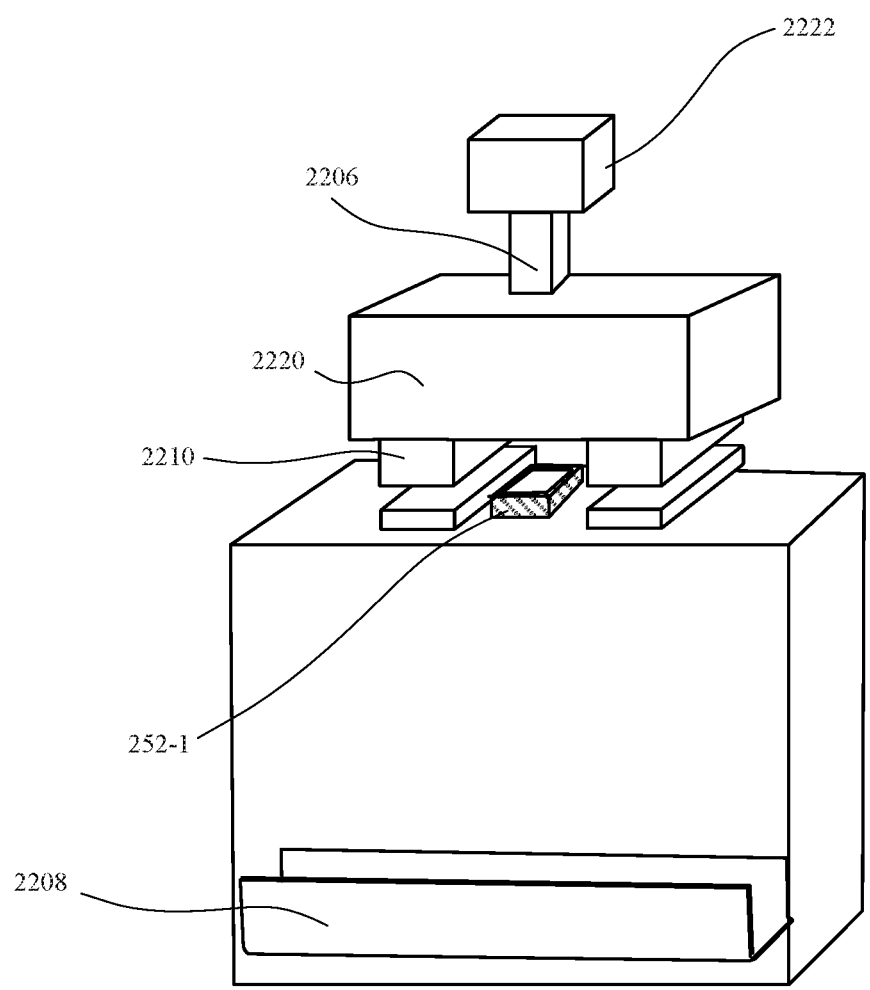
FIG. 22 illustrates a third disassembly station in the fourth module, in accordance with some embodiments.

FIG. 22 illustrates the third disassembly station 1850 in the fourth module 140, in accordance with some embodiments. As shown in FIG. 22, the third disassembly station 1850 is a capable of performing a mechanical shear operation. The third disassembly station 1850 includes a die 2210 affixed to a base structure. A housing 252-1 can be placed in a clamping mechanism or other receiving means that is configured to feed the housing 252-1 between the based portion of the die 2210 and a top portion of the die 2220. In some embodiments, the base portion of the die 2210 is fixed relative to the base structure, and the top portion of the die 2220 is movable relative to the base structure. The top portion of the die 2220 is coupled to a ram 2206 connected to an actuator 2222 such as a hydraulic cylinder.

In operation, the multi-axis robot 1820 transfers the housing 252-1 to the clamping mechanism or other receiving means included in the third disassembly station 1850. The clamping mechanism moves the housing 252-1 into the die 2210, between the fixed based portion of the die 2210 and the top portion of the die 2220. The actuator 2222 presses the top portion of the die 2220 down towards the housing 252-1. An edge on the die 2210 and a corresponding edge on the top portion of the die 2220 operate to shear off a portion of the housing 252-1. In some embodiments, the portion of the housing 252-1 sheared off includes one or more antennas carried thereon. The antennas may be difficult to remove via other processes and, therefore, the disassembly process simply cuts that portion of the housing 252-1 free to be processed differently that the other portion of the housing 252-1.

Once the portion of the housing 252-1 is sheared off, the portion of the housing 252-1 may be carried in a receptacle 2208 located below the die 2210. The receptacle 2208 collects a plurality of sheared portions of the housing 252-1, and then an operator can remove the receptacle 2208 to sort these portions of the housing 252-1. In some embodiments, the sheared portions of the housing 252-1 directed towards the receptacle 2208 include the one or more antennas, and the other portions of the housing 252-1, without antenna(s), are displaced onto the conveyor 1808 by the multi-axis robot 1820 to be sorted by an operator at the sorting table 1860.

Figure 23:
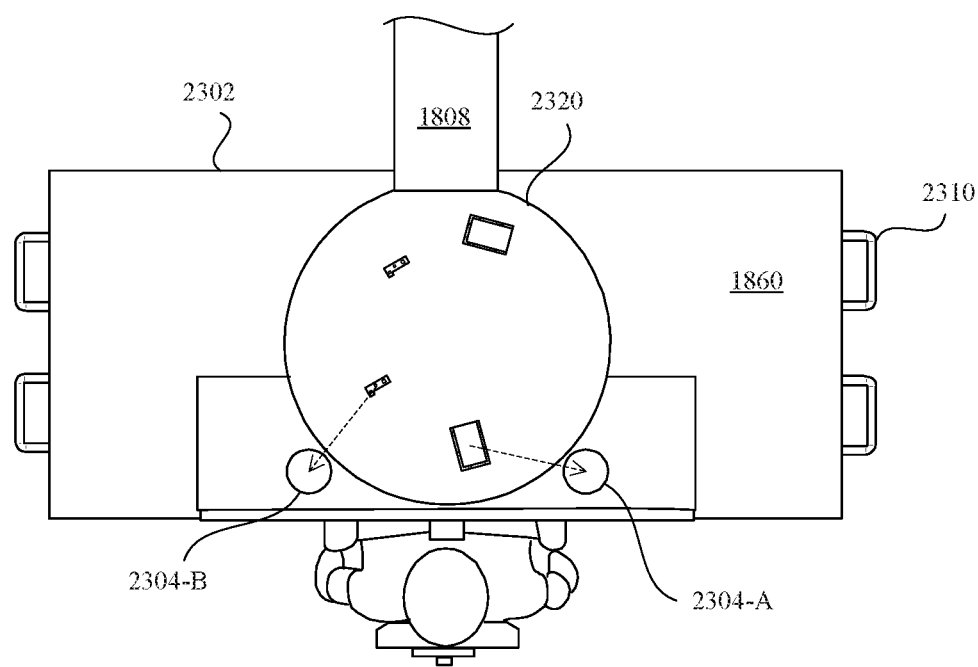
FIG. 23 illustrates an out-feed unit having a sorting table in the fourth module, in accordance with some embodiments.

FIG. 23 illustrates an out-feed unit 108 having the sorting table 1860 in the fourth module 140, in accordance with some embodiments. As shown in FIG. 23, the sorting table 1860 includes a table top 2302 that includes orifices 2304-A and 2304-B. The orifices 2304-A, B lead to chutes into one or more receptacles 2310 located beneath the table top 2302. In some embodiments, the receptacles 2310 are on wheels and include a handle for rolling bins of sorted components to a location to be recycled. The sorting table 1860 can also include a rotating table 2320 located beneath an exit of the conveyor 1808.

In some embodiments, the rotating table 2320 can include a vibratory element that helps separate the components from smaller particulate matter that may result from one of the disassembly tasks performed by the fourth module 140. This small particulate matter can be automatically carried to a separate receptacle located under the table top 2302.

Figure 24:
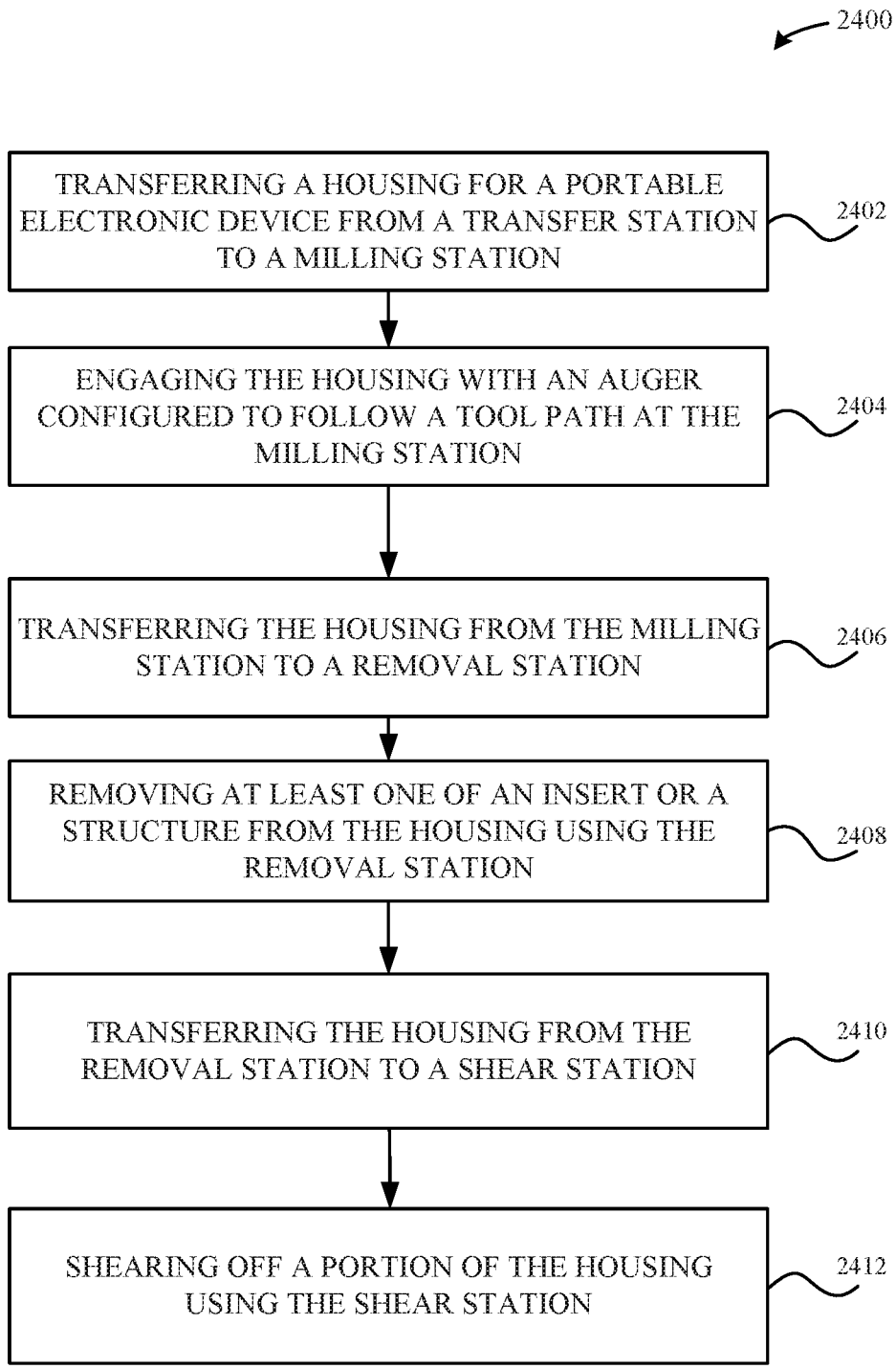
FIG. 24 illustrates a flow diagram of a method for separating operational components from a housing of the portable electronic device by utilizing the fourth module, in accordance with some embodiments.

FIG. 24 illustrates a flow diagram of a method 2400 for separating operational components from a housing 252-1 of the portable electronic device 250-1 utilizing the fourth module 140, in accordance with some embodiments. The method 2400 is carried out by the modular system 100. In some embodiments, the method 2400 can be implemented as logic configured to control the operation of each of the different modules of the modular system 100. The logic can include instructions, executed by the controller 1910, for carrying out one or more disassembly tasks utilizing the fourth module 140.

At step 2402, the fourth module 140 transfers the housing 252-1 of a portable electronic device 250-1 to a milling station. In some embodiments, the multi-axis robot 1820 transfers the housing 252-1 from the third transfer station 104-3 to a first disassembly station 1830.

At step 2404, the housing 252-1 is engaged with the auger 2040 that follows the tool path 2042 based on the physical attributes of the portable electronic device 250-1. The tool path can be designed to move the auger through any operational components still carried in the cavity of the housing 252-1, thereby dislodging the operational components from the housing 252-1.

At step 2406, the housing 252-1 is transferred from the milling station to a removal station. In some embodiments, the multi-axis robot 1820 transfers the housing 252-1 from the first disassembly station 1830 to the second disassembly station 1840. The second disassembly station 1840 includes a mechanism positioned at the end of a ram connected to an actuator 2130 for securing the housing 252-1. In some embodiments, the mechanism is a suction device. In other embodiments, the mechanism is a clamping device.

At step 2408, to the removal station utilizes a tool to remove an insert 2106 and/or a structure 2108 press fit into the housing 252-1. In some embodiments, the housing 252-1 is secured to the end of a ram connected to an actuator 2130, and the housing 252-1 is pressed into a tool 2110 that is moved relative to the edges of the housing 252-1 to align the tool 2110 with the insert 2106 or the structure 2108. The insert 2106 and/or structure 2108 fall onto the conveyor 1808 below the second disassembly station 1840.

At step 2410, the housing 252-1 is transferred from the removal station to a shear station. In some embodiments, the multi-axis robot 1820 transfers the housing 252-1 from the second disassembly station 1840 to the third disassembly station 1850. The third disassembly station 1850 can include a clamp mechanism or other receiving means to feed the housing 252-1 between a base portion of the die 2210 and a top portion of the die 2220 in the third disassembly station 1850. The third disassembly station 1850 includes a ram 2206 for shearing a portion of the housing 252-1.

At step 2412, a portion of the housing 252-1 is sheared off. The sheared portion of the housing 252-1 can include one or more antennas carried thereon. In some embodiments, a top portion of a die 2220 is actuated to compress the housing 252-1 between the top portion of the die 2220 and a bottom portion of the die 2210. Corresponding edges in the die shear the housing 252-1 to separate the housing 252-1 into at least two separate parts. A first portion of the housing 252-1 includes one or more antennas carried thereon and a second portion of the housing 252-1 only includes a base material of the housing 252-1. The first portion of the housing 252-1 can be placed into a receptacle 2208 below the third disassembly station 1850, and the second portion of the housing 252-1 can be placed onto the conveyor 1808 by the multi-axis robot 1820.

Figure 25:
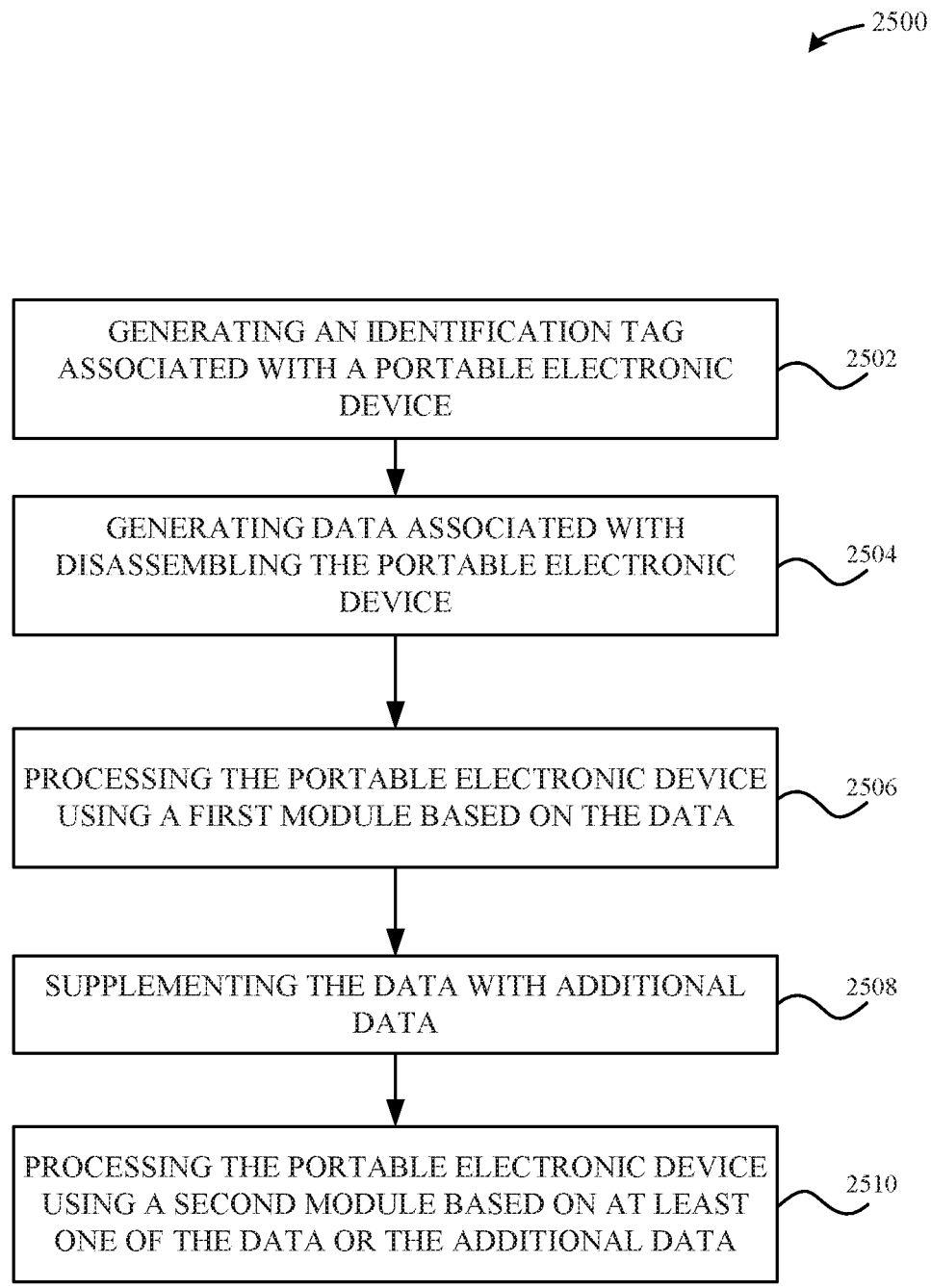
FIG. 25 illustrates a flow diagram of a method for generating an identifier tag for the portable electronic device, in accordance with some embodiments.

FIG. 25 illustrates a flow diagram of a method 2500 for generating an identifier tag for a portable electronic device 250-1, in accordance with some embodiments. The method 2500 is carried out by the modular system 100. In some embodiments, the method 2500 can be implemented by logic configured to control the operation of each of the different modules of the modular system 100. The logic can include instructions, executed by a controller of the control system, for tracking the portable electronic device 250-1 through the disassembly process of the modular system 100.

At step 2502, an identification tag is generated and associated with a portable electronic device 250-1. In some embodiments, a portable electronic device 250-1 is received by the in-feed unit 106 of the first module 110. The controller generates a data structure in a memory associated with the controller for tracking the portable electronic device 250-1 through the disassembly line of the modular system 100. The data structure can include a universally unique identifier (UUID) that is utilized to identify a particular portable electronic device 250-1. The data structure can also include a data payload, which includes various data associated with disassembling the portable electronic device 250-1. The data structure including the UUID and data payload can be referred to as the identification tag.

At step 2504, a controller of the modular system 100 generates data associated with disassembling the portable electronic device 250-1. In some embodiments, a vision system of the first module 110 captures an image of the portable electronic device 250-1 and transmits the image to the controller. The controller processes the image to characterize one or more physical attributes of the portable electronic device 250-1. In some embodiments, the controller processes the image according to an edge detection algorithm in order to locate edges of the housing 252-1 of the portable electronic device 250-1. The locations and/or lengths of the edges can be utilized to measure a length and/or a width of the housing 252-1 of the portable electronic device 250-1. These measurements can be included in the data payload of the identification tag.

At step 2506, a display assembly 254-1 is removed from the housing 252-1 using a first module 110 based on the data. In some embodiments, the controller inspects the data payload associated with a portable electronic device 250-1 prior to adjusting or configuring the first module 110. A measured width of the portable electronic device 250-1 can be read from the data payload, and a supporting member is adjusted based on the measured width.

At step 2508, the data is supplemented with additional data. For example, stations in the first module 110 or other modules are utilized to supplement the data. For example, an operator can update the data payload. As another example, the data payload can be supplemented by the first transfer station 104-1 based on data generated by the inspection unit. For example a flag in the data payload can be set or cleared to indicate whether the battery is present within the housing 252-1.

At step 2510, the portable electronic device 250-1 is processed using a second module 120 based on at least one of the data or the additional data. In some embodiments, the second module 120 includes an electronic component removal station 810.

Figure 26:
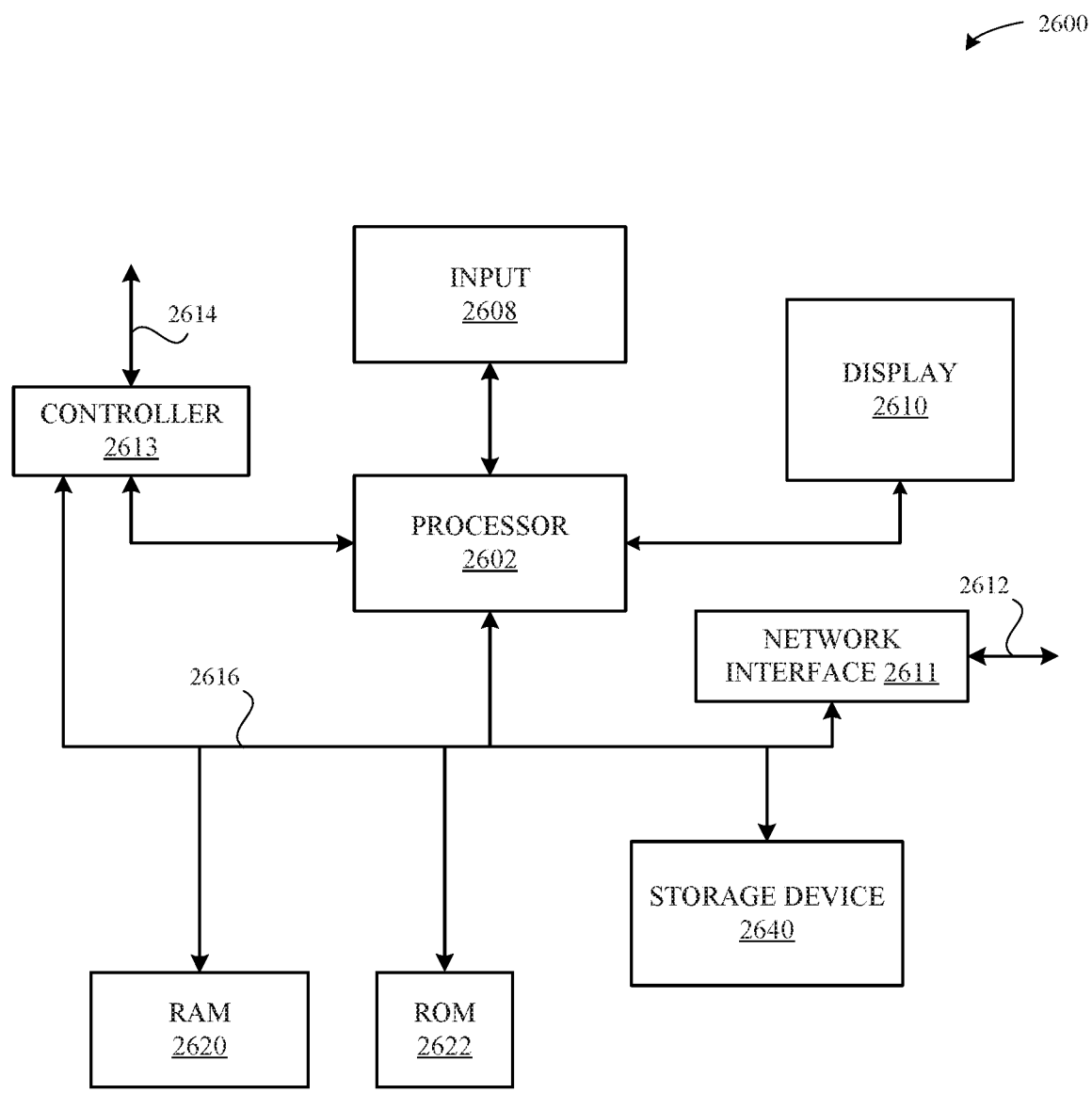
FIG. 26 illustrates a detailed view of an exemplary computing device that can be used to implement the various methods described herein, in accordance with some embodiments.

FIG. 26 illustrates a detailed view of an exemplary computing device 2600 that can be used to implement the various apparatus and/or methods described herein, in accordance with some embodiments. In particular, the detailed view illustrates various components that can be included in the modular system 100, control system, portable electronic device 250-1 and/or otherwise shown in the various Figures described herein. For example, the controller 910, the controller 1610, the controller 1910, or any other device including any network device, computing device, and/or server computing device described herein, can include the components of computing device 2600.

As shown in FIG. 26, the computing device 2600 includes a processor 2602 that represents a microprocessor or controller for controlling the overall operation of computing device 2600. The computing device 2600 can also include a user input device 2608 that allows a user of the computing device 2600 to interact with the computing device 2600. For example, the user input device 2608 can take a variety of forms, such as a button, keypad, dial, touch screen, audio input interface, visual/image capture input interface, input in the form of sensor data, etc. Still further, the computing device 2600 can include a display 2610 (screen display) that can be controlled by the processor 2602 to present visual information to the user. A data bus 2616 can facilitate data transfer between at least a storage device 2640, the processor 2602, and a controller 2613. The controller 2613 can be used to interface with and control different equipment through an equipment control bus 2614. The computing device 2600 can also include a network/bus interface 2611 that couples to a data link 2612. In the case of a wireless connection, the network/bus interface 2611 can include a wireless transceiver.

In some embodiments, the processor 2602 can be embodied in a variety of forms. For example, the processor 2602 can be embodied as various processing hardware-based means such as a microprocessor, a coprocessor, a controller or various other computing or processing devices including integrated circuits such as, for example, an application specific integrated circuit (ASIC), a field programmable gate array (FPGA), some combination thereof, or the like. Although illustrated as a single processor, it will be appreciated that the processor 2602 can include two or more processors. The processors can be in operative communication with each other and can be collectively configured to perform one or more functionalities of the computing device 2600 as described herein. In some embodiments, the processor 2602 can be configured to execute instructions that can be stored in the RANI 2620 or that can be otherwise accessible to the processor 2602.

The computing device 2600 also include a storage device 2640, which can comprise a single disk or a plurality of disks (e.g., hard drives), and includes a storage management module that manages one or more partitions within the storage device 2640. In some embodiments, storage device 2640 can include flash memory, semiconductor (solid state) memory or the like. The computing device 2600 can also include a Random-Access Memory (RAM) 2620 and a Read-Only Memory (ROM) 2622. The ROM 2622 can store programs, utilities or processes to be executed in a non-volatile manner. The RAM 2620 can provide volatile data storage, and stores instructions related to the operation of the computing device 2600.

Figure 27:
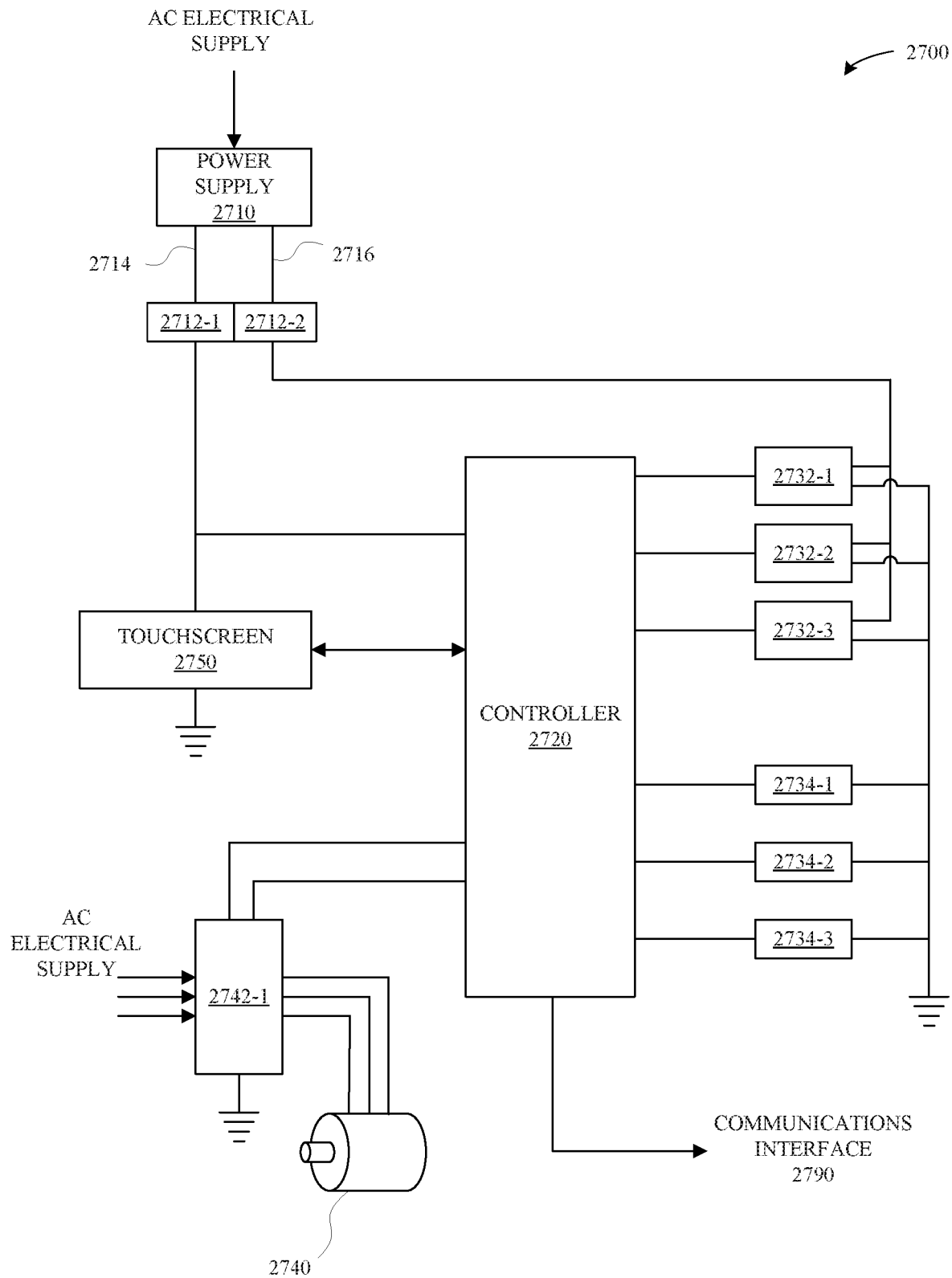
FIG. 27 illustrates a control system for the modular system, in accordance with some embodiments.

FIG. 27 illustrates a control system 2700 for the modular system 100 of FIGS. 1A-1B, in accordance with some embodiments. The control system 2700 includes a controller 2720 that implements logic for operating the disassembly line. One or more components of the control system 2700 can be included in an electrical cabinet that isolates the energized components to prevent injury to operators due to electrocution. Some components of the control system 2700 can be located external to the electrical cabinet, such as sensors and actuators included in the one or more modules of the modular system 100. Such components can be electrically connected to other components within the electrical system through wires or cables routed from the electrical cabinet to the external components.

In some embodiments, the control system 2700 receives an electrical power source from the transformer. The electrical power source can be, e.g., 120 VAC, single-phase electricity. The electrical power source can be routed through a switch external to the electrical cabinet that can be used to de-energize the modular system 100. The electrical power source is coupled to a power supply 2710. In some embodiments, the power supply 2710 is a DC (direct current) switched-mode power supply that provides one or more DC power sources. As shown in FIG. 27, the power supply 2710 can provide at least two different regulated DC power sources, such as a first power source 2714 at 5 VDC and a second power source 2716 at 24 VDC. It will be appreciated that different electrical components can require different supply voltages, such as 3.3 VDC, 5 VDC, 12 VDC, 24 VDC, 48 VDC, 120 VAC, 208 VAC (single-phase or three-phase), and so forth. In some embodiments, multiple power supplies 2710 can be included in the control system 2700. In addition, multiple electrical power sources (e.g., 480 VAC, three-phase, 208 VAC single-phase, and 120 VAC single-phase) can be provided from the transformer to the control system 2700. The different electrical power sources can be used to power different components, such as using 480 VAC, three-phase power to supply high horsepower AC electric motors, and 120 VAC, single-phase power to supply low horsepower AC electric motors.

Each of the regulated DC power sources can be routed to a circuit protection component 2712. The circuit protection components 2712 can include circuit breakers, fuses, thyristors, and the like. For example, the first power source 2714 can be routed to a 15 Ampere circuit breaker 2712-1 with overload protection, and the second power source 2716 can be routed to a 30 Ampere circuit breaker 2712-2 with overload protection. It will be appreciated that the specific type of circuit protection components utilized in the control system 2700 can depend on the details of the design of the modular system 100. In addition, the electrical power sources can also be routed to circuit protection components. For example, a 120 VAC, single phase power source can be passed through a 60 Ampere circuit breaker prior to being routed to the power supply 2710 and/or connected to one or more motors or motor controllers (e.g., VFDs, motor starters, etc.). The control system 2700 includes an AC motor 2740 (e.g., 3-phase) and a motor controller 2742-1 (e.g., a variable-frequency drive motor or a pair of magnetic contactors in parallel).

The first power source 2714 can be supplied to a controller 2720 and a touchscreen 2750. The controller 2720 implements logic for operating the disassembly line. In some embodiments, the controller 2720 can comprise a programmable logic controller (PLC), a micro-controller embedded on a printed circuit board (PCB), or a computing device including one or more processors, memory, communications devices, integrated circuits, input/output devices, and the like. The touchscreen 2750 enables an operator to provide inputs to the control system 2700 and receive output from the control system 2700. For example, the touchscreen 2750 can display a graphical user interface that enables an operator to start and/or stop the modular system 100, receive notifications from the modular system 100, monitor state of various components within the modular system 100, identify a particular device being disassembled and/or the current state of disassembly of the particular device, provide information needed by the control system 2700 to operate the modular system 100, and so forth. The controller 2720 can generate video signals for display by the touchscreen 2750, and the touchscreen 2750 can provide input signals from the operator to the controller 2720. In some embodiments, the control system 2700 can include multiple touchscreens located at different locations around the modular system 100.

The controller 2720 is coupled to various input and output signals through an input/output (I/O) interface. The I/O interface enables the controller 2720 to read digital or analog levels of the input signals and generate digital or analog output signals. For example, the controller 2720 can receive input signals from various sensors 2732. Each sensor 2732 is coupled to a power source and generates a sensor signal that is coupled to an input interface of the controller 2720. As shown in FIG. 27, a first sensor 2732-1, a second sensor 2732-2, and a third sensor 2732-3 provide three separate sensor signals to the controller 2720. The controller 2720 can also receive input signals from various interface components 2734. Examples of interface components can include buttons or switches. The button or switch can operate to couple a current sourcing input interface of the controller 2720 to ground. Alternatively, the button or switch can operate to couple a current sinking input interface of the controller 2720 to a supply voltage, such as the first power source 2714. As shown in FIG. 27, a first button 2734-1, a second button 2734-2, and a third button 2734-3 provide three separate input signals to the controller 2720.

The controller 2720 can also provide output signals to various electrical components. For example, as shown in FIG. 27, the controller 2720 can provide a forward and reverse signal to a motor control component. The motor control component can also be coupled to an AC power supply such as 208 VAC, three-phase power. The motor control component can provide power to the motor, switching the connections of the phases of the supply power with the motor power connections based on the state of the two output signals supplied from the controller 2720.

In some embodiments, the controller 2720 is configured to communicate with a remote system over a communications interface 2790. For example, the controller 2720 can be configured to communicate over Ethernet with a host computer located in a control room remote from the modular system 100. Alternatively, the controller 2720 can be configured to communicate with a server that provides information needed to operate the modular system 100. The server can also receive information about the state of the modular system 100, such as a number of portable electronic devices or a number of components that have been disassembled, a number of hours of operation, information about errors encountered during operation, and so forth. In some embodiments, the controller 2720 can communicate wirelessly such as by using a radio transceiver and an antenna to connect to one or more other devices or access points over a wireless network.

In some embodiments, the control system 2700 is distributed among a plurality of electrical cabinets. For example, in some embodiments, each module of the modular system 100 can include a separate and distinct electrical cabinet for that module. Each electrical cabinet can include a separate and distinct controller 2720 that is configured to operate that particular module. The different controllers 2720 can then communicate with each of the other controllers 2720 to share information between modules. In other embodiments, a single controller 2720 can be shared by multiple modules, although various components of the control system for the multiple modules can be divided between two or more electrical cabinets.

The controller 2720 implements logic for operating the disassembly line. In some embodiments, the controller 2720 can include instructions, executed by a processing unit, that cause the controller 2720 to perform various operations such as: reading input signals, generating output signals, and displaying a graphical user interface on the touchscreen(s) 2750. In some embodiments, the controller 2720 can also include an operating system, which enables two or more programs to execute substantially simultaneously. For example, a first program can be configured to display a GUI and receive input from the touchscreen(s) 2750, while a second program can be configured to operate the actuators of the modules and read inputs from sensors. The first program can operate asynchronously from the second program. In some embodiments, the second program operates within a real-time operating system environment that ensures timely execution of certain operations.

In some embodiments, the controller 2720 is a PLC that includes a number of different interface cards. The PLC can include a processor and a backplane, where a number of different interface cards can be plugged into the backplane to create a custom controller 2720. The interface cards can include input cards, output cards, and specialized cards for particular sensors (e.g., optical encoders), communications cards, and the like. The PLC can execute a program written in various languages including standardized languages like the open international standard IEC 61131 or proprietary languages like graphical ladder logic languages.

It will be appreciated that the modular system 100 includes a number of actuators and that the schematic of the control system 2700 is simplified for illustrative purposes. The actual implementation of control system 2700 for the modular system 100 includes tens or hundreds of inputs, including input signals at different levels or routed through relays to switch voltage levels, and tens or hundreds of outputs including control signals for a number of motors (including one or more of AC or DC motors), hydraulic valves, pneumatic valves, and the like. A conceptual block diagram of various portions of the control system is provided in FIGS. 4, 22, 31, and 36.

FIGS. 28A-28C illustrate a portable electronic device 250 that can be disassembled and separated according to the various techniques described herein, in accordance with some embodiments. The portable electronic device 250 is a smart phone, which can be otherwise referred to as a cell phone, mobile phone, or cellular device. However, the portable electronic device 250 is not limited to a smart phone and can take other forms, such as a tablet device, a personal digital assistant (PDA), a digital music player, a portable gaming system, and a digital camera, among other types of portable electronic devices. The portable electronic device 250 is shown in an isometric view in FIG. 28A, a front view in FIG. 28B, and a rear view in FIG. 28C.

As shown in FIG. 28A, the portable electronic device 250 includes a housing 252 and a display assembly 254 carried by the housing 252. The housing 252 is made of aluminum that is machined to form one or more external surfaces of the portable electronic device 250. In other embodiments, the housing 252 is made of other materials, such as plastic or other metal alloys, or formed as a composite of other materials such as a combination of metal and plastic.

In some embodiments, the display assembly 254 is carried on the front surface of the portable electronic device 250 and includes a number of layers, including a backlight, a liquid crystal display (LCD) layer for modulating pixel colors, a touch sensitive layer, and a glass substrate (e.g., a cover glass). The touch sensitive layer is a capacitive touch screen layer that senses a position of a user's finger on the portable electronic device 250. In some embodiments, the glass substrate can extend to the edges of the housing 252 for the portable electronic device 250. In alternate embodiments, the display assembly 254 can implement a different display technology, such as organic light emitting diode (OLED) display technology in lieu of the LCD layer and/or the backlight.

The housing can include a port 2806 that accepts a connector for coupling the portable electronic device 250 to one or more external devices, such as a power adapter or host computer. The display assembly 254 can be connected to the housing 252 via adhesive and/or one or more mechanical fasteners such as screws 2808. Although not shown explicitly, the portable electronic device 250 can include electrical components such as a battery, antenna and radio transceiver, printed circuit board, processor, and memory carried within a cavity formed between the housing 252 and display assembly 254.

As shown in FIG. 28B, the portable electronic device 250 further includes a home button 2810, a front-facing camera 2812, a speaker 2814, and a microphone 2816. The home button 2810 provides a user with a tactile input interface that generates an electrical signal connected to a processor for, e.g., unlocking the portable electronic device from a standby mode, minimizing an active application to return to a home screen, operating a camera, or the like. The home button 2810 can include a touch-sensitive, fingerprint sensor that can detect contact points in the ridges of a user's fingerprint in order to authenticate the identity of a user in order to unlock the portable electronic device 250. The front-facing camera 2812 includes a lens and image sensor configured to capture image data. The speaker 2814 and microphone 2816 can be utilized to reproduce and capture, respectively, audio data. In some embodiments, one or more of the home button 2810, the front-facing camera 2812, the speaker 2814, and the microphone 2816 are included in (e.g., secured to) the display assembly 254.

As shown in FIG. 28C, the portable electronic device 250 further includes a rear-facing camera 2818, a second microphone 2820, and a flash device 2822. The rear-facing camera 2818 can include one or more lenses and image sensors. In some embodiments, the rear-facing camera 2818 includes two image sensors, each image sensor associated with a different lens assembly having a different aperture size and/or focal length. The microphone 2820 captures audio data, and the flash device 2822 provides a lighting source for image capture or videography.

It will be appreciated that the portable electronic device 250 shown in FIGS. 28A-28C is only one exemplary embodiment of a type of device that can be disassembled by the modular system 100. Further, the components shown as being included within the portable electronic device 250 are shown for illustrative purposes only and should not be construed as limiting.

Figure 29:
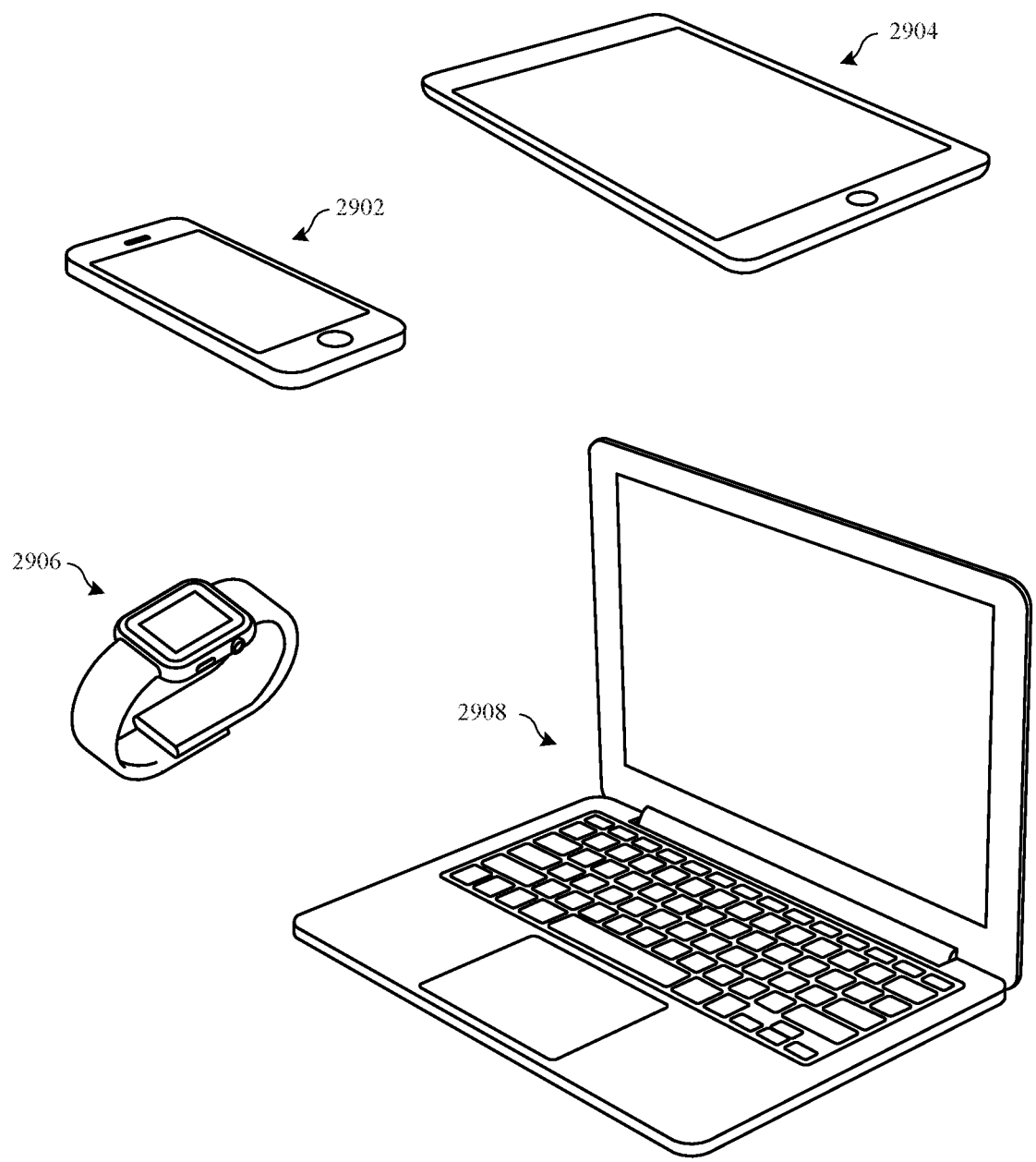
FIG. 29 illustrates various portable electronic devices that are capable of being processed by the modular system, in accordance with some embodiments.

FIG. 29 illustrates various portable electronic devices that are capable of being disassembled according to the various techniques described herein, in accordance with some embodiments. In particular, FIG. 29 illustrates that the portable electronic devices can include a portable phone 2902, tablet computer 2904, smart watch 2906 and portable computer 2908. Portable electronic devices 2902, 2904, 2906 and 2908 can include housings that are made of metal or have metal sections.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for processing an electronic component associated with a portable electronic device by a conveyor system subsequent to removing the electronic component from a housing of the portable electronic device, wherein the conveyor system includes a container that is capable of carrying the electronic component, the method comprising:
   depositing, at a receiving station of the conveyor system, the electronic component within a cavity of the container;
   while moving the container that carries the electronic component from the receiving station in a direction towards a removal station of the conveyor system:
   monitoring by a thermal energy sensor a temperature of the electronic component, and
   in response to determining that the temperature of the electronic component exceeds a temperature threshold range associated with a thermal event:
   cooling the electronic component by dissipating thermal energy associated with the thermal event within the container until the temperature of the electronic component monitored by the thermal energy sensor is less than the temperature threshold range.

2. The method of claim 1, wherein the electronic component is removed from the container when the temperature of the electronic component is less than the temperature threshold range.

3. The method of claim 1, wherein, subsequent to removing the electronic component from the container, the method further comprises:
   transferring the electronic component into a sorting container, wherein the sorting container is capable of carrying one or more electronic components.

4. The method of claim 3, wherein, the thermal energy sensor is a thermal imaging camera that measures the temperature of the electronic component prior to removing the electronic component from the container.

5. The method of claim 1, wherein the container includes non-electrically conductive material such as to prevent shorting of the electronic component while being carried by the container.

6. The method of claim 1, wherein, the conveyor system is lined with a flame-retardant material.

7. The method of claim 1, wherein, in response to determining that the temperature of the electronic component exceeds the temperature threshold range associated with the thermal event, the method further comprises:
   preventing the container that carries the electronic component from moving towards the removal station until the temperature of the electronic component is less than the temperature threshold range.

8. A system for processing an electronic component associated with a portable electronic device, the system comprising:

a conveyor system that comprises a movable train having a container, wherein the movable train is capable of transporting the container, the conveyor system further comprising:
  a sensor capable of (i) determining when the electronic component is carried within a cavity of the container at a receiving station of the conveyor system, and (ii) in response to determining that the electronic component is carried within the cavity, providing a detection signal;
  a controller in communication with the sensor, wherein, in response to receiving the detection signal from the sensor, the controller is capable of generating an activation signal that causes the movable train to move the container carrying the electronic component;
  a thermal energy sensor in communication with the controller and capable of monitoring the temperature of the electronic component within the container while the container is moved; and
  a removal station that is capable of removing the electronic component from the container of the system when the temperature of the electronic component monitored by the thermal energy sensor is less than a temperature threshold value.

9. The system of claim 8, wherein the thermal energy sensor is capable of providing a notification signal to the controller in response to determining that the temperature exceeds the temperature threshold value.

10. The system of claim 9, wherein, in response to the controller receiving the notification signal, the controller prevents the electronic component from being removed from the removal station until the temperature of the electronic component is less than the temperature threshold value.

11. The system of claim 8, wherein the system is maintained at a negative pressure such as to prevent any gas associated with the electronic component reaching a thermal event from escaping the system.

12. The system of claim 8, wherein the container is a thermal event containment container.

13. The system of claim 8, wherein the container includes non-electrically conductive material such as to prevent shorting of the electronic component.

14. The system of claim 8, wherein, in response to determining that the temperature of the electronic component exceeds the temperature threshold value, the controller is configured to prevent the container that carries the electronic component from moving towards the removal station until the temperature of the electronic component is less than the temperature threshold value.

15. The system of claim 8, wherein the controller is configured to prevent the electronic component from being removed at the removal station when the electronic component reaches a thermal event.

16. The system of claim 8, wherein, subsequent to removing the electronic component from the container, the system further comprises:
  a sorting container that is capable of receiving the electronic component from the removal station, and the sorting container is capable of carrying one or more electronic components.

17. A non-transitory computer readable medium storing instructions that, when executed by a controller of a module for removing an electronic component associated with a portable electronic device by a conveyor system subsequent to removing the electronic component from a housing of the portable electronic device, cause the module to carry out steps comprising:
  transferring, at a receiving station of the conveyor system, the electronic component within a cavity of a container;
  while moving the container that carries the electronic component from the receiving station towards a removal station of the conveyor system:
  monitoring, by a thermal energy sensor of the conveyor system, the temperature of the electronic component, and
  in response to determining that a temperature of the electronic component exceeds a temperature threshold range associated with a thermal event:
  dissipating thermal energy associated with the thermal event, and
  removing, at the removal station, the electronic component from the container when the temperature of the electronic component is less than the temperature threshold range.

18. The non-transitory computer readable medium of claim 17, wherein, in response to determining that the temperature of the electronic component exceeds the temperature threshold range associated with the thermal event, the steps further comprise:
  isolating the thermal event within the container.

* * * * *